US012796046B2

(12) United States Patent
Cheng et al.

(10) Patent No.: US 12,796,046 B2
(45) Date of Patent: Nov. 10, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Jung-Chien Cheng, Tainan (TW); Guan-Lin Chen, Hsinchu (TW); Shi Ning Ju, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 18/234,502

(22) Filed: Aug. 16, 2023

(65) Prior Publication Data

US 2024/0355904 A1 Oct. 24, 2024

Related U.S. Application Data

(60) Provisional application No. 63/461,004, filed on Apr. 21, 2023.

(51) Int. Cl.
*H10D 30/01* (2025.01)
*H10D 30/43* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .. H10D 30/014; H10D 30/43; H10D 30/6735; H10D 30/6757; H10D 62/121;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 20190064432 A 6/2019
KR 20220000349 A 1/2022

*Primary Examiner* — Meiya Li
(74) *Attorney, Agent, or Firm* — NZ Carr Law Office

(57) ABSTRACT

Embodiments of the present disclosure provide semiconductor device structures and methods of forming the same. The method includes depositing a spacer layer over an isolation region between adjacent fin structures, and the spacer layer is formed on sidewalls and tops of the fin structures. The method further includes forming a mask on the spacer layer between the fin structures, and the mask has a height substantially less than a height of the fin structures. The method further includes removing portions of the spacer layer and recessing the fin structures to form a spacer and to expose a portion of each fin structure, the spacer includes a first portion having a "U" shape disposed on the isolation region, and the portion of each fin structure has a top surface located at a level substantially below a top surface of the isolation region. The method further includes removing the mask.

20 Claims, 49 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 64/015* (2025.01); *H10D 84/0135* (2025.01); *H10D 84/0147* (2025.01); *H10D 84/0151* (2025.01); *H10D 84/038* (2025.01); *H10D 84/83* (2025.01)

(58) Field of Classification Search
CPC .. H10D 62/151; H10D 64/015; H10D 64/017; H10D 84/0135; H10D 84/0147; H10D 84/0151; H10D 84/038; H10D 84/83
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,812,363 | B1 | 11/2017 | Liao et al. | |
| 9,887,094 | B1 | 2/2018 | Qi et al. | |
| 2016/0351566 | A1 | 12/2016 | Niimi et al. | |
| 2017/0141212 | A1 | 5/2017 | Barraud et al. | |
| 2018/0158930 | A1 | 6/2018 | Liao et al. | |
| 2018/0254274 | A1 | 9/2018 | Ok et al. | |
| 2019/0006371 | A1 | 1/2019 | Ohtou et al. | |
| 2022/0051948 | A1 | 2/2022 | More | |
| 2022/0052044 | A1 | 2/2022 | More | |
| 2022/0384576 | A1 | 12/2022 | Yu et al. | |
| 2023/0006052 | A1 | 1/2023 | Yu et al. | |
| 2023/0065620 | A1 | 3/2023 | Liu et al. | |
| 2023/0420509 | A1* | 12/2023 | Chang .................. | H10D 62/151 |
| 2024/0154022 | A1* | 5/2024 | Ho ....................... | H10D 64/015 |
| 2024/0250161 | A1* | 7/2024 | Tsai ....................... | H10D 30/43 |

* cited by examiner

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/461,004 filed on Apr. 21, 2023, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
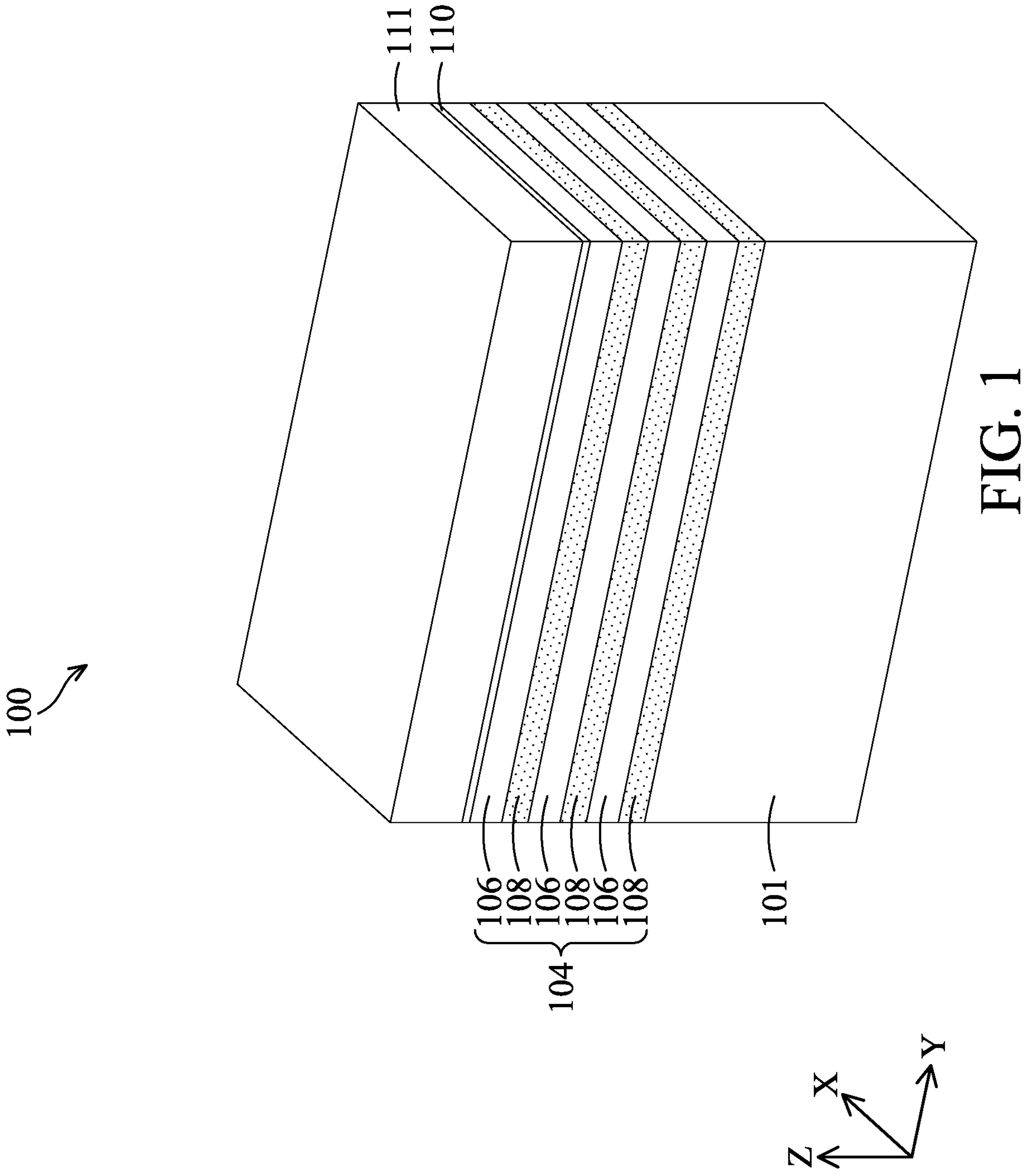
FIGS. 1-21 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures and methods of forming the same. The shallow trench isolation (STI) of the semiconductor device structures in the source/drain regions and/or in the channel regions are protected by various layers. As a result, source/drain epitaxial feature grown on side surfaces of the well regions is avoided, and overall parasitic capacitance is reduced.

While the embodiments of this disclosure are discussed with respect to nanostructure channel field-effect transistors (FETs), implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 to 21 show exemplary processes for manufacturing a semiconductor device structure 100 according to embodiments of the present disclosure. It is understood that additional operations can be provided before, during, and after processes shown by FIGS. 1 to 21, and some of the operations described below can be replaced or eliminated, for additional embodiments of the method. The order of the operations/processes is not limiting and may be interchangeable.

FIGS. 1 to 21 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100. As shown in FIG. 1, an oxide layer 110 is formed on the topmost first semiconductor layer 106, and a nitride layer 111 is formed on the oxide layer 110. The oxide layer 110 may be silicon oxide and may have different etch selectivity compared to the nitride layer 111. The nitride layer 111 may include any suitable nitride material, such as silicon nitride. In some embodiments, the oxide layer 110 and the nitride layer 111 may be a mask structure.

Figure 2:
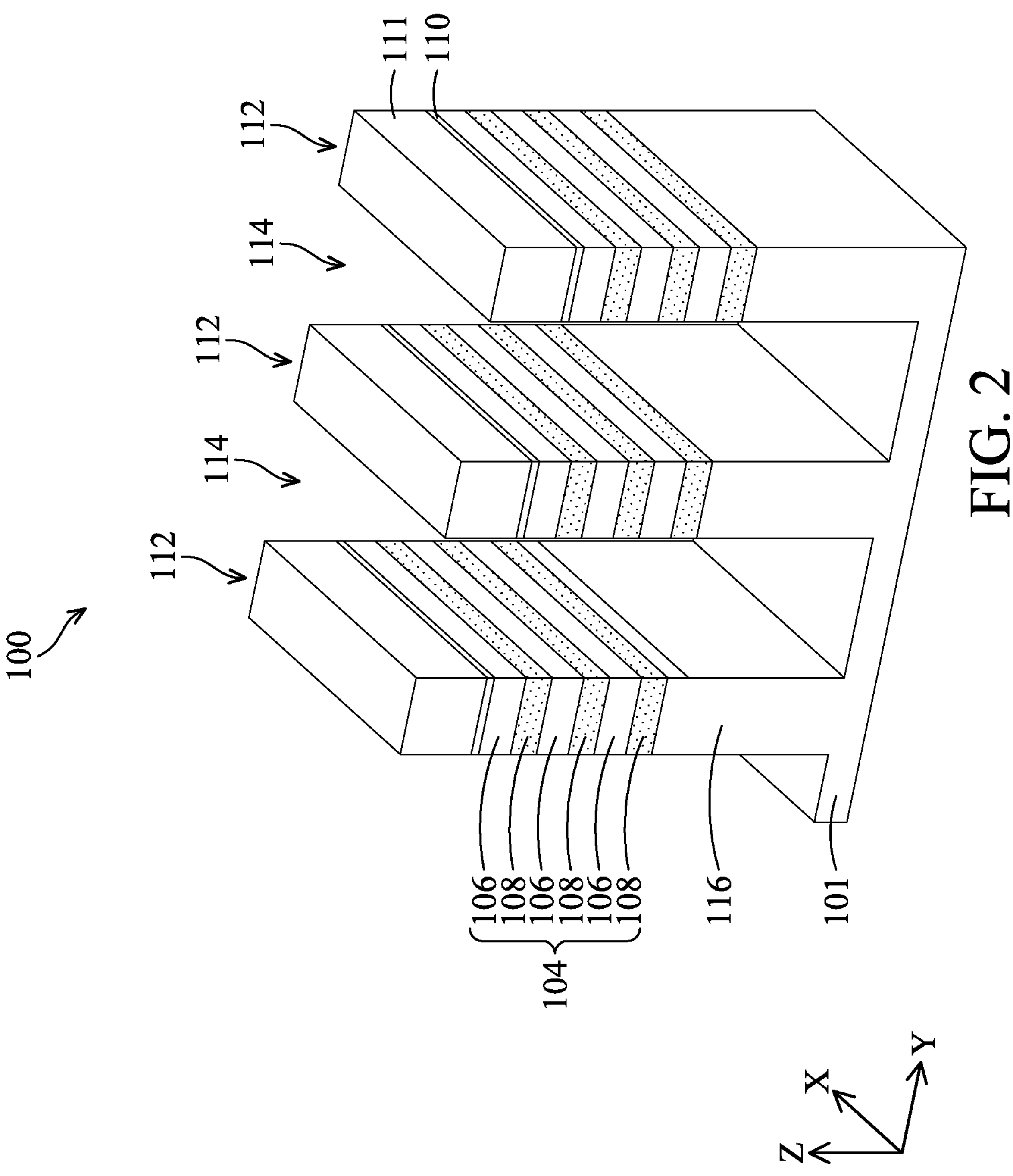

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer, such as the oxide layer 110 and the nitride layer 111, formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
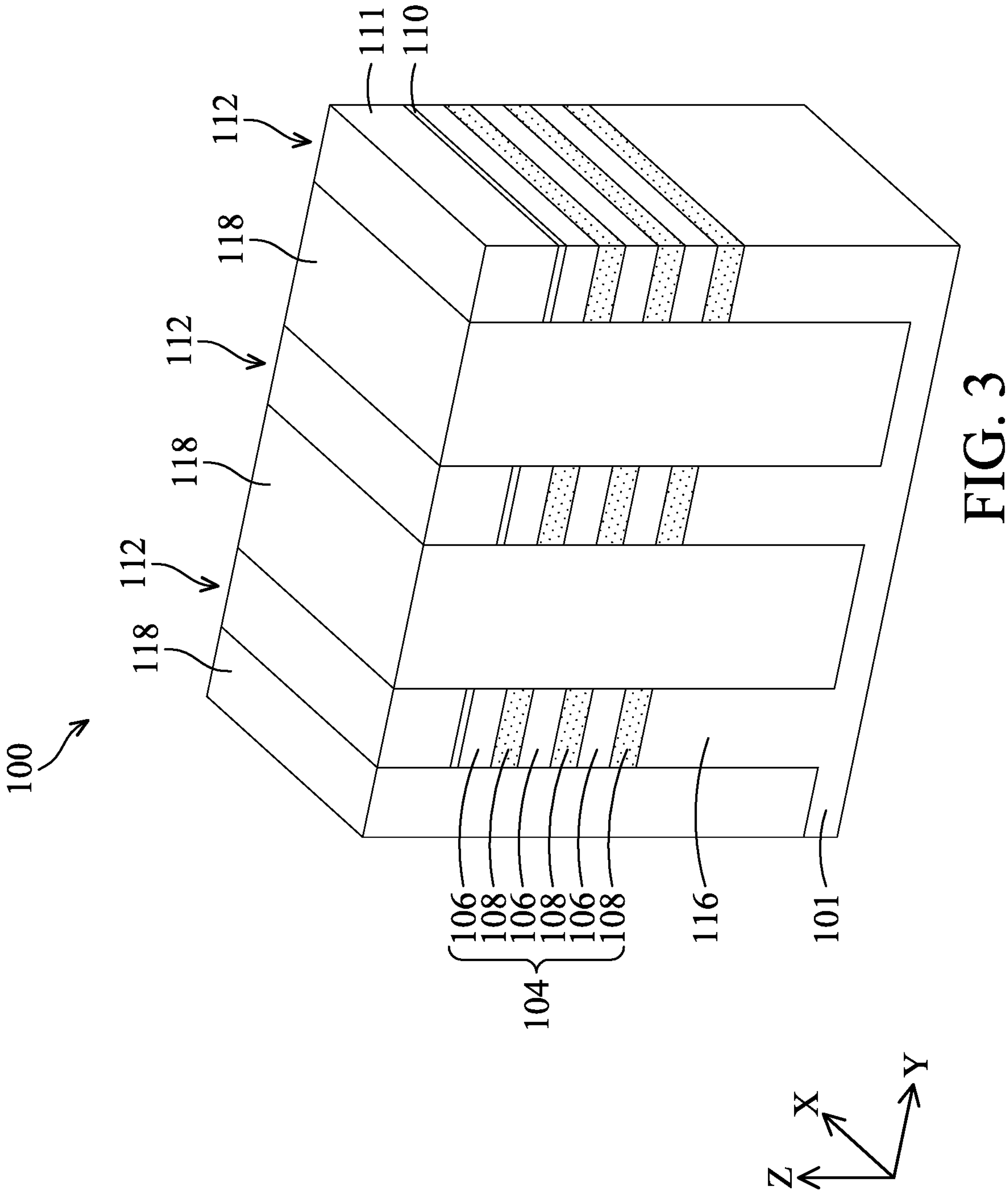

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
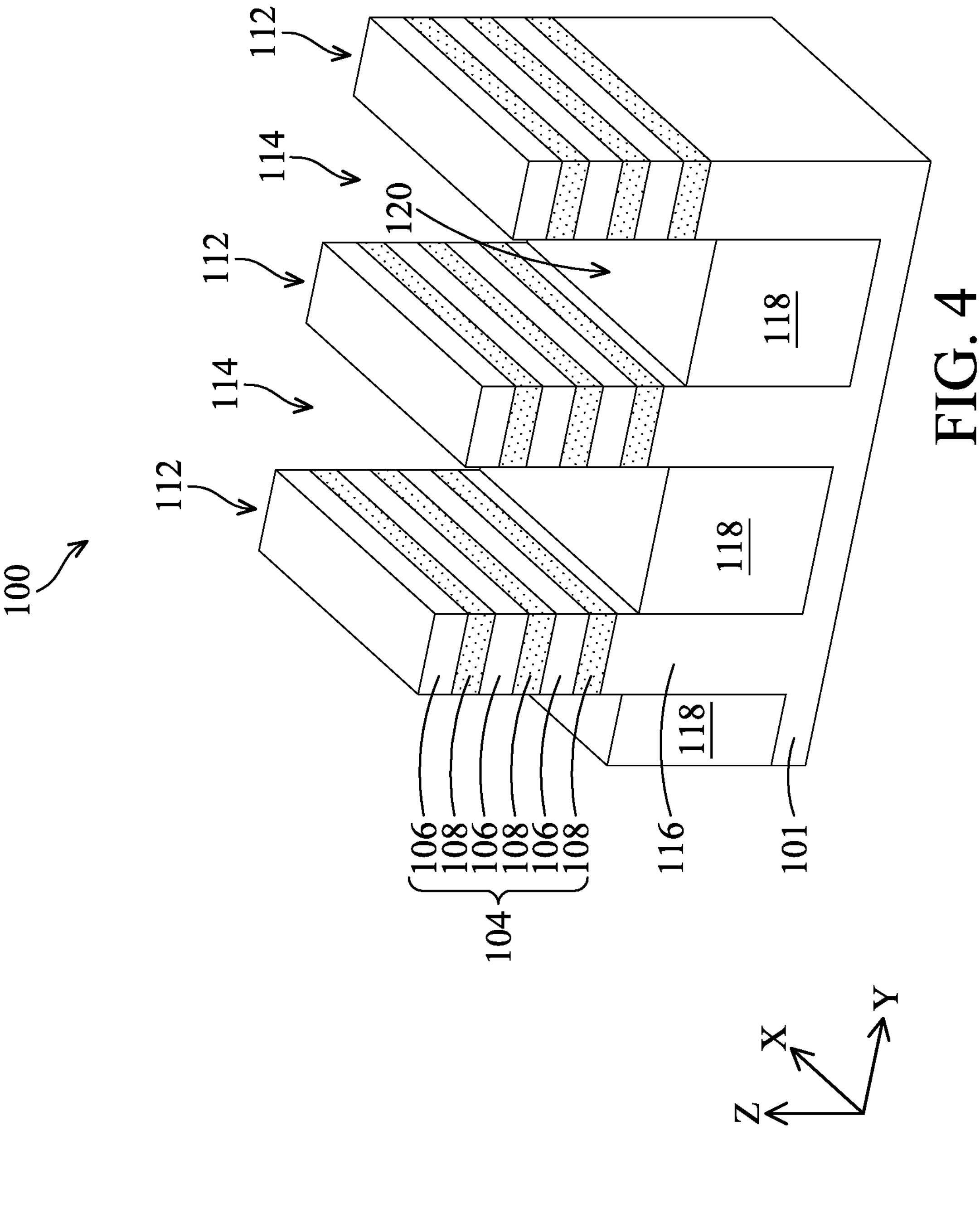

In FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101. In some embodiments, the isolation regions 120 are the STI. In some embodiments, the oxide layer 110 and the nitride layer 111 are also removed during the recessing of the insulating material 118.

Figure 5:
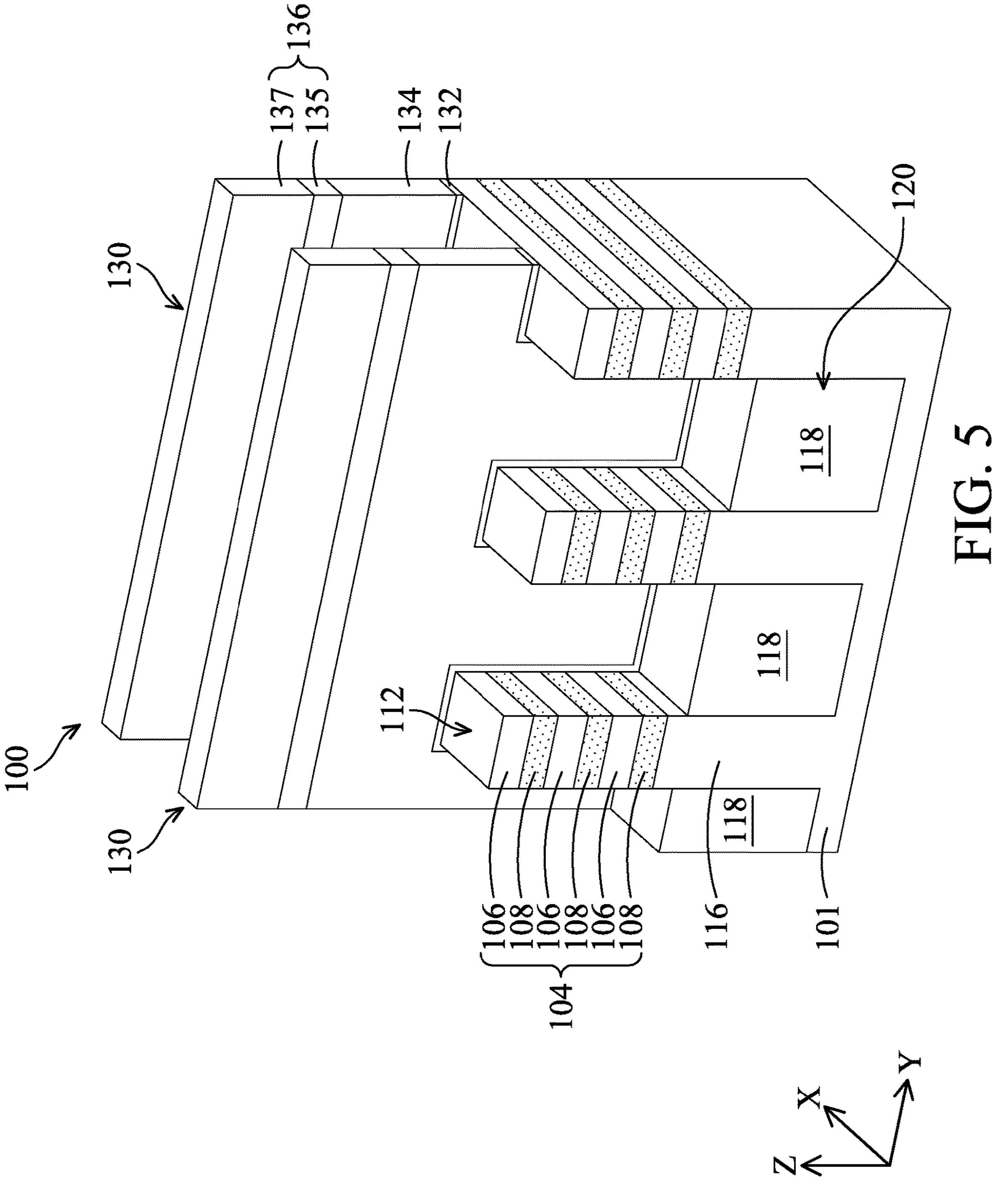

In FIG. 5, one or more sacrificial gate structures 130 are formed over the semiconductor device structure 100. The sacrificial gate structures 130 are formed over first portions of the fin structures 112 and first portions of the isolation regions 120, while second portions of the fin structures 112 and second portions of the isolation regions 120 are exposed. Each sacrificial gate structure 130 may include a sacrificial gate dielectric layer 132, a sacrificial gate electrode layer 134, and a mask layer 136. In some embodiments, the mask layer 136 is a multi-layer structure. For example, the mask layer 136 includes an oxide layer 135 and a nitride layer 137 formed on the oxide layer 135. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. The sacrificial gate dielectric layer 132 may include one or more layers of dielectric material, such as a silicon oxide-based material. The sacrificial gate electrode layer 134 may include silicon, such as polycrystalline silicon or amorphous silicon. The portions of the fin structures 112 that are covered by the sacrificial gate electrode layer 134 of the sacrificial gate structure 130 serve as channel regions for the semiconductor device structure 100.

Figure 6:
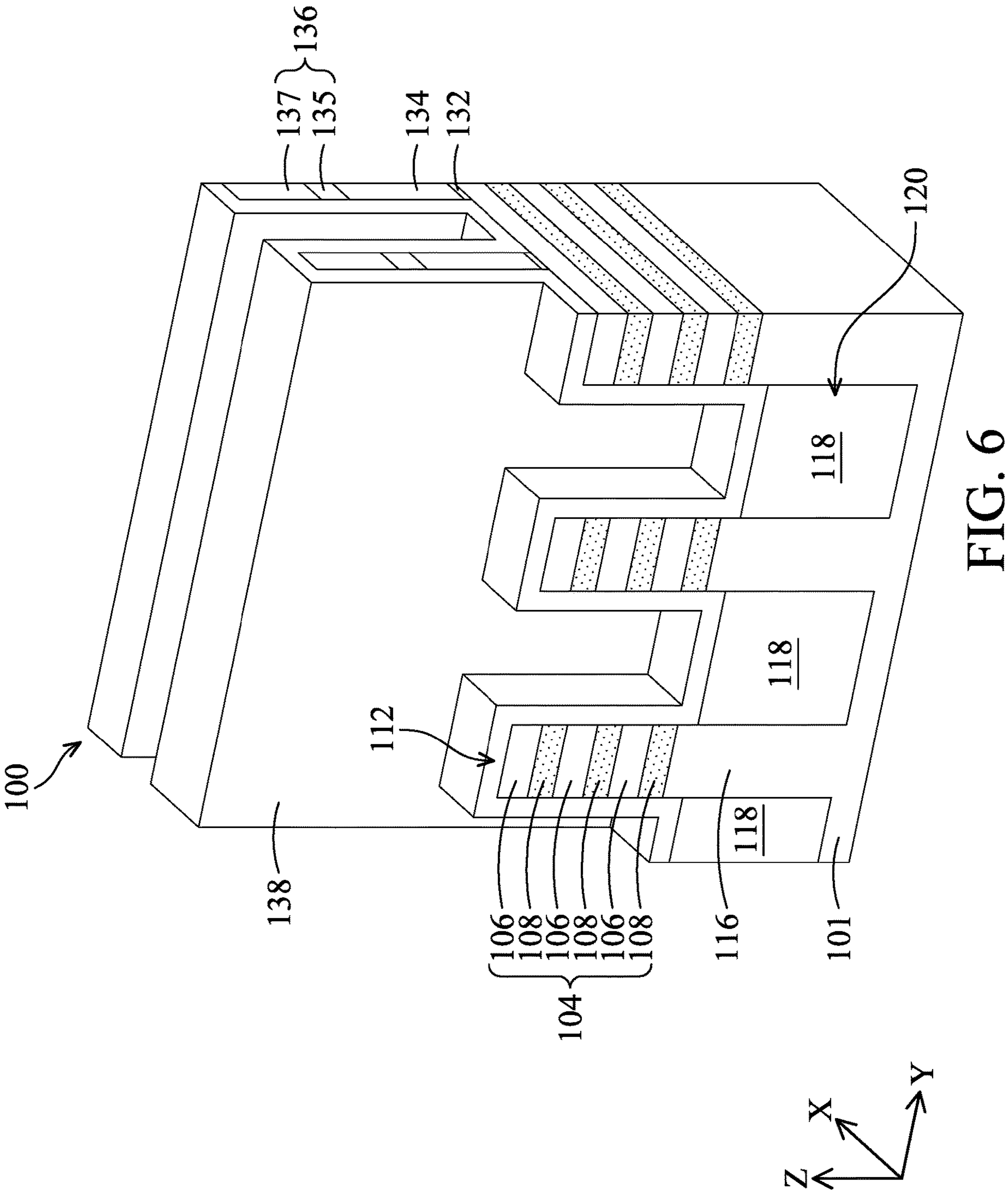

In FIG. 6, a spacer layer 138 is formed to cover the sacrificial gate structures 130, the second portions of the fin structures 112, and the second portions of the isolation regions 120. The spacer layer 138 may include one or more layers of dielectric material, such as silicon oxide, silicon nitride, silicon carbide, silicon oxynitride, SiCN, silicon oxycarbide, SiOCN, and/or combinations thereof. In some embodiments, the spacer layer 138 is formed by a conformal process, such as an atomic layer deposition (ALD) process. In some embodiments, the spacer layer 138 has a thickness ranging from about 2 nm to about 10 nm.

Figure 7:
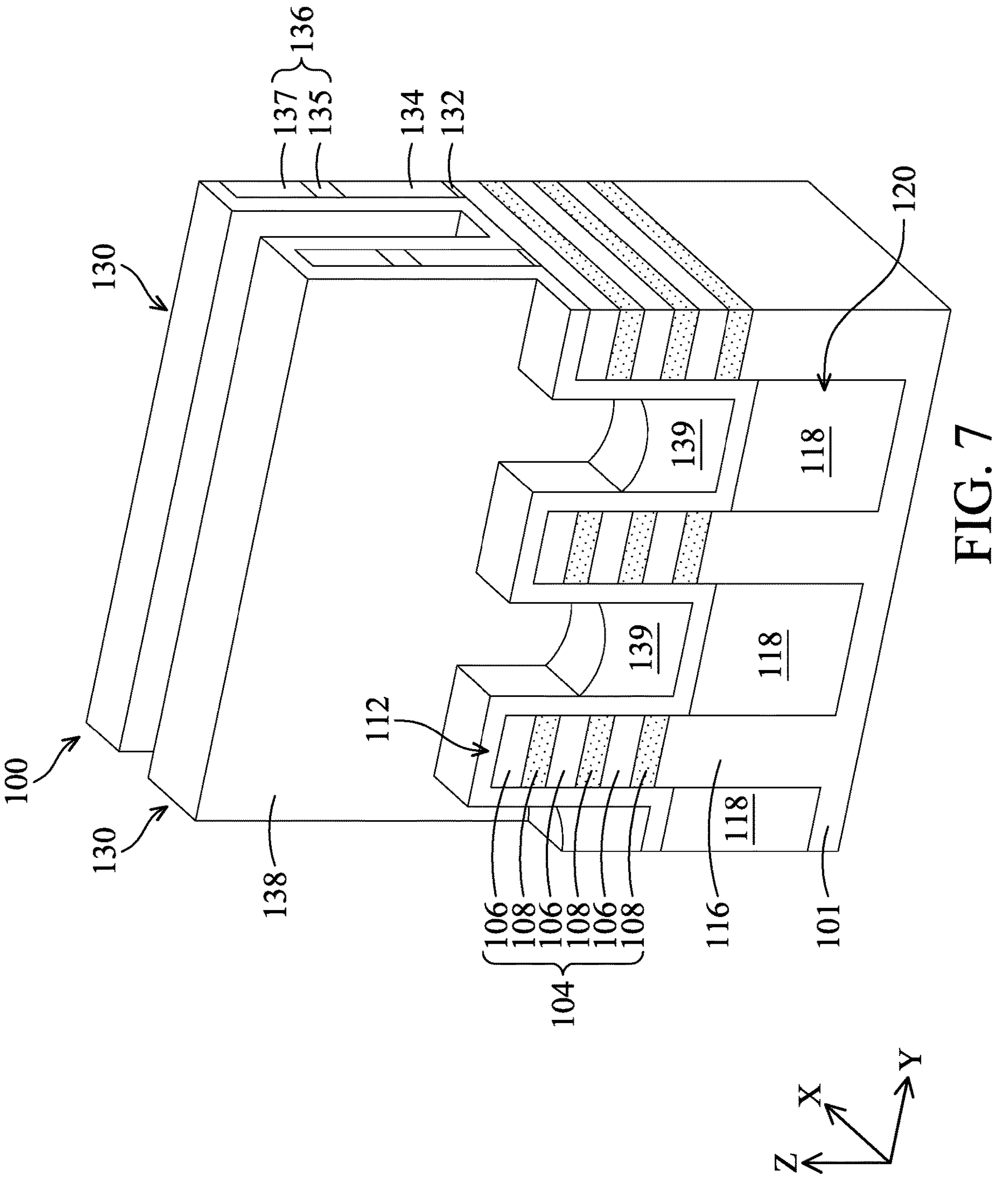
Figure 14:
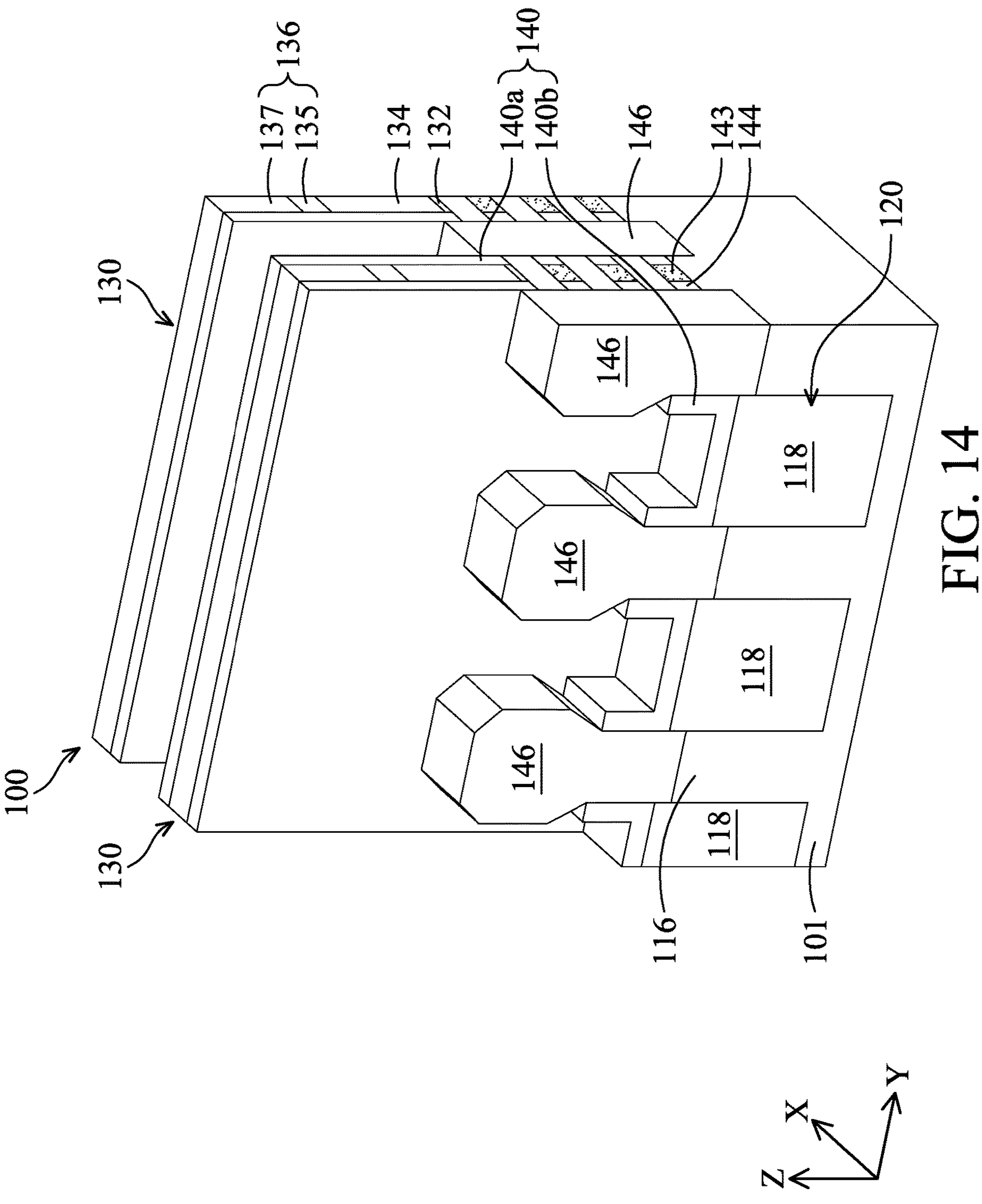

In FIG. 7, a mask 139 is formed between adjacent second portions of the fin structures 112. The mask 139 is formed on the portion of the spacer layer 138 formed on the second portions of the isolation regions 120. The mask 139 may include any suitable material having different etch selectivity compared to the material(s) of the spacer layer 138. In some embodiments, the mask 139 is a bottom anti-reflective coating (BARC) layer. The mask 139 may be formed by a two-step process. First, a mask layer is formed on the sacrificial gate structures 130 and the second portions of the fin structures 112. The mask layer may include the same material as the mask 139 and may be formed by any suitable process, such as spin coating. Then, an etch back process is performed to remove portions of the mask layer to form the mask 139. As shown in FIG. 7, the mask 139 has a height along the Z direction that is less than a height of the fin structure 112. In some embodiments, the height of the remaining portions of the mask 139 is from about 10 percent to about 50 percent of the height of the fin structure 112. The mask 139 protects the portions of the spacer layer 138 formed on the second portions of the isolation regions 120 during subsequent processes. Thus, if the height of the mask 139 is substantially less than about 10 percent of the height of the fin structure 112, the portions of the spacer layer 138 formed on second portions of the isolation regions 120 may be removed during subsequent processes. On the other hand, if the height of the mask 139 is substantially greater than about 50 percent of the height of the fin structure 112, the portions of the spacer layer 138 formed on sidewalls of the second portions of the fin structures 112 may be too high, which may lead to suppression of the formation of the source/drain regions 146 (FIG. 14). In some embodiments, as shown in FIG. 7, the top surface of the mask 139 is located between the top surface and the bottom surface of the second topmost first semiconductor layer 106.

Figure 8:
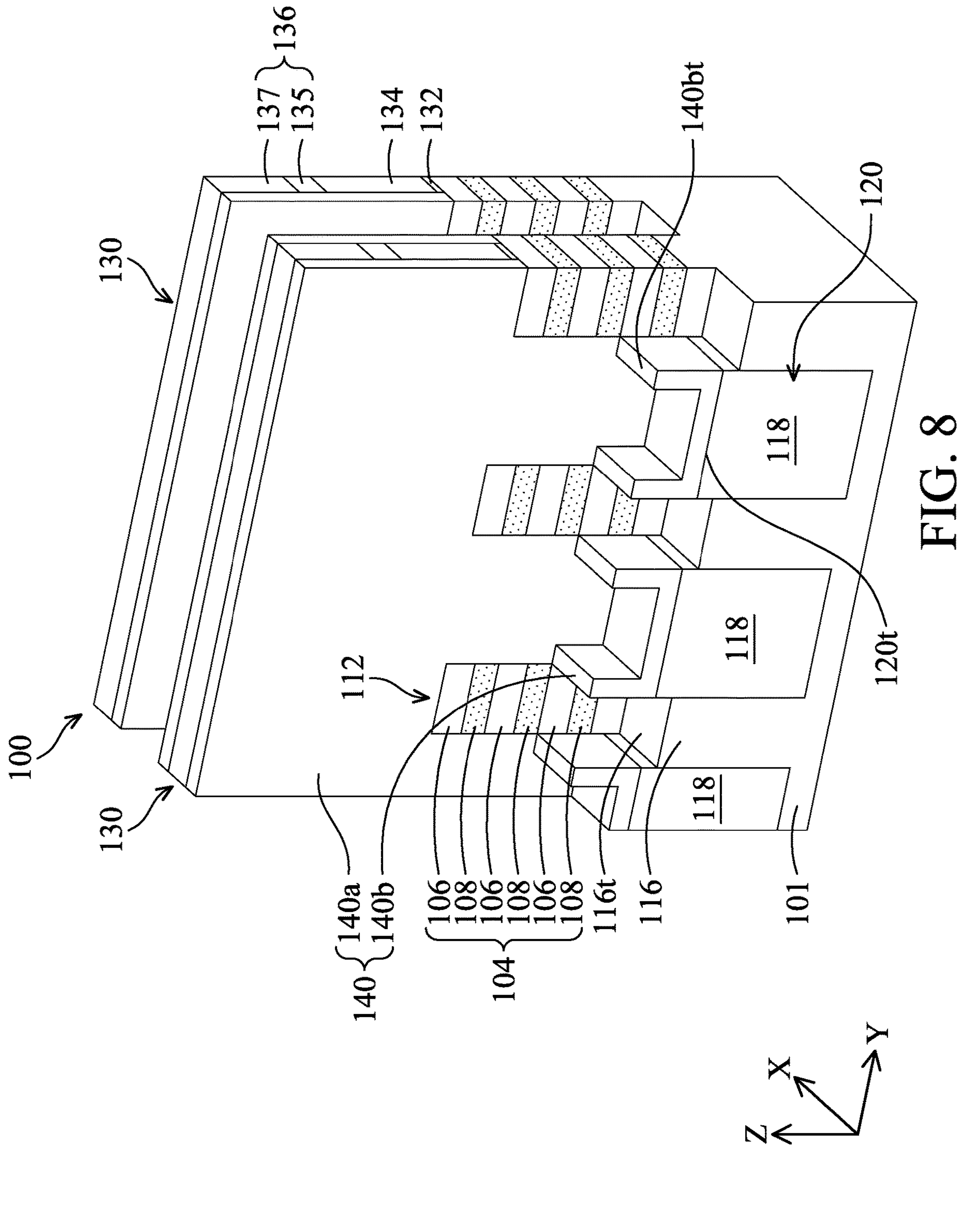

In FIG. 8, one or more etch processes are performed to recess the portions of the fin structures 112 not covered by the sacrificial gate structures 130 (and the portions of the spacer layer 138 formed on sidewalls of the sacrificial gate structures 130) and to remove portions of the spacer layer 138. In some embodiments, the portions of the spacer layer 138 formed on tops of the portions of the fin structures 112 not covered by the sacrificial gate structures 130 are removed to expose the portions of the fin structures 112 not covered by the sacrificial gate structures 130. Then, the exposed portions of the fin structures 112 not covered by the sacrificial gate structures 130 are recessed to expose the well portions 116, as shown in FIG. 8. The portions of the spacer layer 138 formed on sidewalls of the mask layer 136 may be also recessed. The one or more etch processes may include a dry etch, such as a RIE, neutral beam etching (NBE), or the like, and/or a wet etch, such as using tetramethylammonium hydroxide (TMAH), ammonium hydroxide ($NH_4OH$). The one or more etch processes form spacers 140 including a first portion 140*a* formed on sidewalls of the sacrificial gate electrode layer 134 and second portions 140*b* formed on the second portions of the isolation regions 120 not covered by the sacrificial gate structures 130. The mask 139 (FIG. 7) protects the second portions 140*b* of the spacers 140 during the one or more etch processes. After recessing the exposed portions of the fin structures 112 and removing the portions of the spacer layer 138 to form the spacers 140, the mask 139 is removed. In some embodiments, the mask 139 is removed by a separate removal process. In some embodiments, the mask 139 is removed during the recessing of the exposed portions of the fin structures 112.

Figure 22:
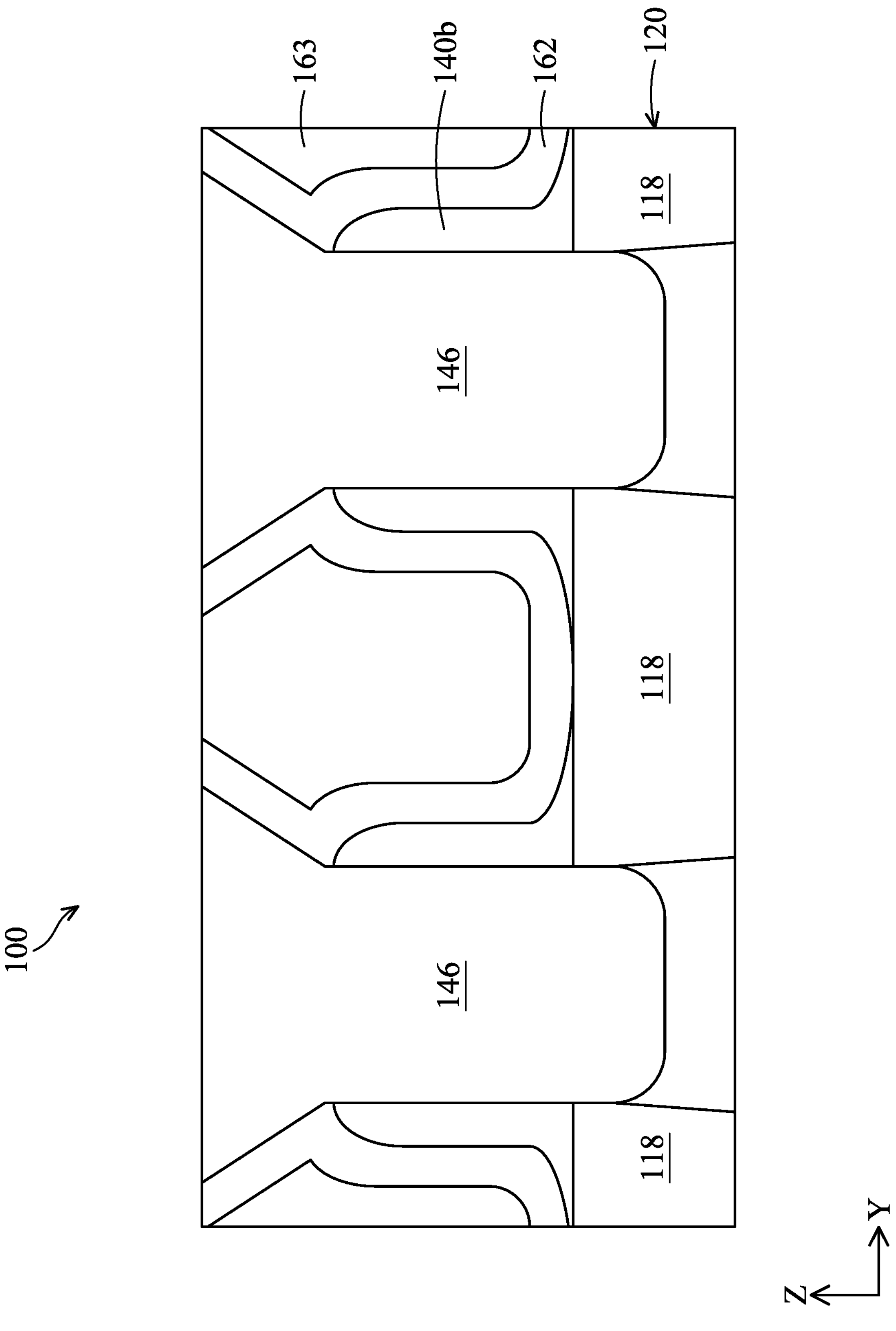
FIGS. 22 and 23 are cross-sectional side views of one of various stages of manufacturing the semiconductor device structure, in accordance with some embodiments.

In some embodiments, the second portion 140*b* of each spacer 140 has a "U" shape, as shown in FIG. 8. In some embodiments, the horizontal portion of the second portion 140*b* of each spacer 140 is removed during the recessing of the exposed portions of the fin structures 112, a portion of the second portion of the isolation region 120 is exposed, and a contact etch stop layer (CESL) 162 is formed on the exposed portion of the isolation region 120, as shown in FIG. 22. In some embodiments, the portion of the second portion of the isolation region 120 located below the horizontal portion of the second portion 140*b* is also removed during the recessing of the exposed portions of the fin structures 112. Referring back to FIG. 8, in some embodiments, top surfaces 116*t* of the well portions 116 are exposed after the recessing the portions of the fin structures 112. The top surfaces 116*t* may be located at a level below top surfaces 120*t* of the second portions of the isolation regions 120, as shown in FIG. 8. In some embodiments, the vertical distance (along the Z direction) between the level of the top surface 116*t* and the level of a top surface 140*bt* of the second portion 140*b* of the spacer 140 ranges from about 5 nm to about 25 nm.

Figure 9:
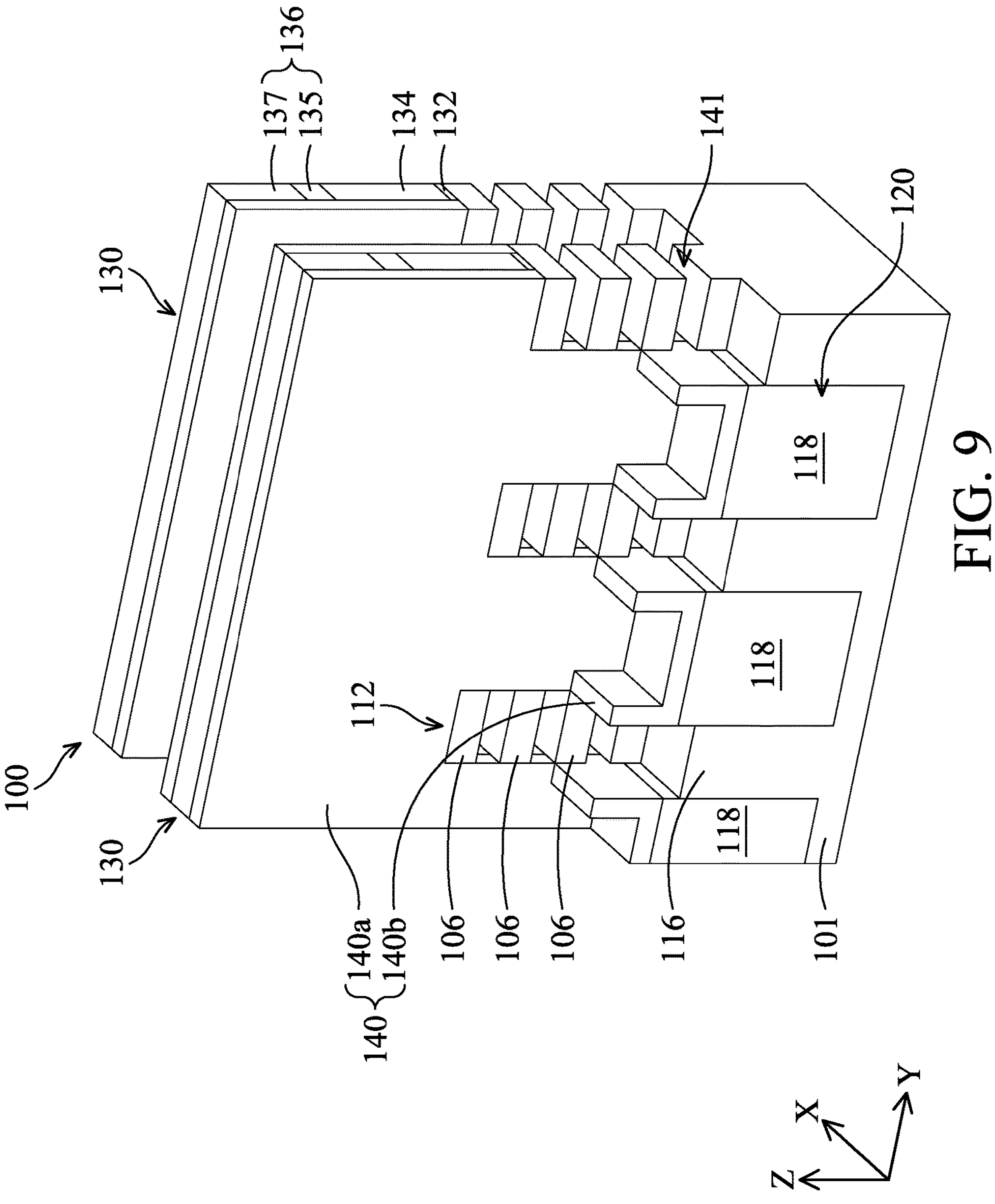

In FIG. 9, the second semiconductor layers 108 are removed. In some embodiments, the second semiconductor layers 108 include Ge, and the subsequently formed source/drain (S/D) regions include phosphorus doped silicon for n-type FET. The Ge in the second semiconductor layers 108 and the phosphorus in the S/D regions can inter-diffuse, which may induce high interfacial state density (Dit) on the first semiconductor layers 106. As a result, n-type device mobility may be degraded. Thus, in some embodiments, the second semiconductor layers 108 are removed prior to the formation of the S/D regions. In some embodiments, the second semiconductor layers 108 are completely removed, and openings 141 are formed between vertically adjacent first semiconductor layers 106, as shown in FIG. 9. The second semiconductor layers 108 may be removed by a selective etch process, such as a selective dry etch process, a selective wet etch process, or a combination thereof. The selective etch process does not substantially affect the spacers 140, the first semiconductor layers 106, and the sacrificial gate electrode layers 134.

Figure 10:
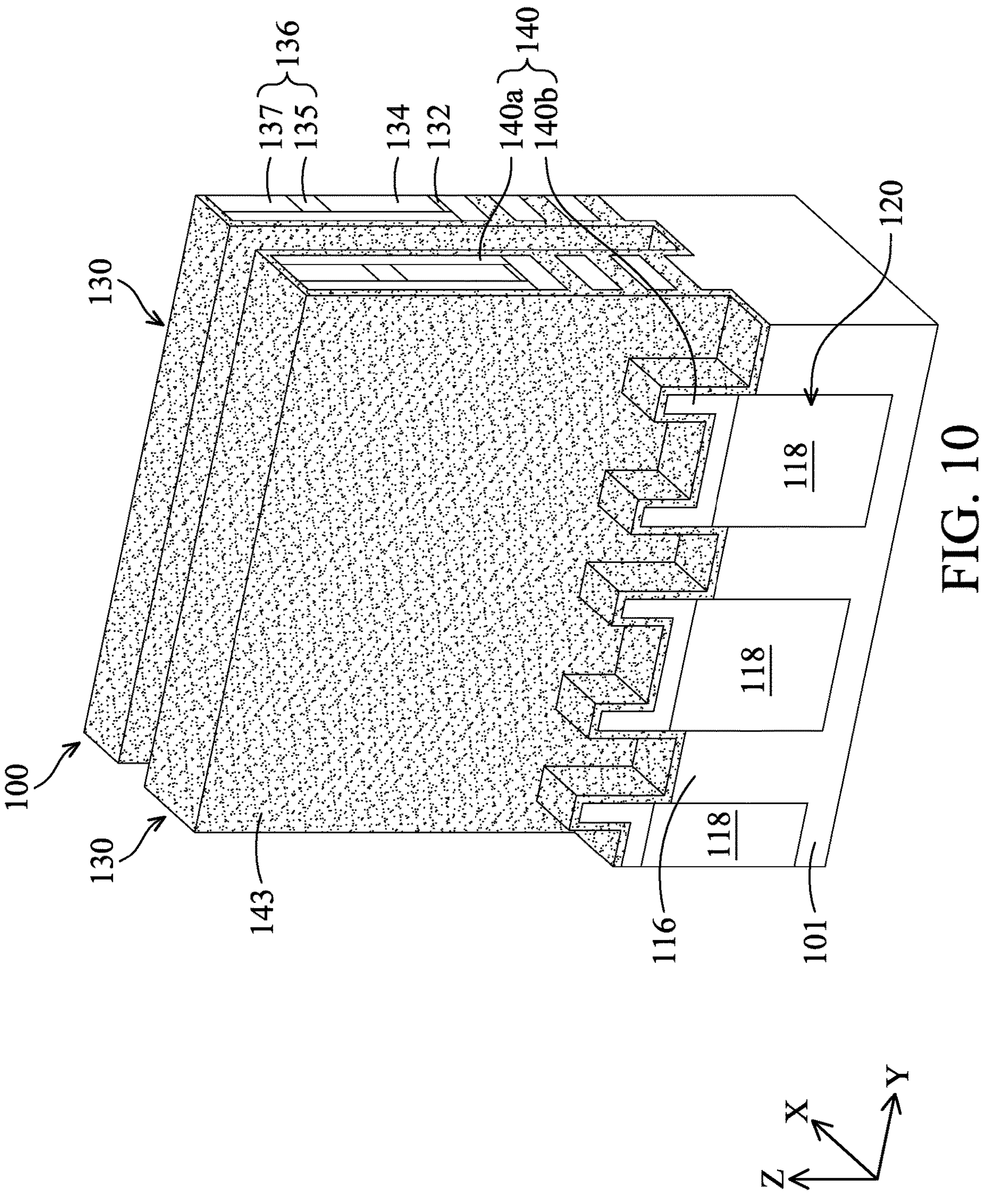

In FIG. 10, a dielectric material 143 is formed in the openings 141 and on the exposed surfaces of the semiconductor device structure 100. In some embodiments, the dielectric material 143 is an oxide formed by flowable chemical vapor deposition (FCVD) process. In some embodiments, the oxide is a carbon-containing silicon oxide. In some embodiments, the dielectric material 143 and the isolation regions 120 include the same material.

Figure 11:
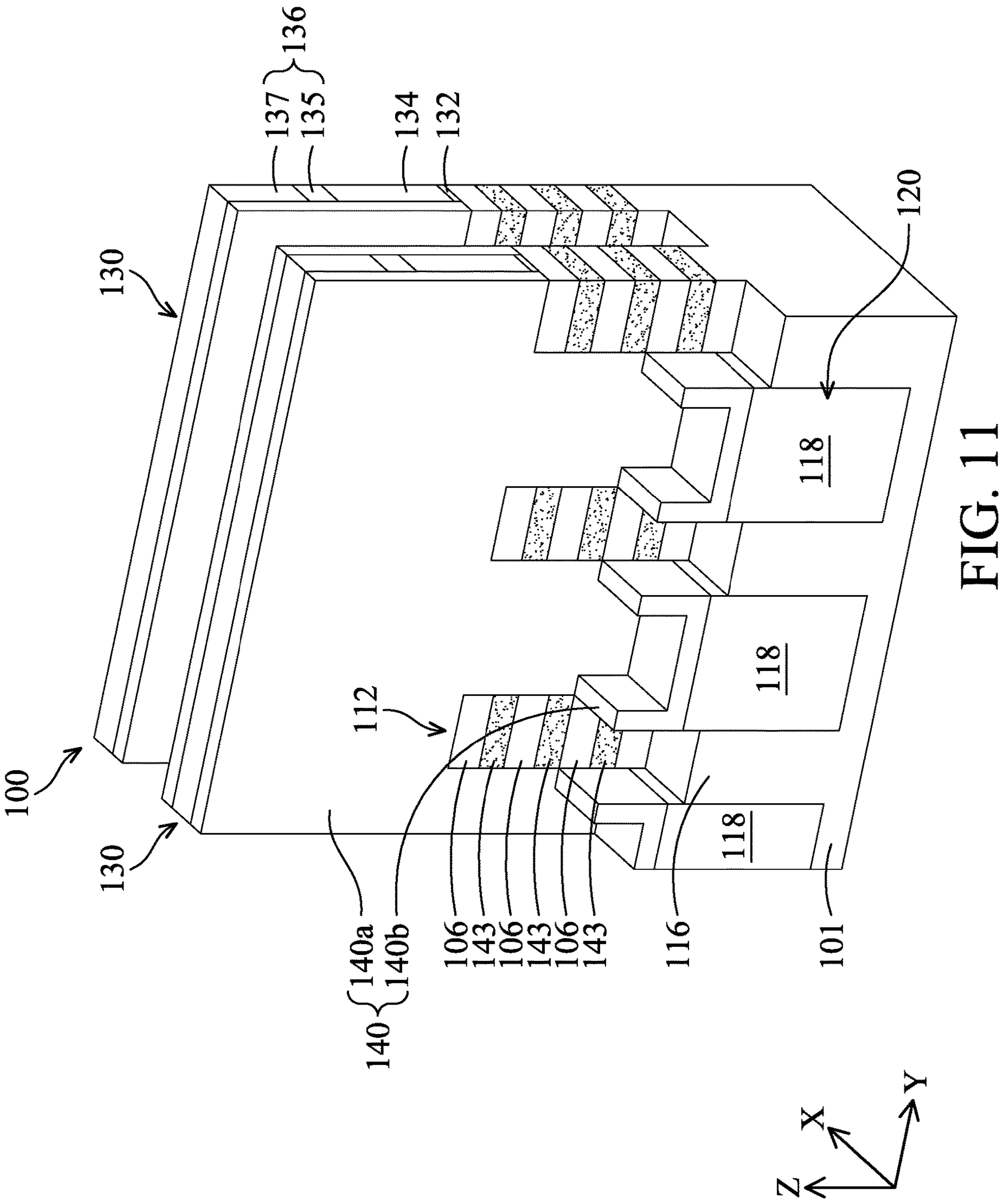

In FIG. 11, an etch back process is performed to remove portions of the dielectric material 143 other than the portions of the dielectric material 143 formed in the openings 141. In some embodiments, the etch back process is an anisotropic etching process. At this stage, edge portions of the dielectric material 143 and edge portions of the first semiconductor layers 106 have substantially flat surfaces which may be flush with corresponding first portions 140*a* of the spacers 140, as shown in FIG. 11. In some embodiments, the dielectric material 143 and the isolation region 120 include the same material. The second portions 140*b* of the spacer 140 protects the second portions of the isolation regions 120 not covered by the sacrificial gate structures 130 during the etch back process. Without the second portions 140*b* of the spacer 140, the second portions of the isolation regions 120 may be recessed, and side surfaces of the well portion 116 may be exposed. As a result, S/D regions 146 (FIG. 14) may be formed on the side surfaces of the well portion 116 and may merge with adjacent S/D regions 146, which may lead to current leakage and/or electrical short. The second portions 140*b* of the spacer 140 prevents the formation of S/D regions 146 (FIG. 14) from forming on the side surfaces of the well portion 116.

Figure 12:
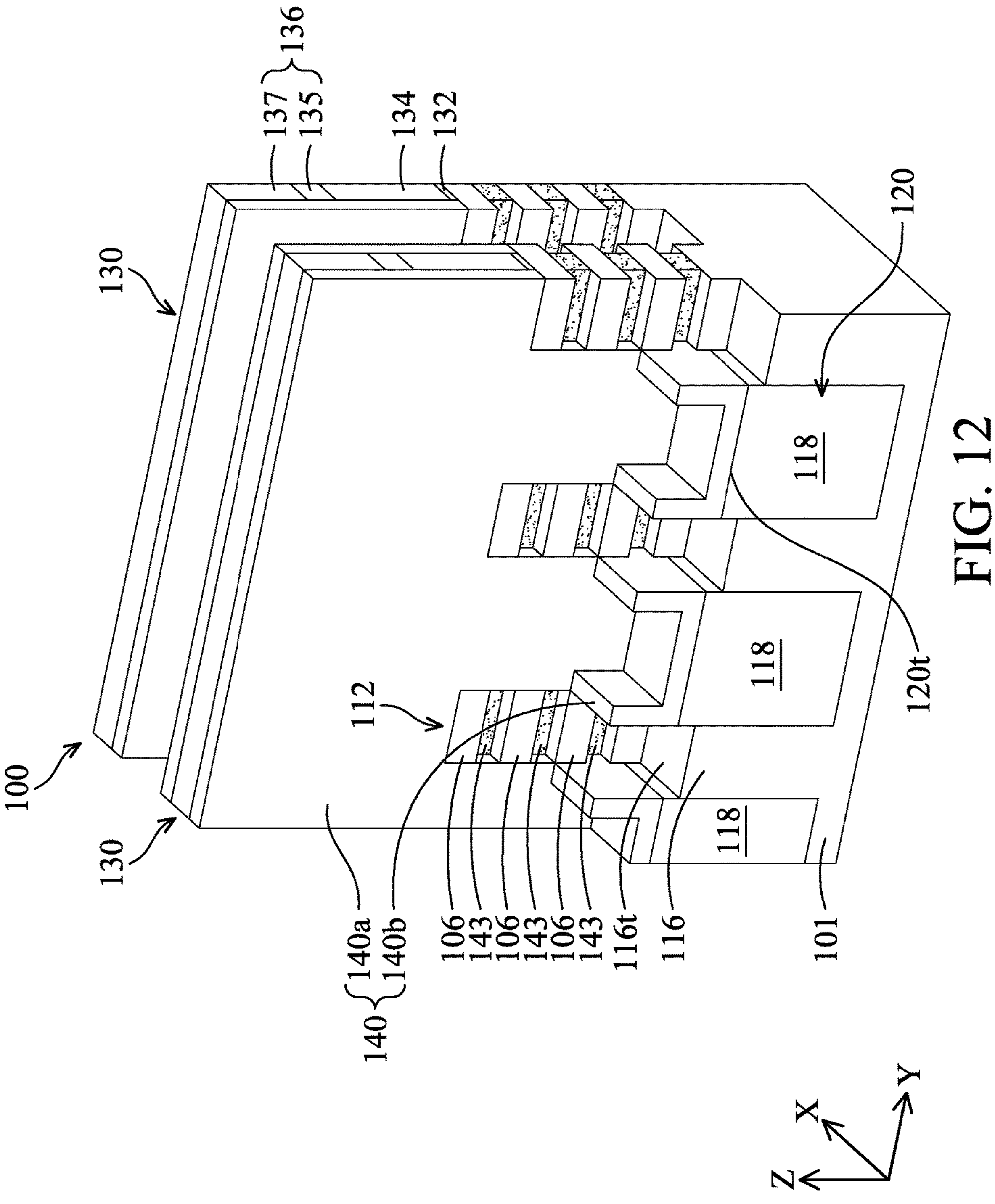

In FIG. 12, edge portions of the dielectric material 143 are removed horizontally along the X direction. In other words, the dielectric material 143 is recessed along the X direction. The removal of the edge portions of the dielectric material 143 forms cavities. In some embodiments, the edge portions of the dielectric material 143 are removed by a selective wet etch process. As described above, in some embodiments, the dielectric material 143 and the isolation regions 120 include the same material. The second portions 140*b* of the spacer 140 protects the second portions of the isolation regions 120 not covered by the sacrificial gate structures 130 during the removal of the edge portions of the dielectric material 143. In some embodiments, as shown in FIG. 12, the top surfaces 116*t* may be located at a level below top surfaces 120*t* of the second portions of the isolation regions 120. Thus, portions of the side surfaces of each second portion of the isolation region 120 may be exposed. The selective wet etch process that removes the edge portions of the dielectric material 143 may also recess the exposed portions of the second portion of the isolation region 120, and a cavity (not shown) may be formed in the side surfaces of the second portion of the isolation region 120 under each edge portion of the second portion 140*b* of each spacer 140.

Figure 13:
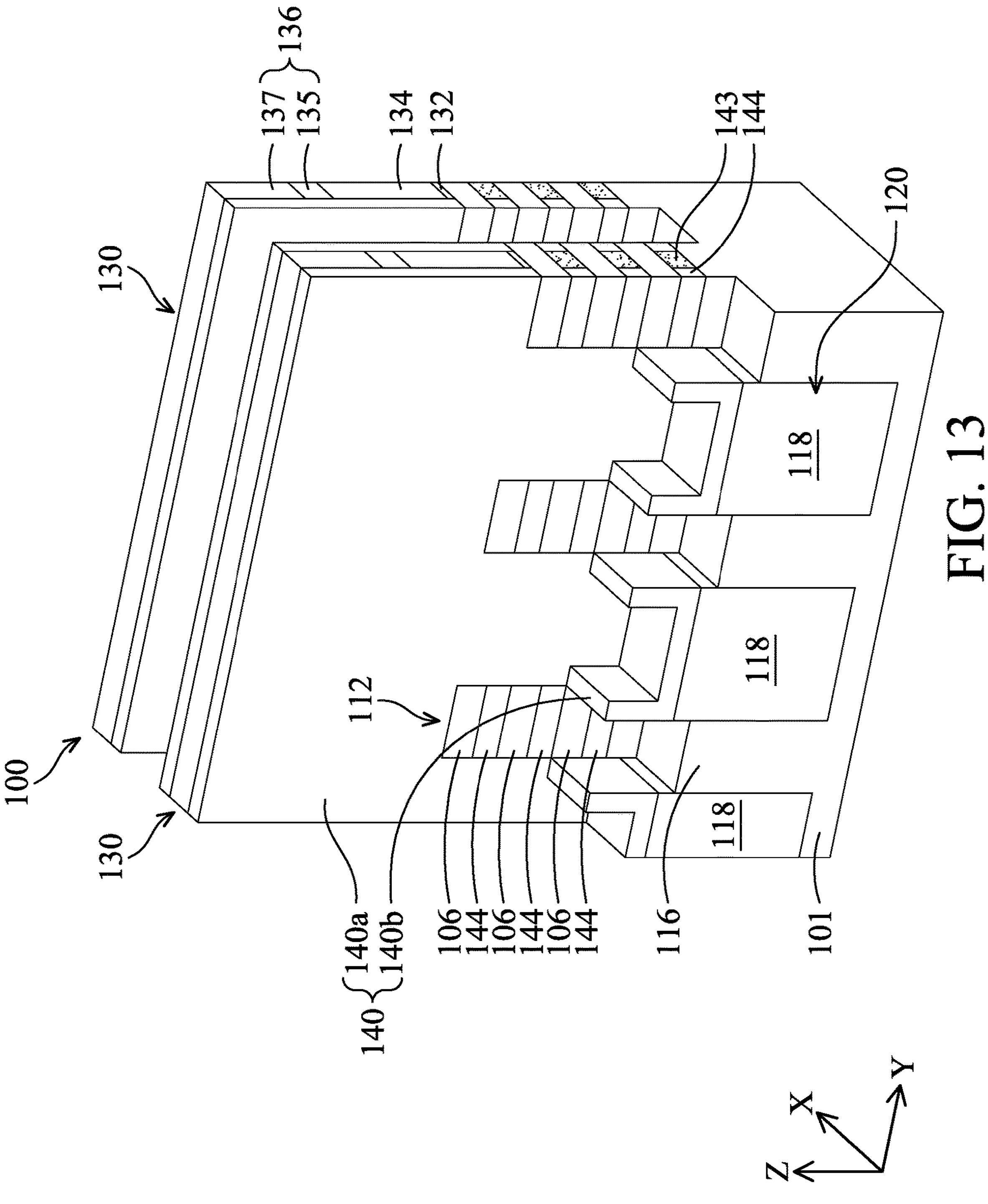
Figure 23:
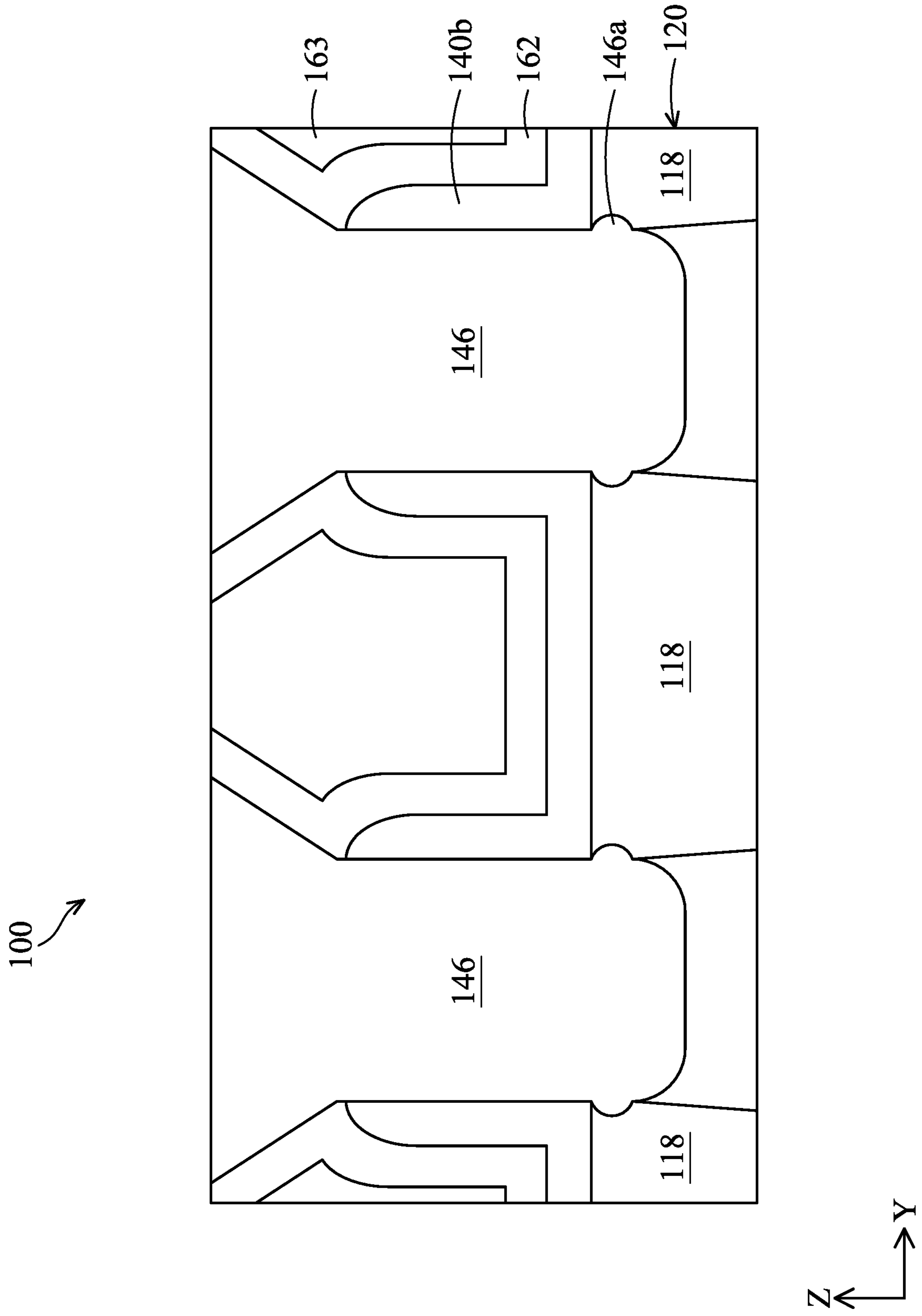

After removing edge portions of the dielectric material 143, a dielectric layer is deposited in the cavities to form dielectric spacers 144, as shown in FIG. 13. The dielectric spacers 144 may be made of a dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The dielectric material 143 is capped between the dielectric spacers 144 along the X direction, as shown in FIG. 13. In some embodiments, the dielectric spacers 144 and the dielectric material 143 include different materials having different etch selectivity. In some embodiments, the cavities formed in the side surfaces of the second portions of the isolation regions 120 under the edge portions of the second portions 140*b* of the spacers 140 may be too small for the dielectric layer to fill. As a result, no dielectric spacers 144 are formed in the cavities in the side surfaces of the second portions of the isolation regions 120. Portions of the subsequently formed source/drain (S/D) regions 146 may fill the cavities, as shown in FIG. 23. Thus, in some embodiments, the S/D regions 146 includes extruding portions 146*a* in the second portions of the isolation regions 120 under the second portion 140*b* of the spacers 140, as shown in FIG. 23.

In FIG. 14, source/drain (S/D) regions 146 are formed from the well portion 116. In some embodiments, the S/D regions 146 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. In some embodiments, the S/D regions 146 are n-type S/D epitaxial features and may be made of one or more layers of Si, SiP, SiC and SiCP for n-channel FETs. In some embodiments, the S/D regions 146 are p-type epitaxial features and may be made of one or more layers of Si, SiGe, Ge for p-channel FETs. For p-channel FETs, p-type dopants, such as boron (B), may also be included in the S/D regions 146. The S/D regions 146 may be formed by an epitaxial growth method using CVD, ALD or MBE. The S/D region 146 may include doped and undoped epitaxial materials. As described above, the second semiconductor layers 108 (FIG. 8) are removed during the formation of the S/D regions 146. As a result, the source of Ge is removed prior to the formation of the S/D regions 146, and Dit is improved.

Figure 15:
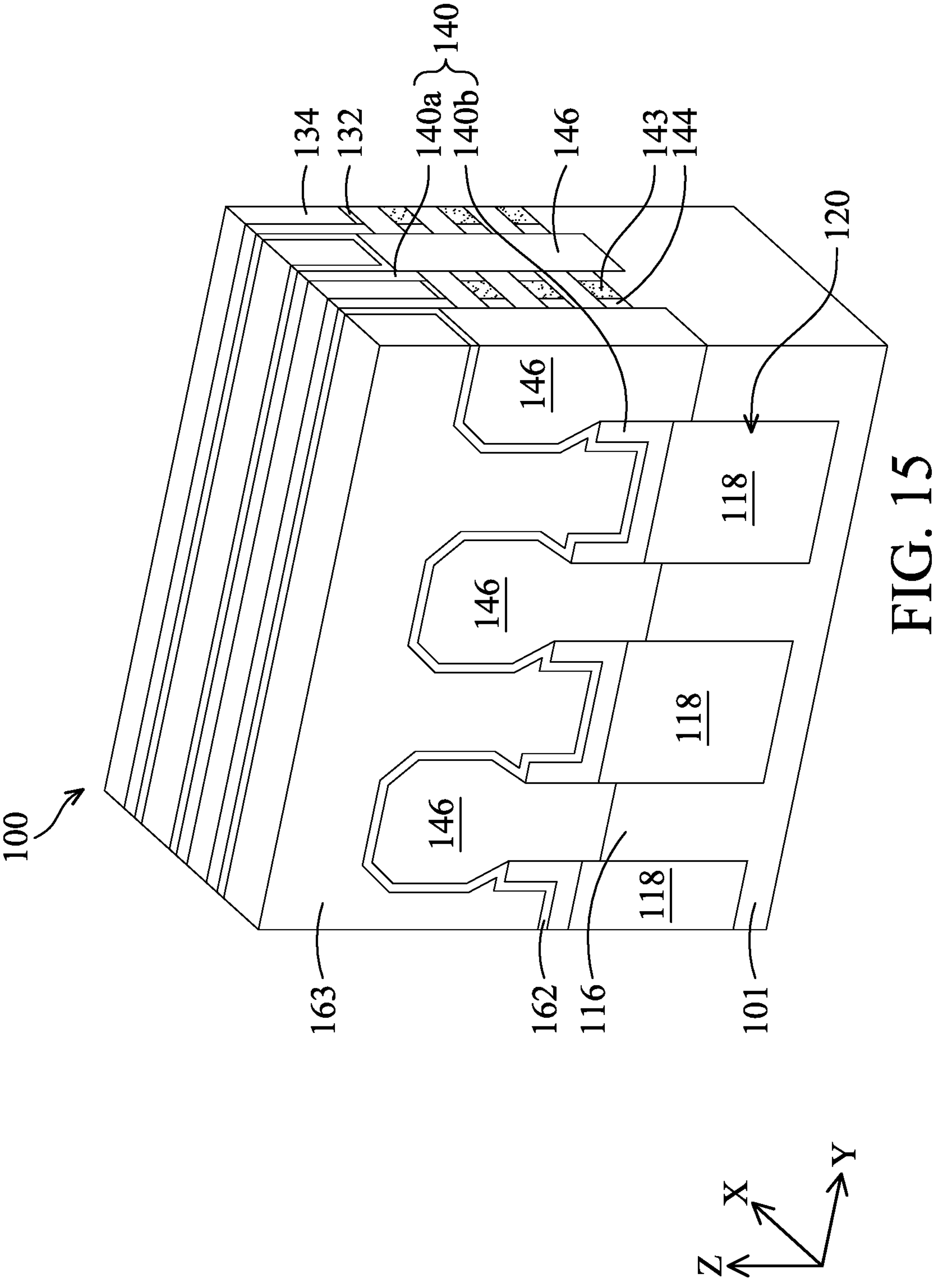

In FIG. 15, a contact etch stop layer (CESL) 162 is conformally formed on the exposed surfaces of the semiconductor device structure 100. The CESL 162 covers the sidewalls of the first portion 140*a* of the spacers 140 and is disposed on the second portion 140*b* of the spacers 140 and the S/D regions 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 163 is formed on the CESL 162. The materials for the ILD layer 163 may include compounds including Si, O, C, and/or H, such as silicon oxide, SiCOH, or SiOC. Organic materials, such as polymers, may also be used for the ILD layer 163. The ILD layer 163 may be deposited by a PECVD process or other suitable deposition technique. In some embodiments, after formation of the ILD layer 163, the semiconductor device structure 100 may be subject to a thermal process to anneal the ILD layer 163.

A planarization process is performed to expose the sacrificial gate electrode layer 134, as shown in FIG. 15. The planarization process may be any suitable process, such as a CMP process. The planarization process removes portions of the ILD layer 163 and the CESL 162 disposed on the sacrificial gate stacks 130. The planarization process may also remove the mask structure 136.

Figure 16:
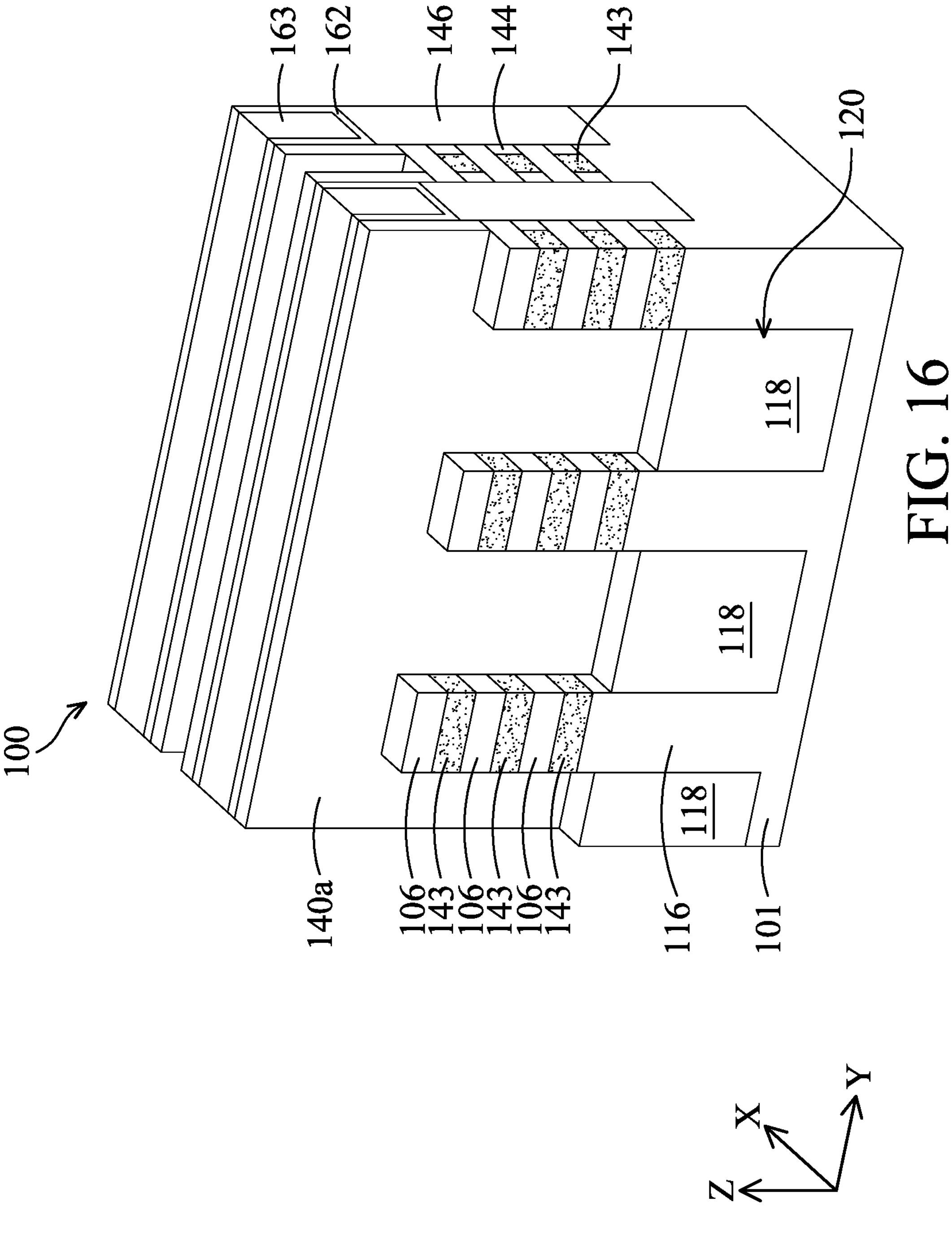

In FIG. 16, the sacrificial gate electrode layer 134 and the sacrificial gate dielectric layer 132 are removed, exposing a portion of the top surface of the topmost first semiconductor layer 106. The first portions of the isolation regions 120 are also exposed. The top portion of the semiconductor device structure 100 in FIGS. 16 to 21B may be cut-off for clarity. The sacrificial gate electrode layer 134 may be first removed by any suitable process, such as dry etch, wet etch, or a combination thereof, followed by the removal of the sacrificial gate dielectric layer 132, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the spacers 140, the ILD layer 163, and the CESL 162.

Figure 17:
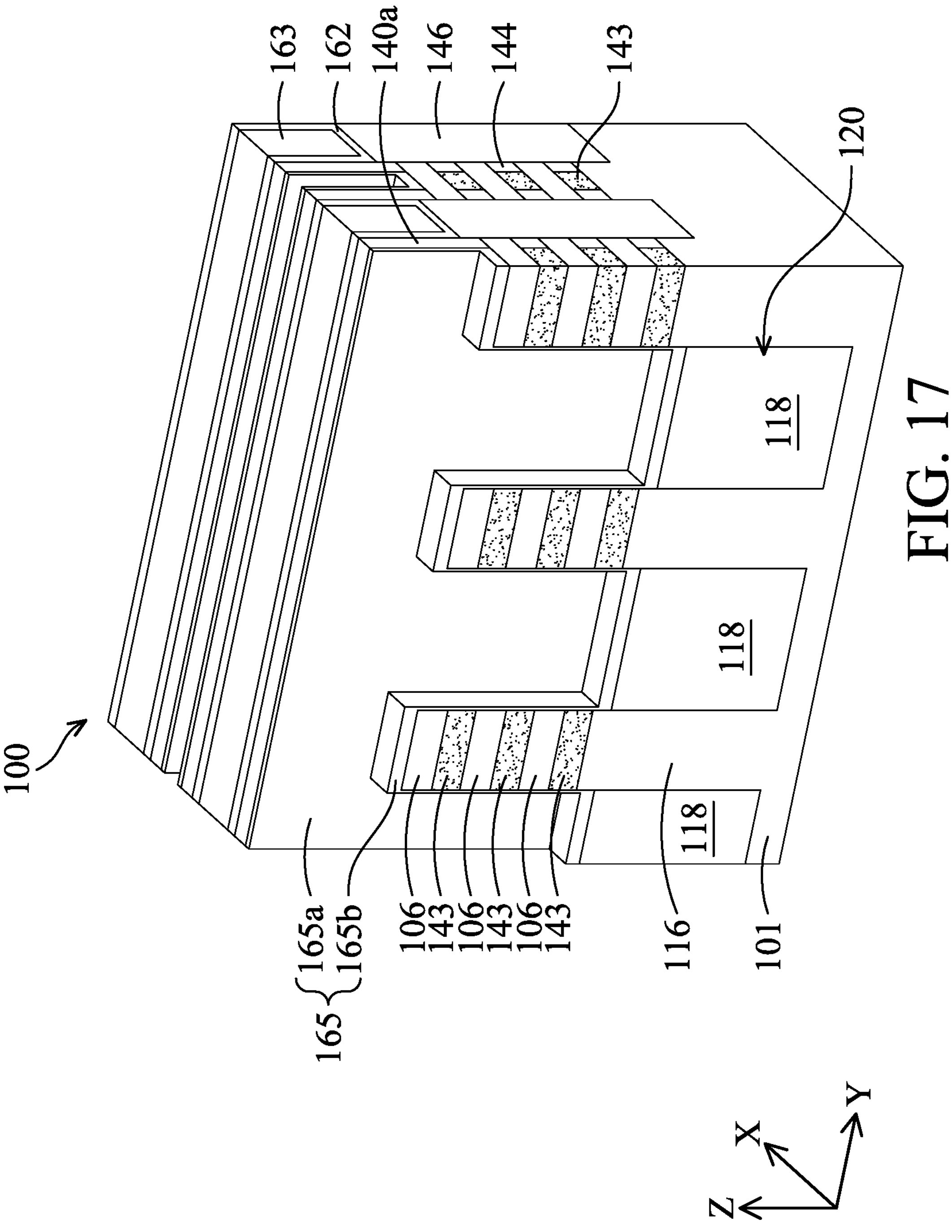

In FIG. 17, a dielectric layer 165 is formed on the semiconductor device structure 100. The dielectric layer 165 may include any suitable dielectric material, such as SiOCN. In some embodiments, the dielectric layer 165 and the dielectric material 143 include different materials having different etch selectivity. The dielectric layer 165 may be formed by any suitable method. In some embodiments, the dielectric layer 165 is formed by a non-conformal process, such as PECVD. As a result, the dielectric layer 165 includes vertical portions 165*a* and horizontal portions 165*b*, and the thickness of the horizontal portion 165*b* along the Z direction is substantially greater than the thickness of thickness of the vertical portion 165*a* along the X or Y direction. In some embodiments, the dielectric layer 165 is formed by first depositing a conformal layer by a conformal process, such as ALD, followed by an implantation or a treatment process. The implantation or treatment process modifies the composition of the vertical portions 165*a* and/or the horizontal portions 165*b* to create an etch selectivity between the vertical portions 165*a* and the horizontal portions 165*b*. In some embodiments, the implantation process may be a directional implant process that implants more dopants into the horizontal portions 165*b* than the vertical portions 165*a*. In some embodiments, the treatment process is a plasma treatment process with a bias, and more dopants are incorporated into the horizontal portions 165*b* than the vertical portions 165*a*. In some embodiments, carbon or nitrogen is introduced into the dielectric layer 165 by the implantation process or the treatment process, and the concentration of carbon or nitrogen is higher in the horizontal portions 165*b* than the vertical portions 165*a*.

Figure 18:
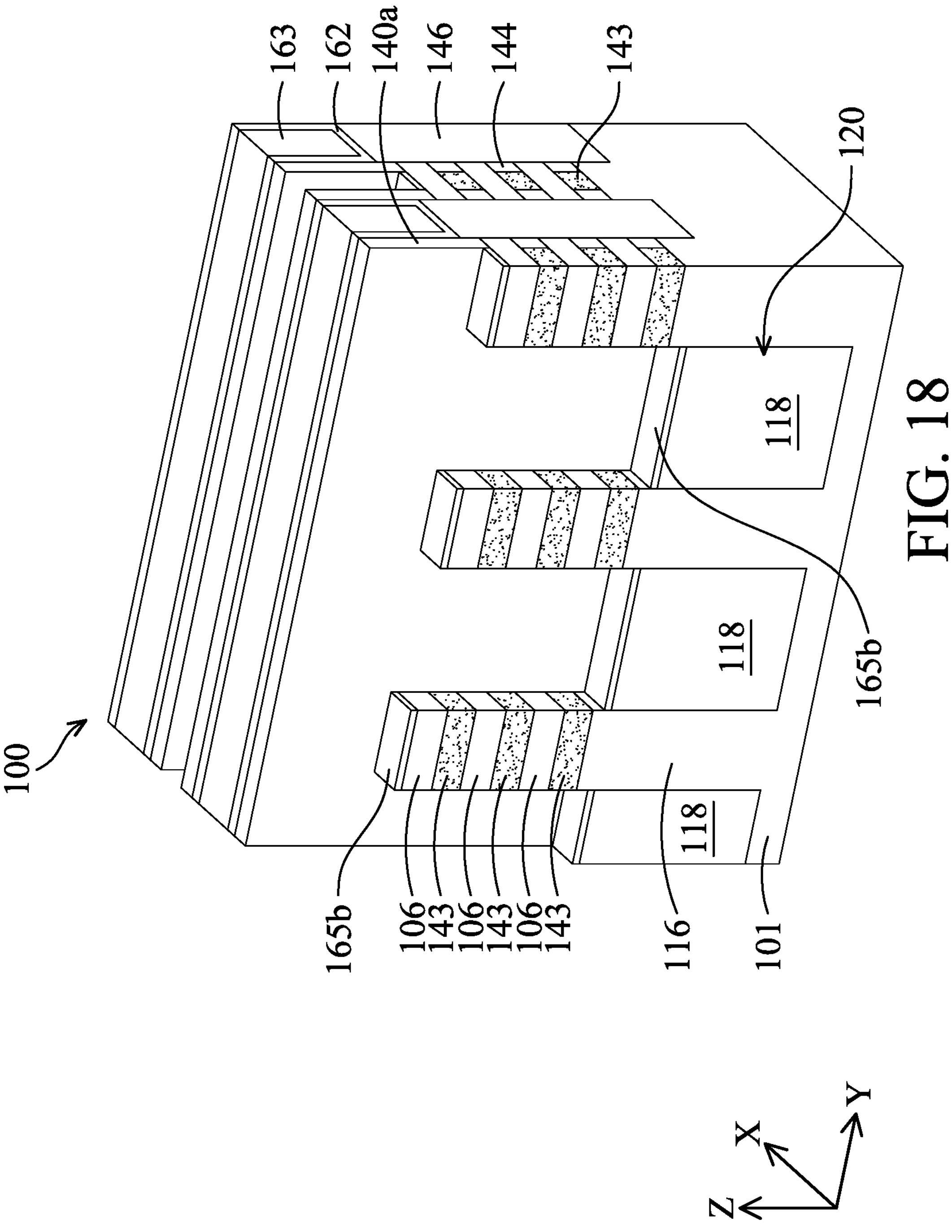

In FIG. 18, an etch process is performed to remove the vertical portions 165*a* of the dielectric layer 165. The etch process may be a wet etch process or an isotropic etch process. In some embodiments, the horizontal portions 165*b* are substantially thicker than the vertical portions 165*a*, and the etch process completely removes the vertical portions 165*a* and removes a portion of the horizontal portions 165*b*. In some embodiments, the etch rate of the vertical portions 165*a* is substantially faster than the etch rate of the horizontal portions 165*b* during the etch process, and the vertical portions 165*a* are completely removed while portions of the horizontal portions 165*b* remain. As a result, the horizontal portions 165*b* remain on the top surface of the topmost first semiconductor layer 106 and on the first portions of the isolation regions 120, as shown in FIG. 18. The remaining horizontal portions 165*b* has a thickness substantially less than the thickness of the horizontal portions 165*b* prior to the etch process.

Figure 19:
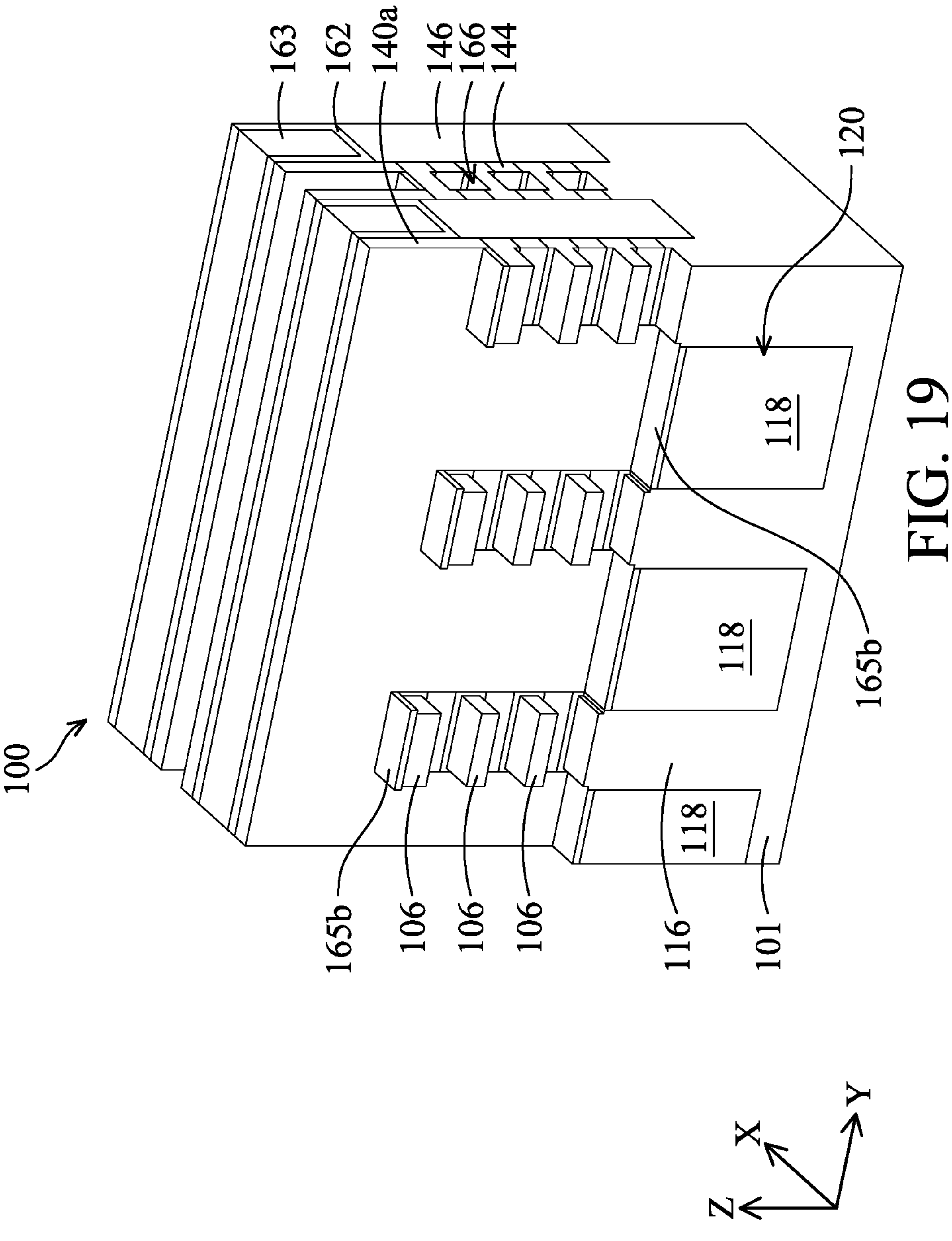

In FIG. 19, the dielectric material 143 is removed. The dielectric material 143 may be removed by any suitable process. In some embodiments, the dielectric material 143 is removed by a selective etch process. The selective etch process removes the dielectric material 143 between the first semiconductor layers 106 but does not remove the first semiconductor layers 106, the ILD layer 163, the CESL 162, the spacers 140, and the horizontal portions 165*b* of the dielectric layer 165. The horizontal portions 165*b* of the dielectric layer 165 protects the first portions of the isolation regions 120 from recessed by the selective etch process. In some embodiments, the first semiconductor layers 106 may be also recessed by the selective etch process. For example, the first semiconductor layers 106 may be recessed along the Z direction. In other words, recess 166 is formed in the top surface and bottom surface of each first semiconductor layer 106, with the exception of the top surface of the topmost first semiconductor layer 106, which is protected by the horizontal portion 165*b* of the dielectric layer 165. In some embodiments, the recess is about 1 nm to about 3 nm along the Z direction. The portion of each first semiconductor layer 106 not covered by the dielectric spacers 144 may be exposed after the removal of the dielectric material 143. Each first semiconductor layer 106 may be a nanostructure channel.

Figure 20:
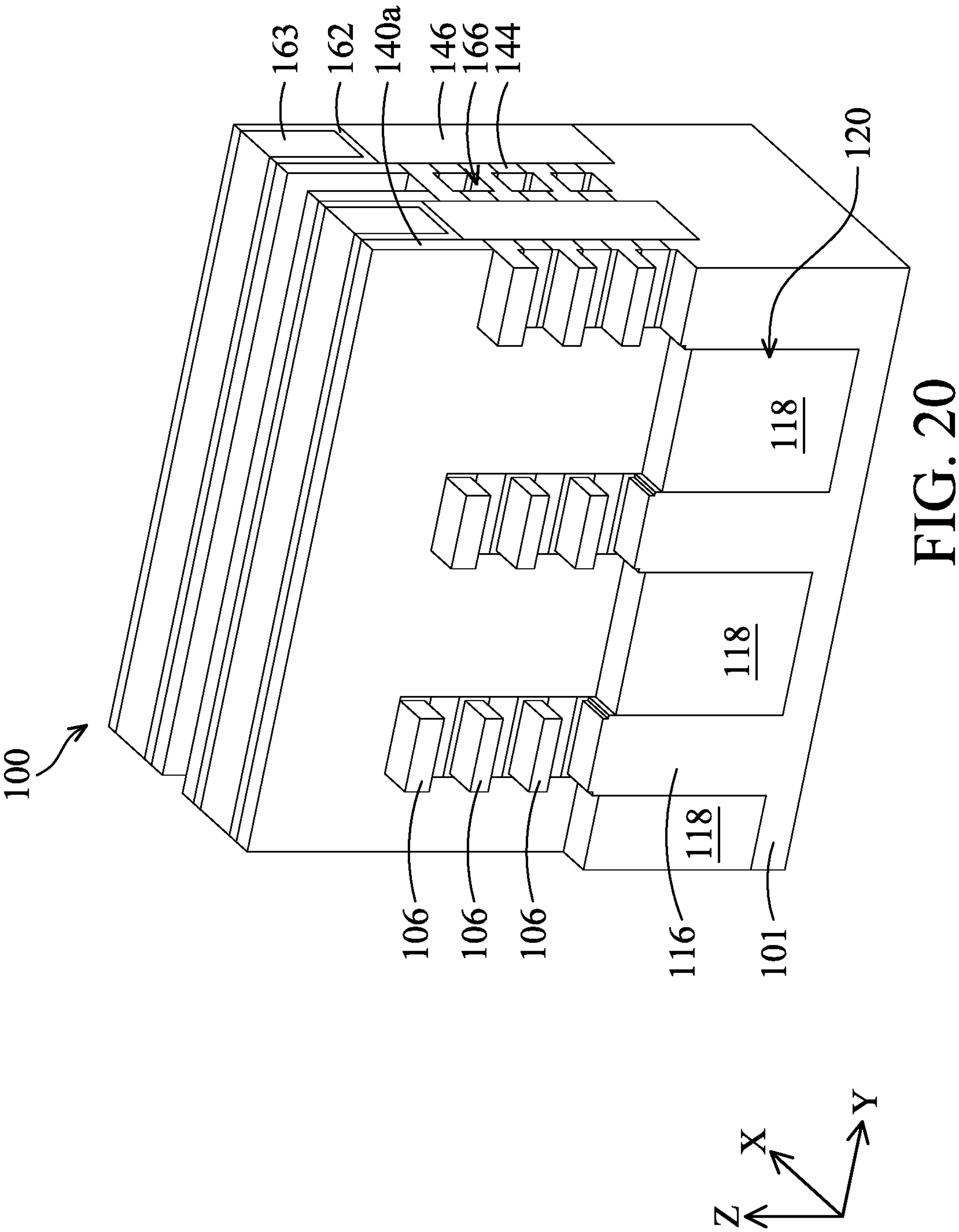

In FIG. 20, the horizontal portions 165*b* of the dielectric layer 165 are removed. The horizontal portions 165*b* of the dielectric layer 165 may be removed by any suitable process. In some embodiments, the horizontal portions 165*b* are removed by a selective etch process. The selective etch process removes the horizontal portions 165*b* does not remove the first semiconductor layers 106, the ILD layer 163, the CESL 162, the spacers 140, and the first portions of the isolation regions 120. In some embodiments, because the horizontal portions 165*b* are thin, other materials are not substantially affected. In some embodiments, the first portions of the isolation regions 120 may be recessed by less than 30 nm, such as from about 5 nm to about 30 nm, as a result of the removal of the horizontal portions 165*b*.

Figure 21:
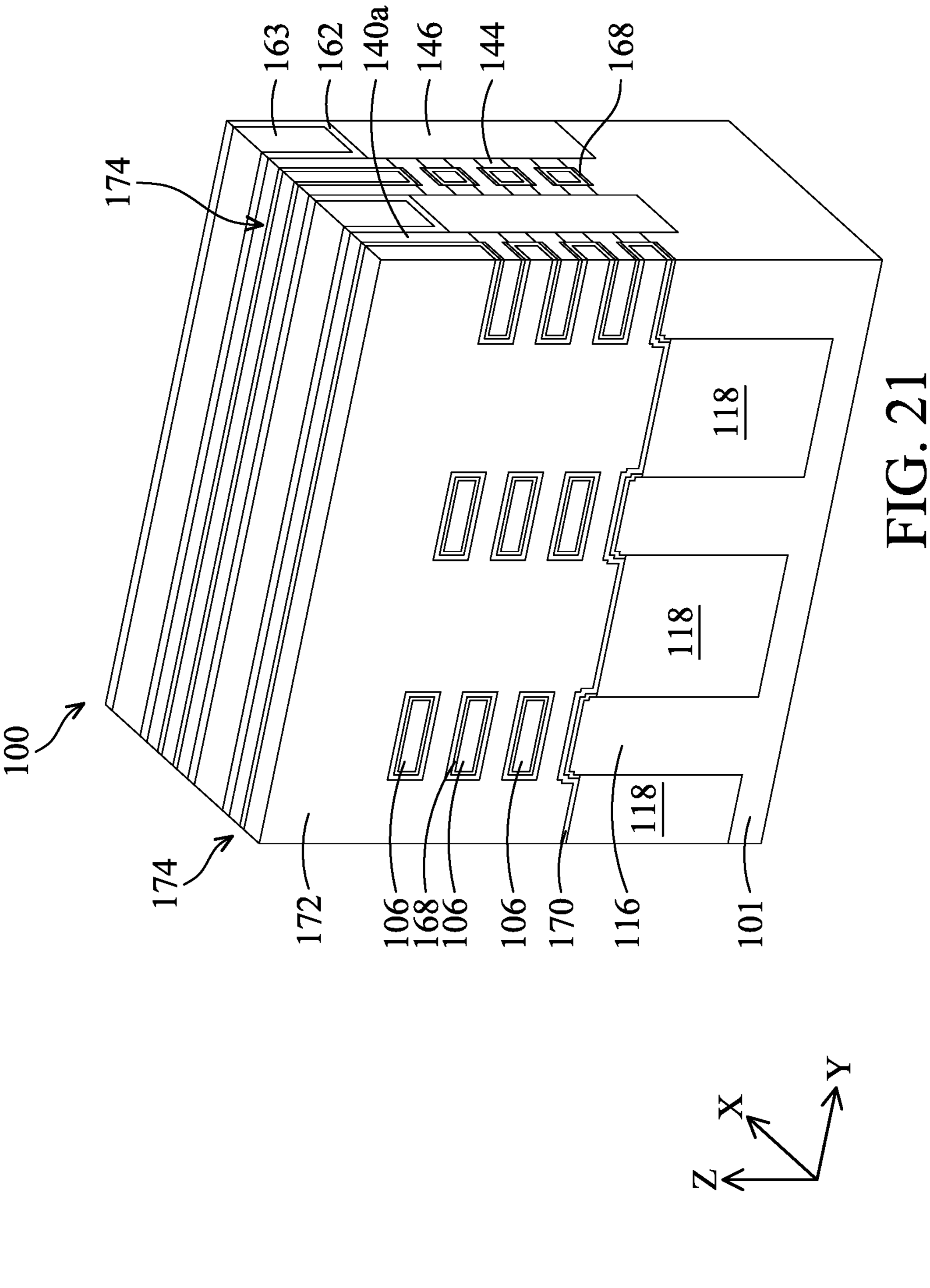

After the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170, as shown in FIG. 21. The gate dielectric layer 170 and the gate electrode layer 172 may be collectively referred to as a gate structure 174. In some embodiments, an interfacial layer (IL) 168 is formed between the gate dielectric layer 170 and the exposed surfaces of the first semiconductor layers 106. The IL 168 may include an oxide, such as silicon oxide, and may be formed as a result of a clean process. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate dielectric layer 170 and the gate electrode layer 172 may be also deposited over the ILD layer 163. The gate dielectric layer 170 and the gate electrode layer 172 formed over the ILD layer 163 are then removed by using, for example, CMP, until the top surface of the ILD layer 163 is exposed.

As described in FIG. 19, the horizontal portions 165*b* of the dielectric layer 165 protects the first portions of the isolation regions 120 during the removal of the dielectric material 143. Without the horizontal portions 165*b* to protect the first portions of the isolation regions 120, the first portions of the isolation regions 120 may be recessed by 20 nm to about 60 nm. As a result, the gate electrode layer 172 may extend further towards the substrate 101, which can lead to increased parasitic capacitance.

The second portions of the isolation regions 120 in the S/D regions are protected by the second portions 140*b* of the spacers 140, as shown in FIG. 15, and the first portions of the isolation regions 120 in the channel regions are protected by the horizontal portions 165*b*, as shown in FIG. 21. In some embodiments, the thickness of the second portions of the isolation regions 120 along the Z direction in the S/D regions is substantially the same as the thickness of the first portions of the isolation regions 120 in the channel regions. In some embodiments, the second portions of the isolation regions 120 in the S/D regions or the first portions of the isolation regions 120 in the channel regions are not protected.

Figure 24:
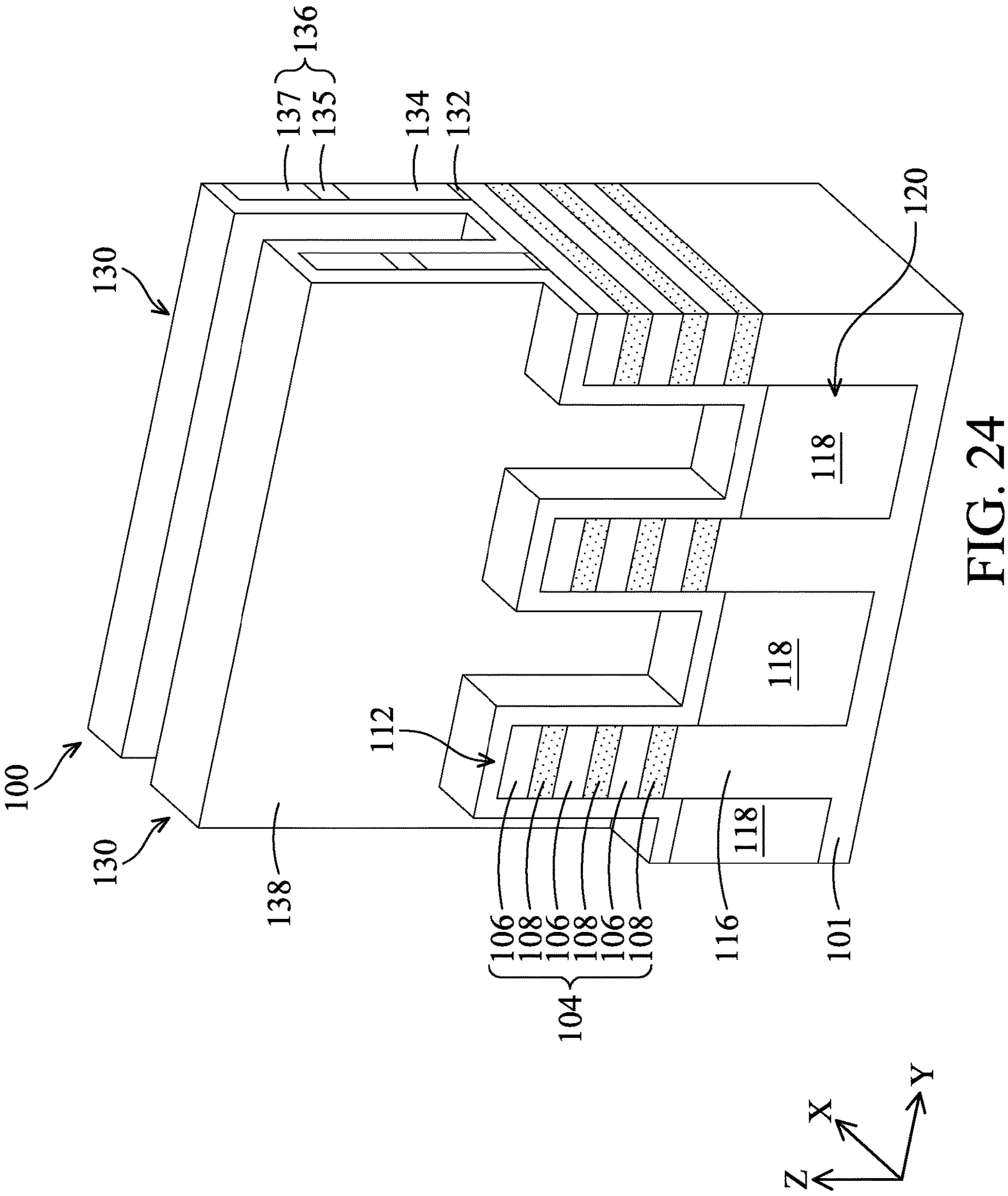
FIGS. 24-28 are perspective views of various stages of manufacturing the semiconductor device structure, in accordance with some embodiments.
Figure 25:
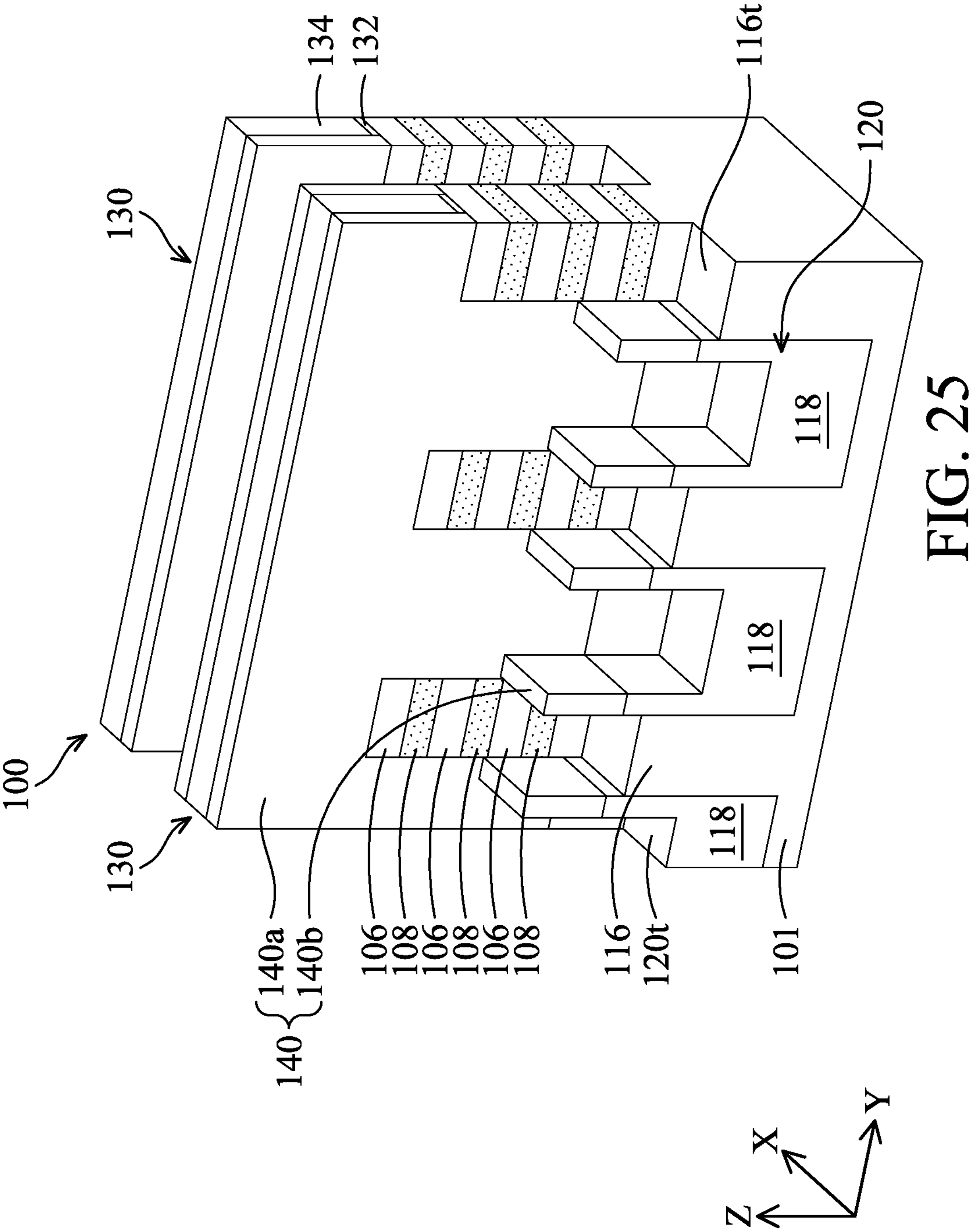

FIGS. 24 to 28 are perspective views of various stages of manufacturing the semiconductor device structure 100, in accordance with some embodiments. In FIG. 24, the spacer layer 138 is conformally formed on the semiconductor device structure 100, which is the same as the process step shown in FIG. 6. Next, the one or more etch processes are performed to recess the portions of the fin structures 112 not covered by the sacrificial gate structures 130. The mask 139 (FIG. 7) is not formed on the portion of the spacer layer 138 formed on the second portions of the isolation regions 120. Without the mask 139, the one or more etch processes also remove the portions of the spacer layer 138 formed on the second portions of the isolation regions 120 and portions of the second portions of the isolation regions 120 disposed therebelow, as shown in FIG. 25. The top portions of the semiconductor device structure 100 in FIGS. 25 to 27 may be cut-off for clarity. The top surface 120*t* of the second portion of the isolation region 120 is located at a level substantially below the top surface 116*t* of the well portion 116. The second portion 140*b* of the spacer 140 does not include the horizontal portion disposed on the second portion of the isolation region 120, as shown in FIG. 25.

Figure 26:
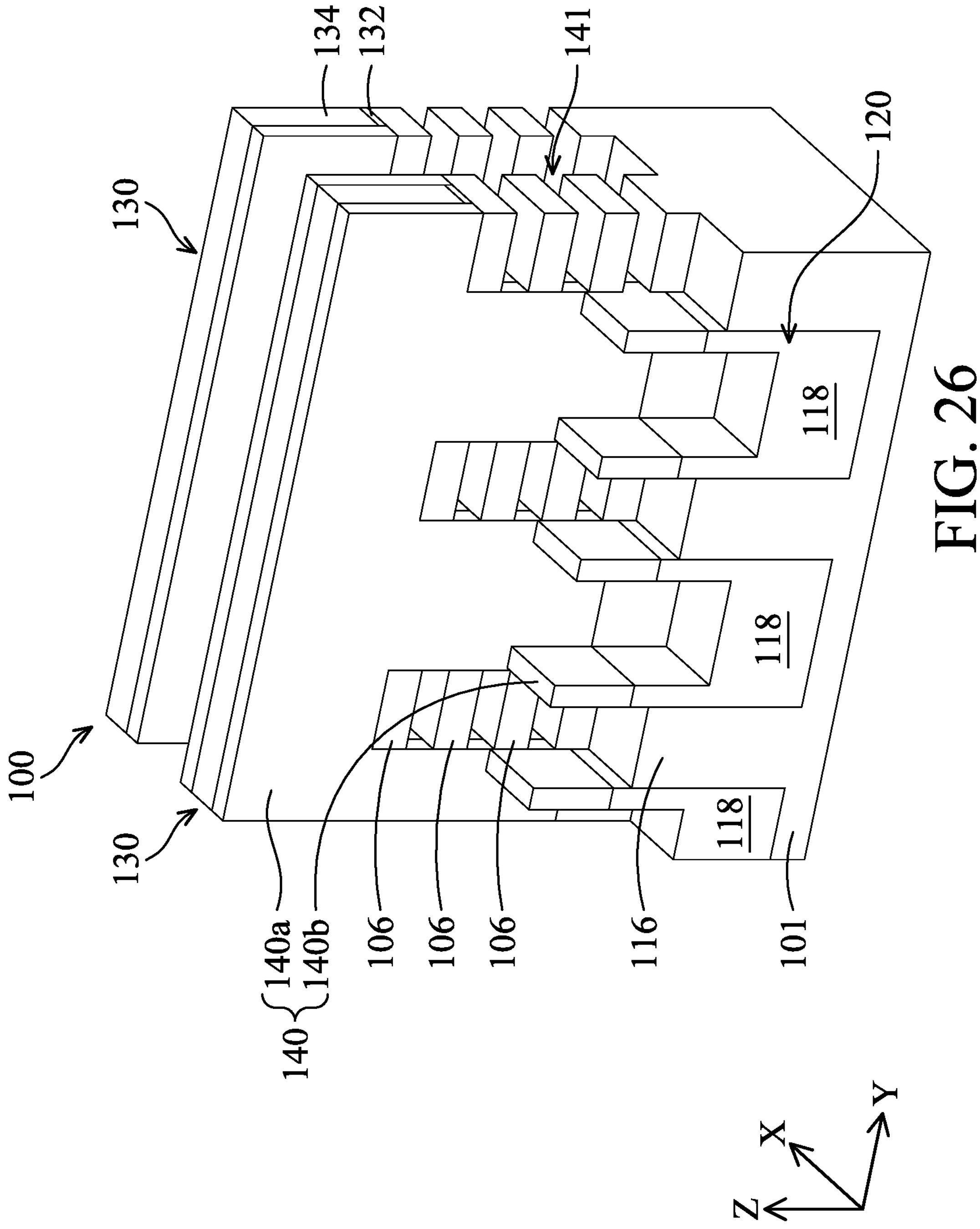
Figure 27:
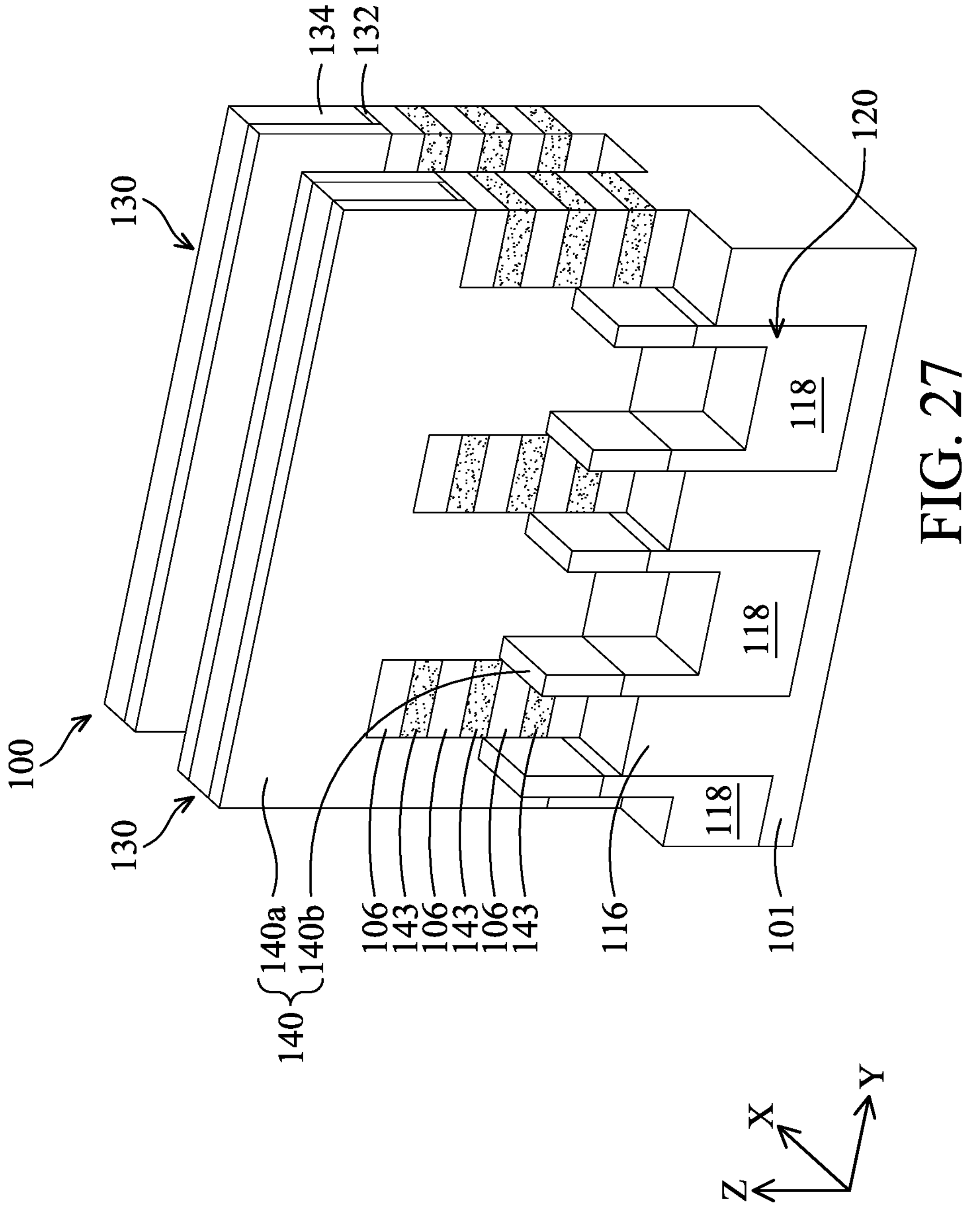

In FIG. 26, the second semiconductor layers 108 are removed, and the openings 141 are formed. The second semiconductor layers 108 may be removed by the process described in FIG. 9. In FIG. 27, the dielectric material 143 is formed in the openings 141. The dielectric material 143 may be formed by the process described in FIGS. 10 and 11. In some embodiments, the etch back process to remove portions of the dielectric material 143 other than the portions of the dielectric material 143 formed in the openings 141 further recesses the second portions of the isolation regions 120. Next, the edge portions of the dielectric material 143 are removed horizontally along the X direction to form cavities, which is similar to the processes described in FIG. 12, and dielectric spacers 144 are formed in the cavities, which is similar to the processes described in FIG. 13.

Figure 28:
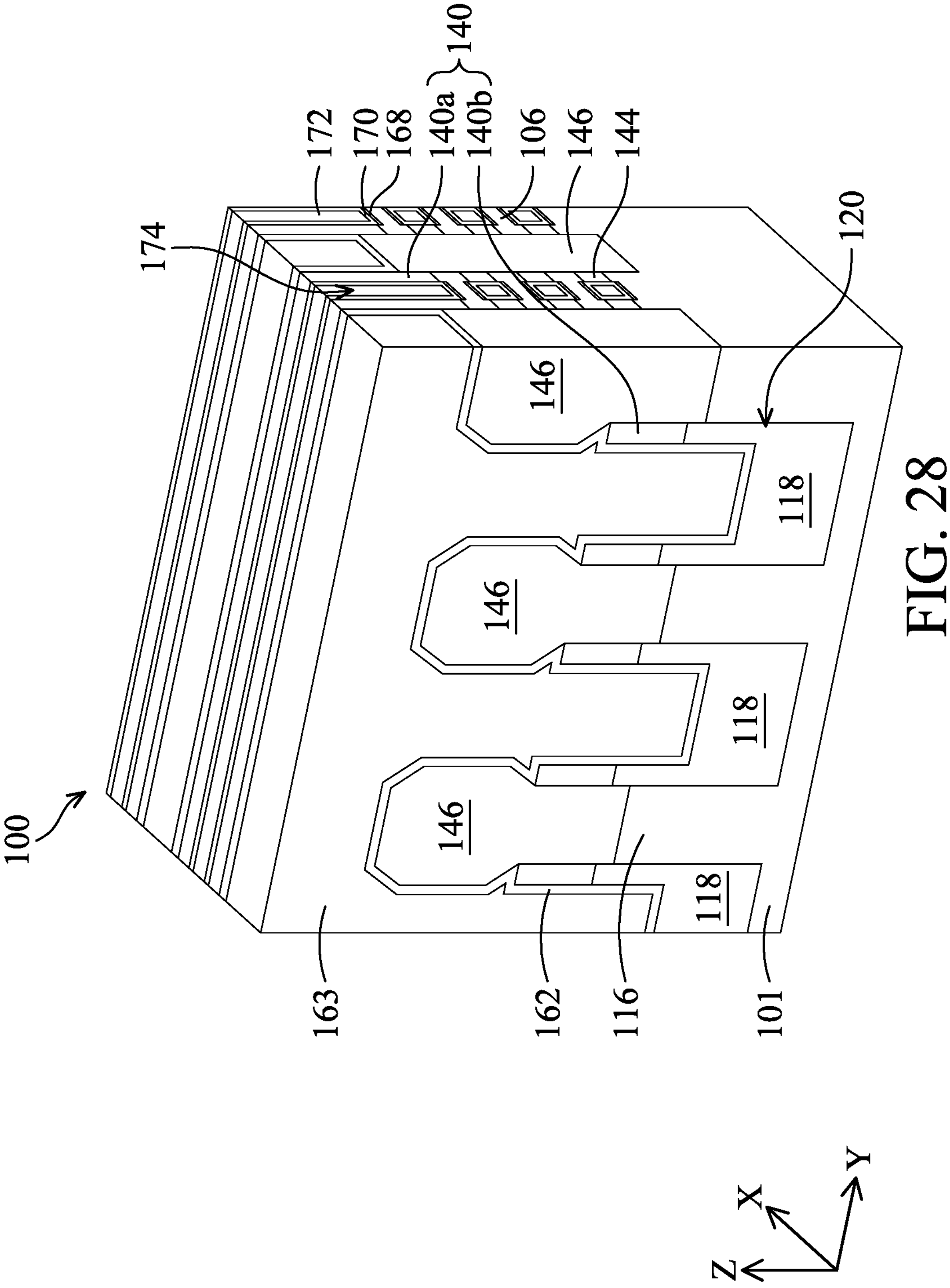

In FIG. 28, processes described in FIGS. 14 to 21 are performed. The S/D regions 146 are formed. The CESL 162 and the ILD layer 163 extends further towards the substrate 101 as a result of the recessed second portions of the isolation regions 120 between adjacent S/D regions 146. The sacrificial gate stacks 130 are removed, the dielectric layer 165 is formed with the horizontal portions 165*b* protecting the first portions of the isolation regions 120 in the channel regions and the topmost first semiconductor layer 106. The dielectric material 143 is removed, followed by the removal of the horizontal portions 165*b* of the dielectric layer 165. The gate structures 174 including the IL 168, the gate dielectric layer 170, and the gate electrode layer 172 are formed. In the embodiment shown in FIGS. 24 to 28, the second portions of the isolation regions 120 in the S/D regions are not protected, and the first portions of the isolation regions 120 in the channel regions are protected. Thus, in some embodiments, the thickness of the first portions of the isolation regions 120 in the channel regions are substantially greater than the thickness of the second portions of the isolation regions 120 in the S/D regions.

Figure 29:
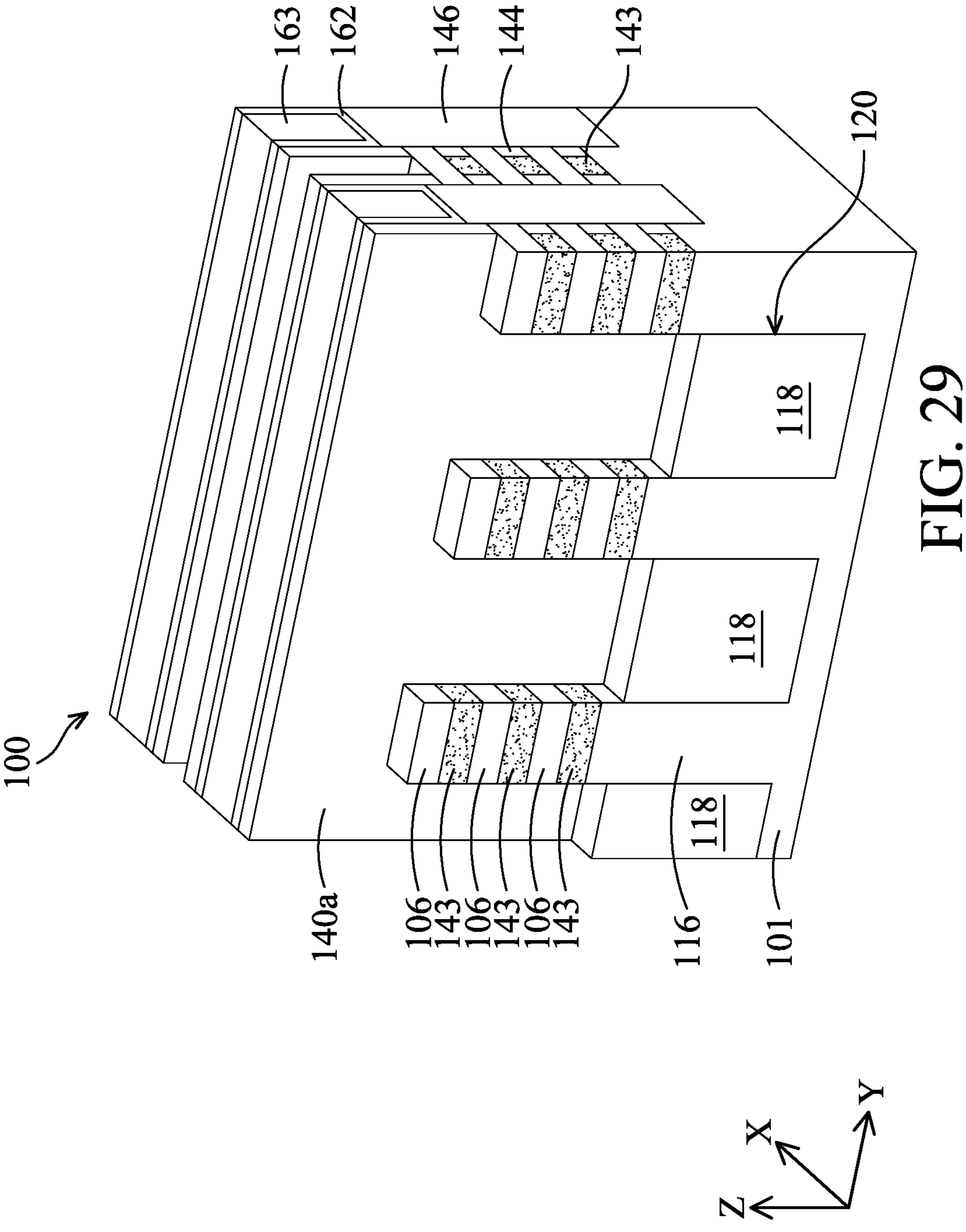
FIGS. 29-31 are perspective views of various stages of manufacturing the semiconductor device structure, in accordance with some embodiments.
Figure 30:
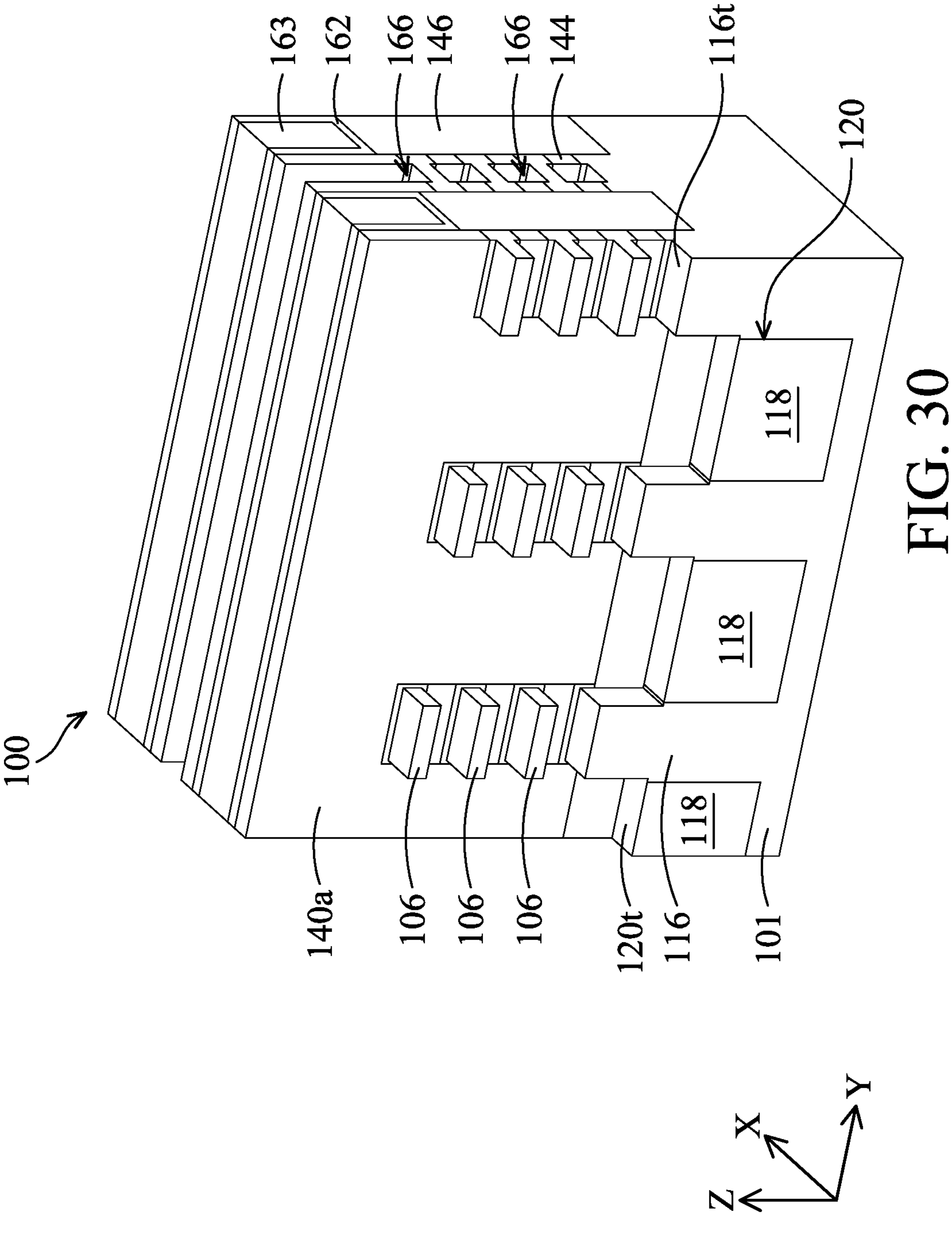
Figure 31:
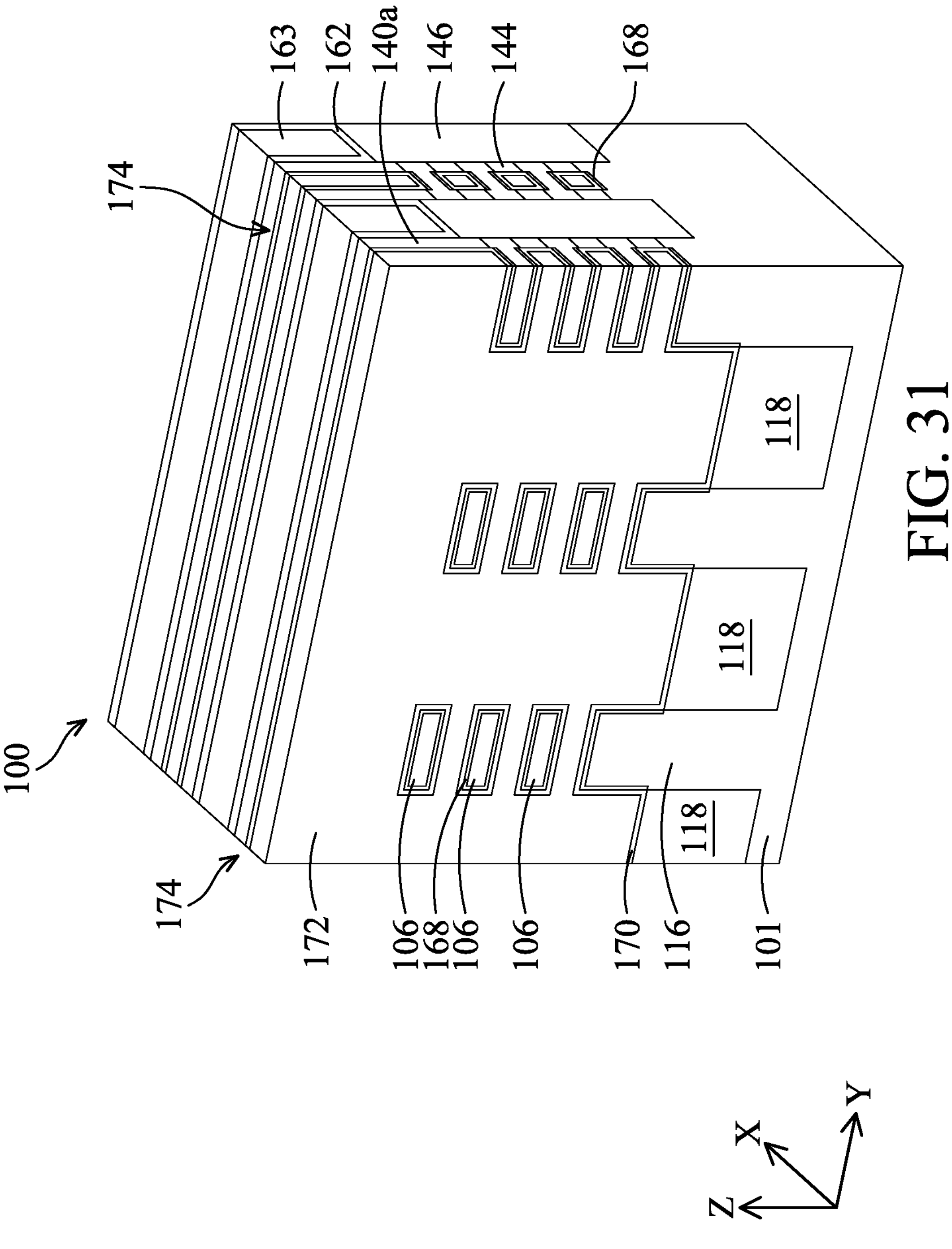

FIGS. 29 to 31 are perspective views of various stages of manufacturing the semiconductor device structure 100, in accordance with some embodiments. In FIG. 29, the sacrificial gate electrode layer 134 and the sacrificial gate dielectric layer 132 are removed, which is the same as the process step shown in FIG. 16. At this stage, the second portions of the isolation regions 120 in the S/D regions are similar to the second portions of the isolation regions 120 shown in FIG. 14, which are protected by the second portions 140*b* of the spacers 140. Next, as shown in FIG. 30, the dielectric material 143 is removed without forming the dielectric layer 165 (FIG. 17). As described above, in some embodiments, the dielectric material 143 and the isolation regions 120 include the same material. As a result, the first portions of the isolation regions 120 in the channel regions are recessed during the removal of the dielectric material 143. In some embodiments, the vertical distance (along the Z direction) between the level of the top surface 116*t* and the level of the top surface 120*t* ranges from about 20 nm to about 60 nm. In some embodiments, the thickness of the first portions of the isolation regions 120 in the channel regions is substantially less than the thickness of the second portions of the isolation regions 120 in the S/D regions, as shown in FIG. 30. Furthermore, because the dielectric layer 165 is not formed in this embodiment, the recess 166 is also formed in the top surface of the topmost first semiconductor layer 106, as shown in FIG. 30.

In FIG. 31, the gate structures 174 are formed. The IL 168, the gate dielectric layer 170, and the gate electrode layer 172 are formed by processes described in FIG. 21. The gate electrode layer 172 extends further towards the substrate 101, compared to the gate electrode layer 172 shown in FIG. 21.

Figure 32:
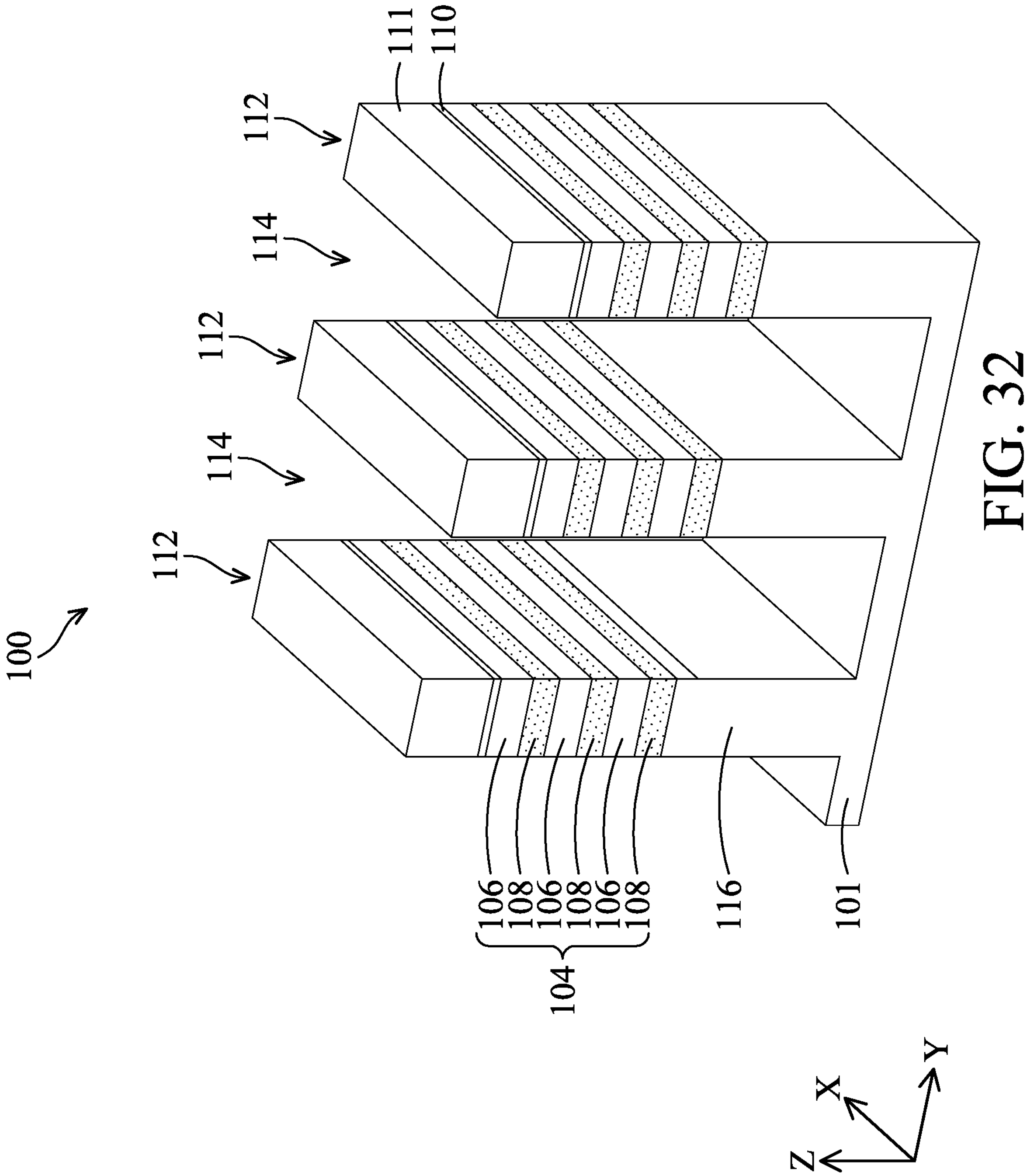
FIGS. 32-48 are perspective views of various stages of manufacturing the semiconductor device structure, in accordance with alternative embodiments.

FIGS. 32 to 48 are perspective views of various stages of manufacturing the semiconductor device structure, in accordance with alternative embodiments. In FIG. 32, the fin structures 112 are formed from the stack of semiconductor layers 104, and the trenches 114 are formed between adjacent fin structures 112. The fin structures 112 and the trenches 114 may be formed by the same processes as described in FIG. 2.

Figure 33:
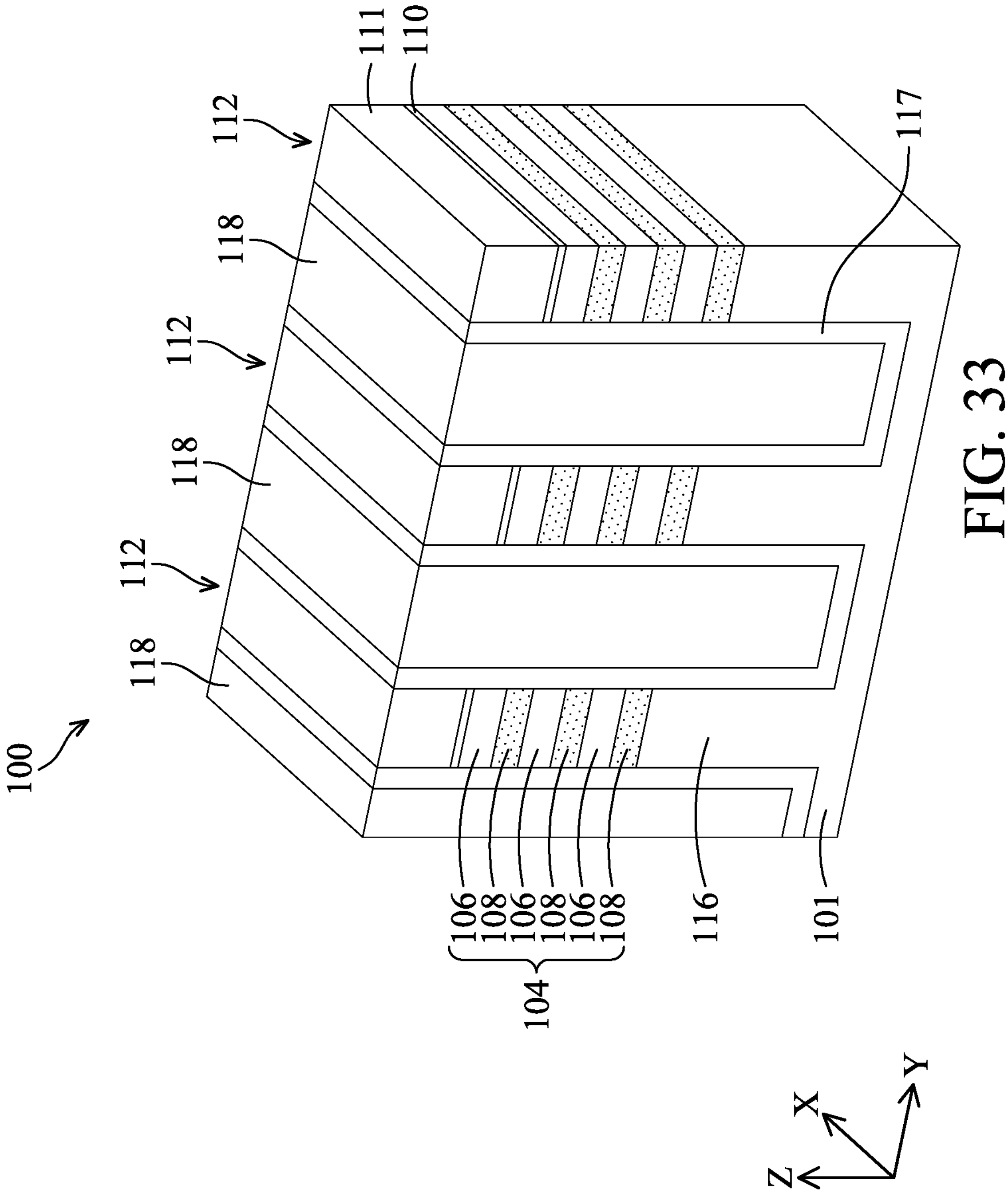

In FIG. 33, a dielectric layer 117 is formed in the trenches 114, and the insulating material 118 is formed on the dielectric layer 117. The dielectric layer 117 includes a material that is different from the material of the insulating material 118, so the dielectric layer 117 and the insulating material 118 have a different etch selectivity during an etch process. In some embodiments, the dielectric layer 117 includes a dielectric material, such as SiN, SiCN, SiOC, or SiOCN. The dielectric layer 117 may be formed by any suitable process. In some embodiments, the dielectric layer 117 is a conformal layer formed by a conformal process, such as ALD. In some embodiments, the dielectric layer 117 is a liner. The dielectric layer 117 may have a thickness ranging from about 2 nm to about 6 nm. The dielectric layer 117 protects the side surfaces of the well portion 116 to prevent the formation of S/D regions 146 (FIG. 44) from forming on the side surfaces of the well portion 116. Thus, if the thickness of the dielectric layer 117 is less than about 2 nm, the dielectric layer 117 may be too thin to protect the side surfaces of the well portion 116 during the subsequent processes to form the dielectric material 143 and the dielectric spacers 144. On the other hand, if the thickness of the dielectric layer 117 is greater than about 6 nm, the overall K value of the isolation region 120 (FIG. 34) may be too high. The dielectric layer 117 and the insulating material 118 may be also formed on the nitride layer 111, and a planarization process may be performed to remove the portions of the dielectric layer 117 and the insulating material 118 disposed on the nitride layer 111, as shown in FIG. 33.

Figure 34:
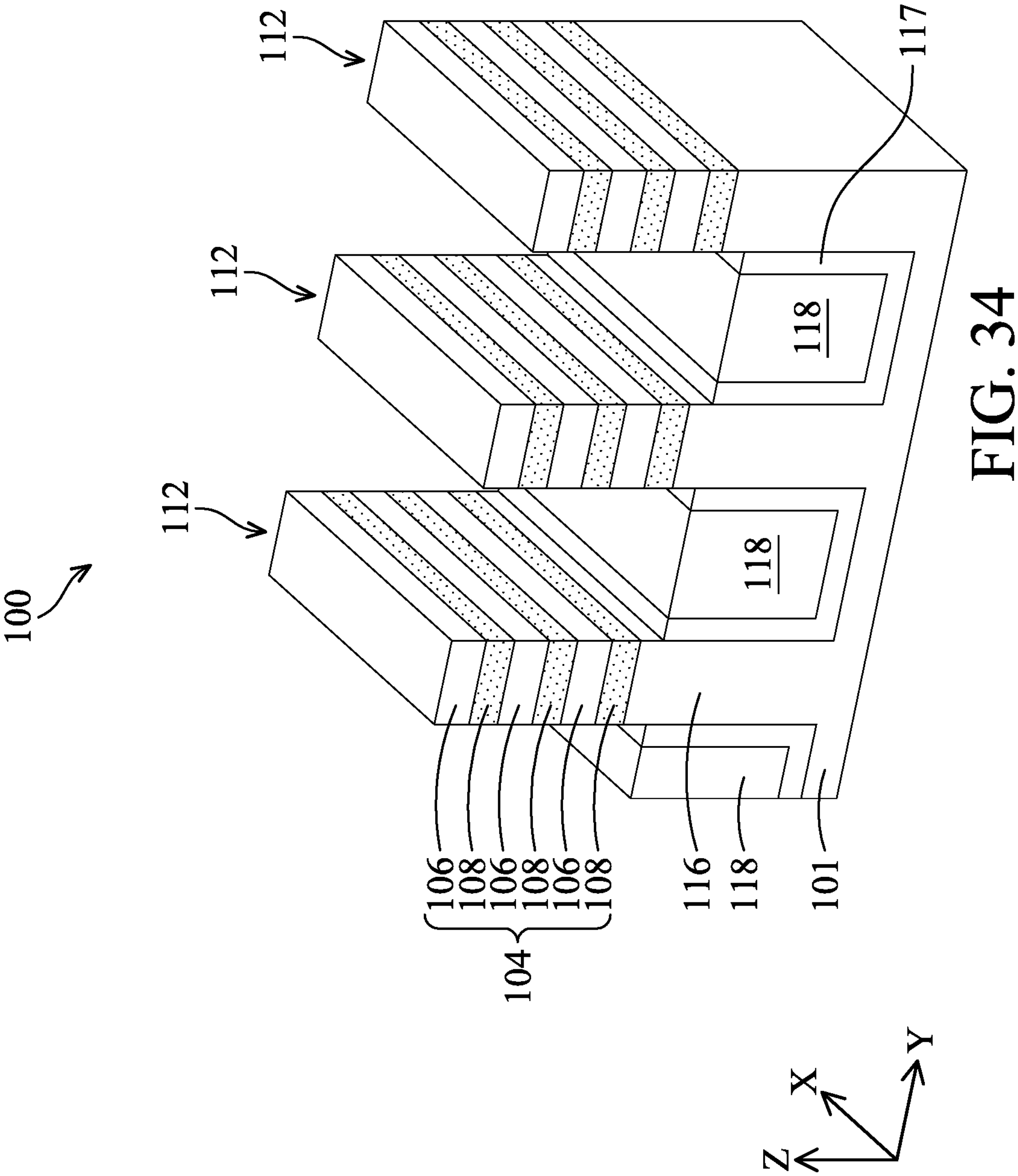

In FIG. 34, the dielectric layer 117 and the insulating material 118 are recessed to form the isolation regions 120. Unlike the isolation regions 120 shown in FIG. 4, the isolation region 120 shown in FIG. 34 includes an "U" shaped dielectric layer 117 and the insulating material 118 disposed on the dielectric layer 117. The bottom surface and side surfaces of the insulating material 118 are in contact with the dielectric layer 117. The recess of the dielectric layer 117 and the insulating material 118 exposes portions of the fin structures 112, such as the stack of semiconductor layers 104. The recess of the dielectric layer 117 and the insulating material 118 reveals the trenches 114 between the neighboring fin structures 112. The isolation regions 120 may be formed using a suitable process, such as a dry etching process, a wet etching process, or a combination thereof. In some embodiments, the dielectric layer 117 and the insulating material 118 are recessed by two different etch processes. For example, the insulating material 118 is recessed by a first etch process that does not substantially affect the dielectric layer 117 and the stack of semiconductor layers 104, and the dielectric layer 117 is recessed by a second etch process that does not substantially affect the insulating material 118 and the stack of semiconductor layers 104. In some embodiments, the top surfaces of the dielectric layer 117 and the insulating material 118 are located at different levels along the Z direction. In other words, the top surfaces of the dielectric layer 117 and the insulating material 118 are not co-planar. In some embodiments, top surfaces of the dielectric layer 117 and the insulating material 118 are substantially co-planar. In some embodiments, the co-planar top surfaces of the dielectric layer 117 and the insulating material 118 may be level with or below a surface of the second semiconductor layers 108 in contact with the well portion 116 formed from the substrate 101. In some embodiments, the isolation regions 120 are the STI. In some embodiments, the oxide layer 110 and the nitride layer 111 are also removed during the recessing of the dielectric layer 117 and the insulating material 118.

Figure 35:
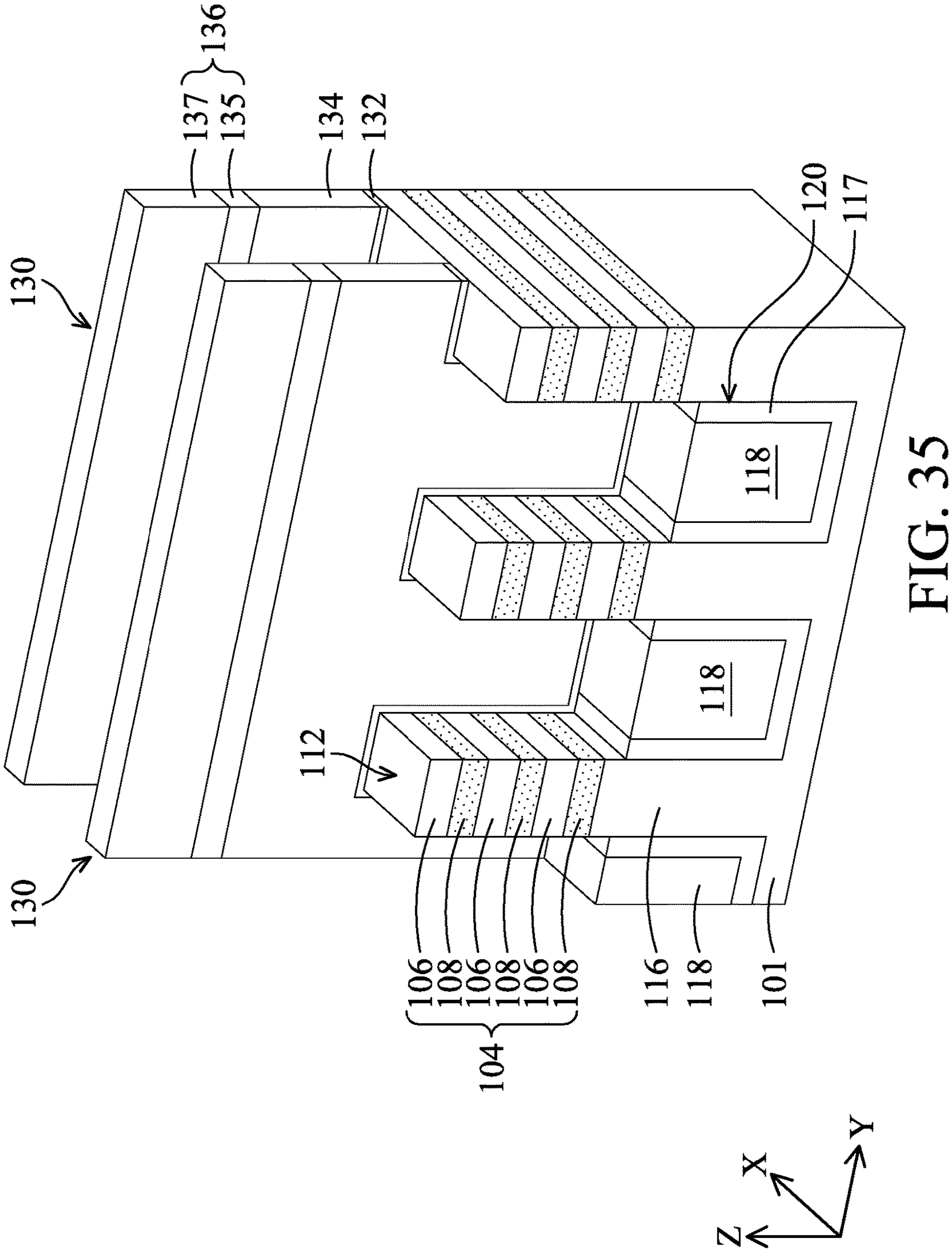

In FIG. 35, the sacrificial gate structures 130 are formed over the semiconductor device structure 100. The sacrificial gate structures 130 are formed over first portions of the fin structures 112 and first portions of the isolation regions 120, while second portions of the fin structures 112 and second portions of the isolation regions 120 are exposed. The first portion of the isolation region 120 includes a first portion of the dielectric layer 117 and a first portion of the insulating material 118, and the second portion of the isolation region 120 includes a second portion of the dielectric layer 117 and a second portion of the insulating material 118. Each sacrificial gate structure 130 may include the sacrificial gate dielectric layer 132, the sacrificial gate electrode layer 134, and the mask layer 136 that may include the oxide layer 135 and the nitride layer 137. The portions of the fin structures 112 that are covered by the sacrificial gate electrode layer 134 of the sacrificial gate structure 130 serve as channel regions for the semiconductor device structure 100.

Figure 36:
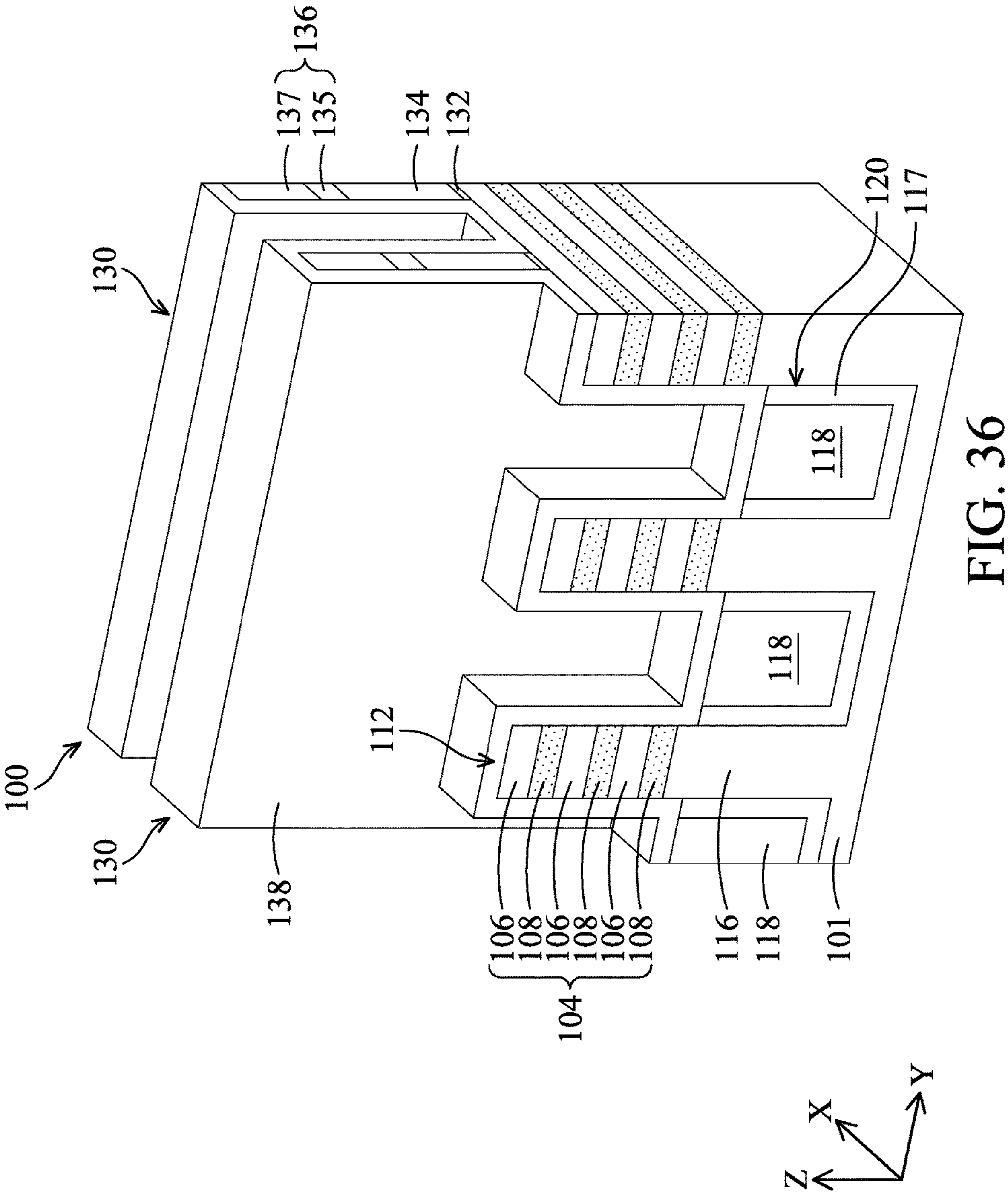
Figure 37:
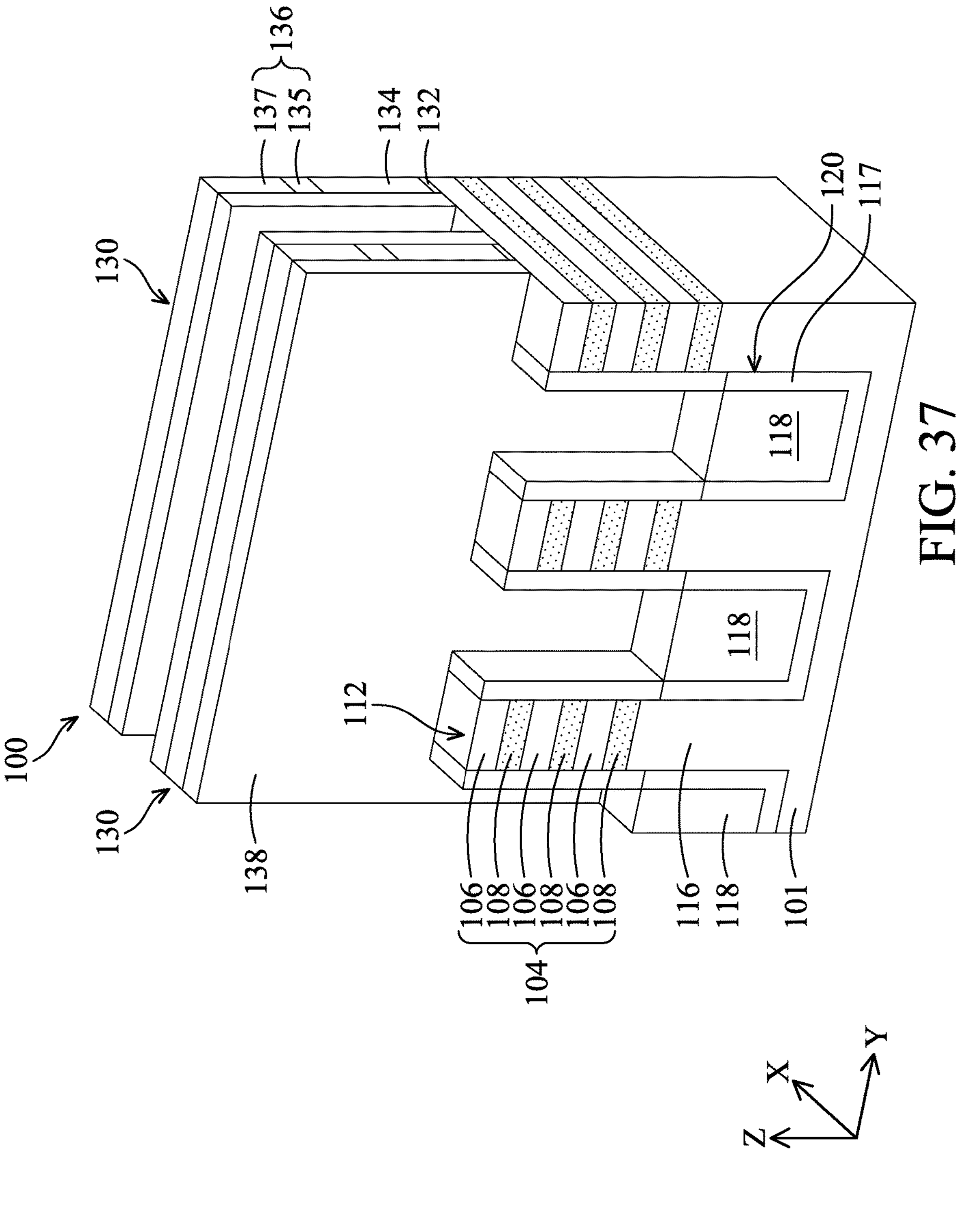

In FIG. 36, the spacer layer 138 is formed to cover the sacrificial gate structures 130, the second portions of the fin structures 112, and the second portions of the isolation regions 120. In FIG. 37, an anisotropic etch process is performed to remove horizontal portions of the spacer layer 138. The anisotropic etch process may be a selective etch process that does not substantially affect the nitride layer 137, the first semiconductor layer 106, and the insulating material 118.

Figure 38:
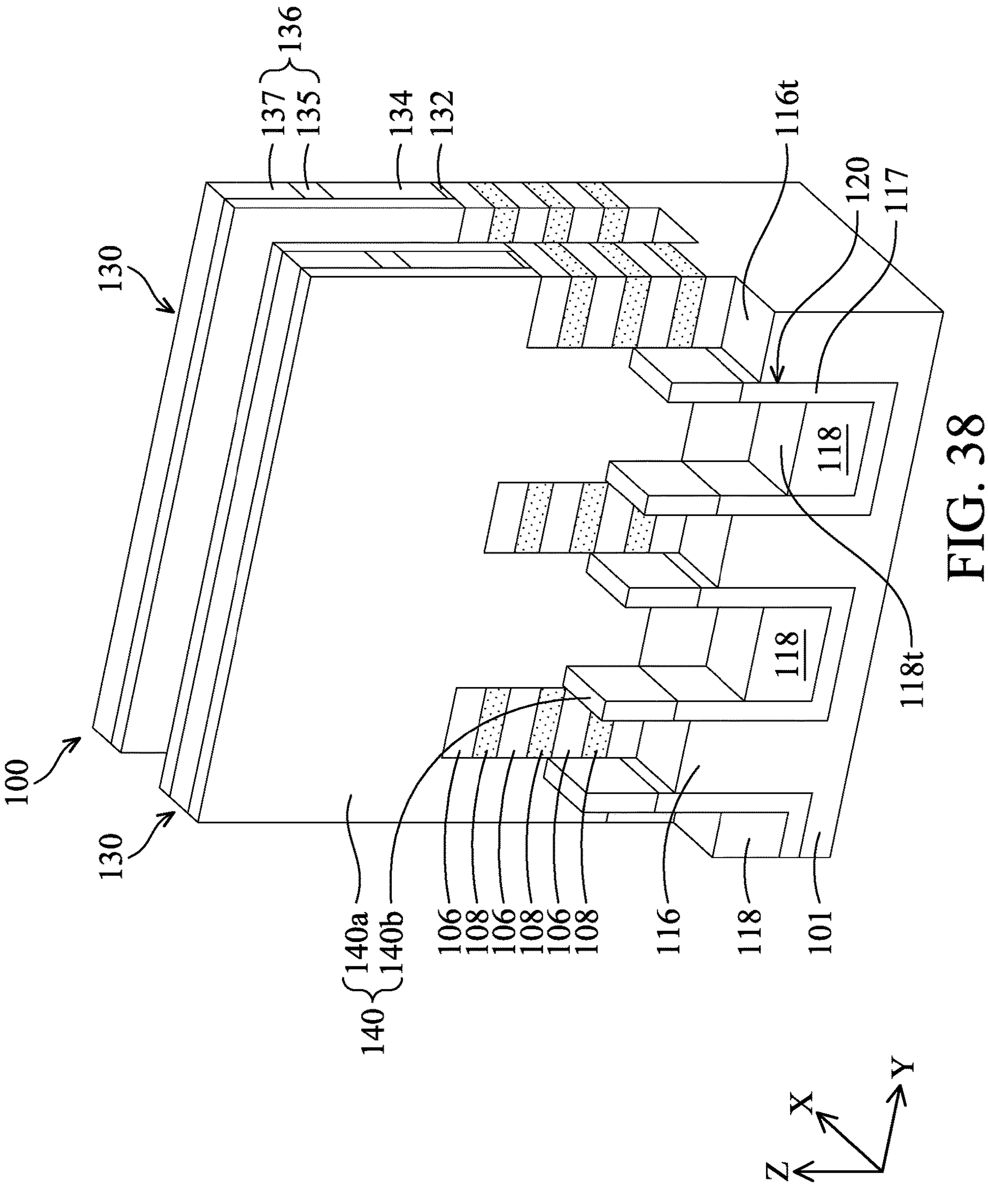

In FIG. 38, an etch process is performed to recess the portions of the fin structures 112 not covered by the sacrificial gate structures 130 (and the portions of the spacer layer 138 formed on sidewalls of the sacrificial gate structures 130). The etch process also removes portions of the spacer layer 138 and the second portions of the insulating material 118, as shown in FIG. 38. The etch process forms the spacers 140 including the first portion **140*a* formed on sidewalls of the sacrificial gate electrode layer 134 and second portions 140*b* formed on the second portions of the dielectric layer 117 not covered by the sacrificial gate structures 130. In some embodiments, top surfaces 116*t* of the well portions 116 are exposed after the recessing the portions of the fin structures 112. The second portions of the insulating material 118 are also recessed by the etch process, and top surfaces 118*t* of the insulating material 118 are located at a level below top surfaces of the second portion of the dielectric material 117 and below the top surfaces 116*t* of the well portions 116, as shown in FIG. 38. Because the first portions of the insulating material 118 located under the sacrificial gate structures 130 and the first portions 140*a* of the spacers 140 are protected during the etch process, the thickness of the second portion of the insulating material 118 located in the S/D regions is substantially less than the thickness of the first portion of the insulating material 118** located in the channel regions.

Figure 39:
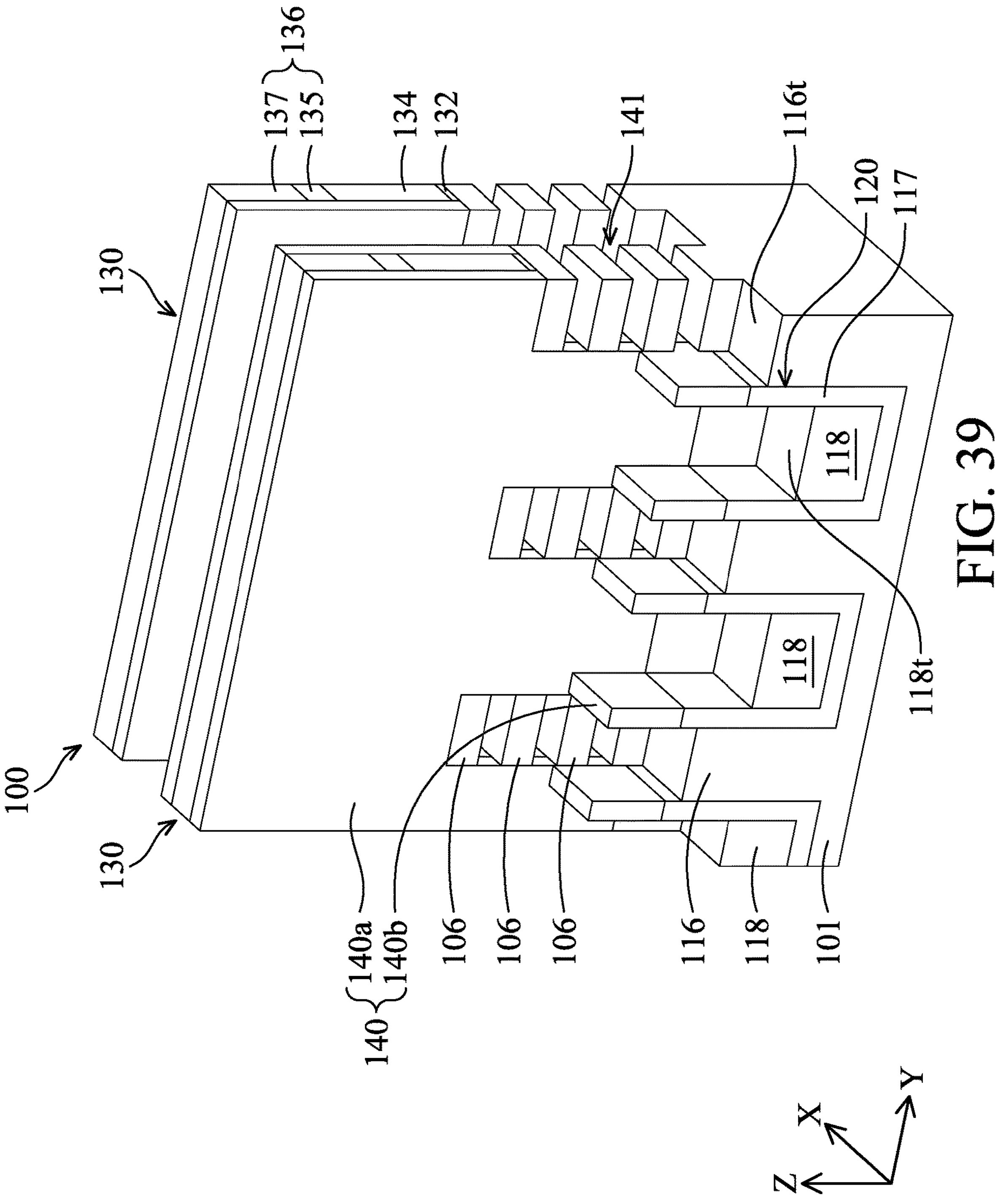
Figure 40:
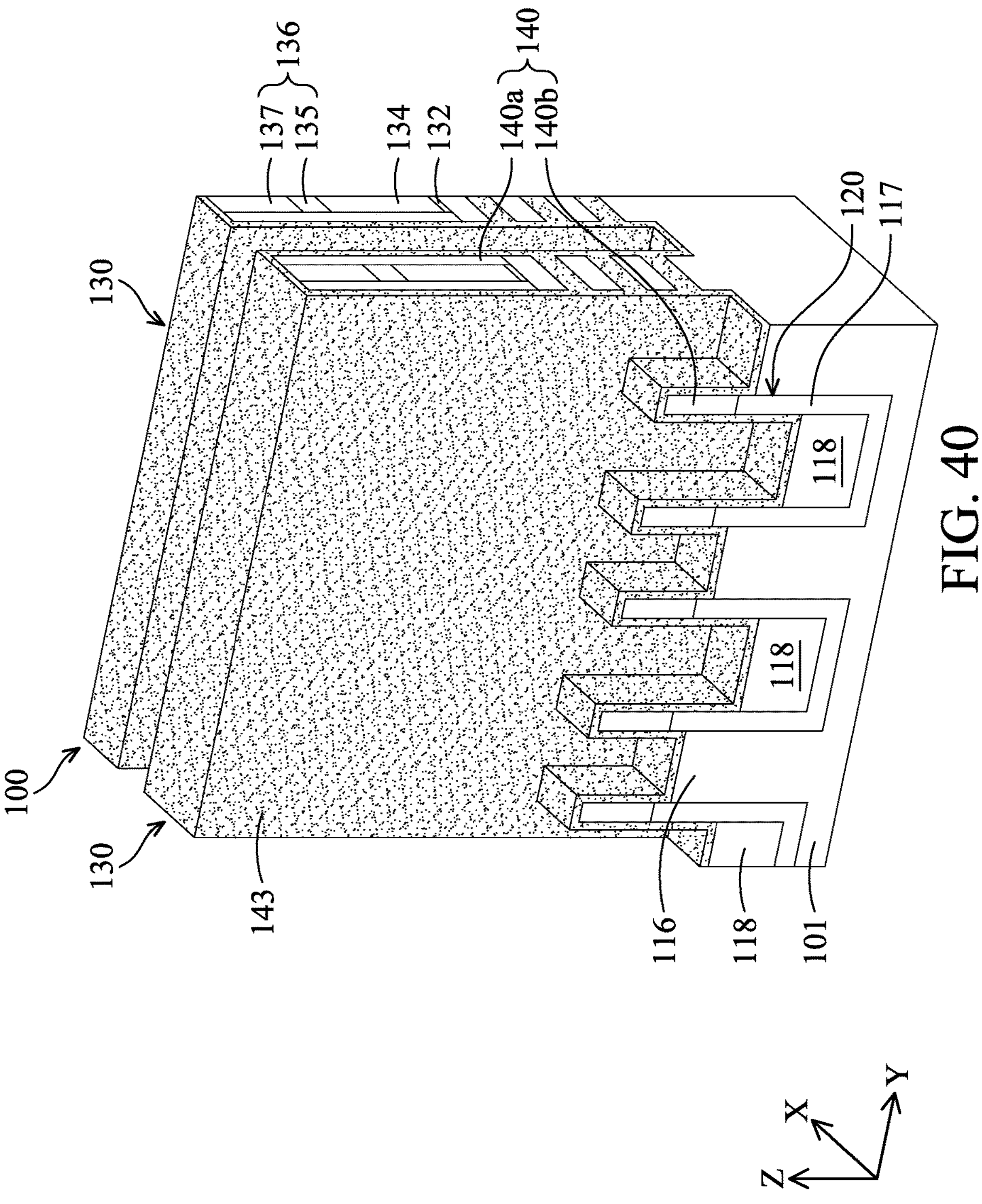
Figure 41:
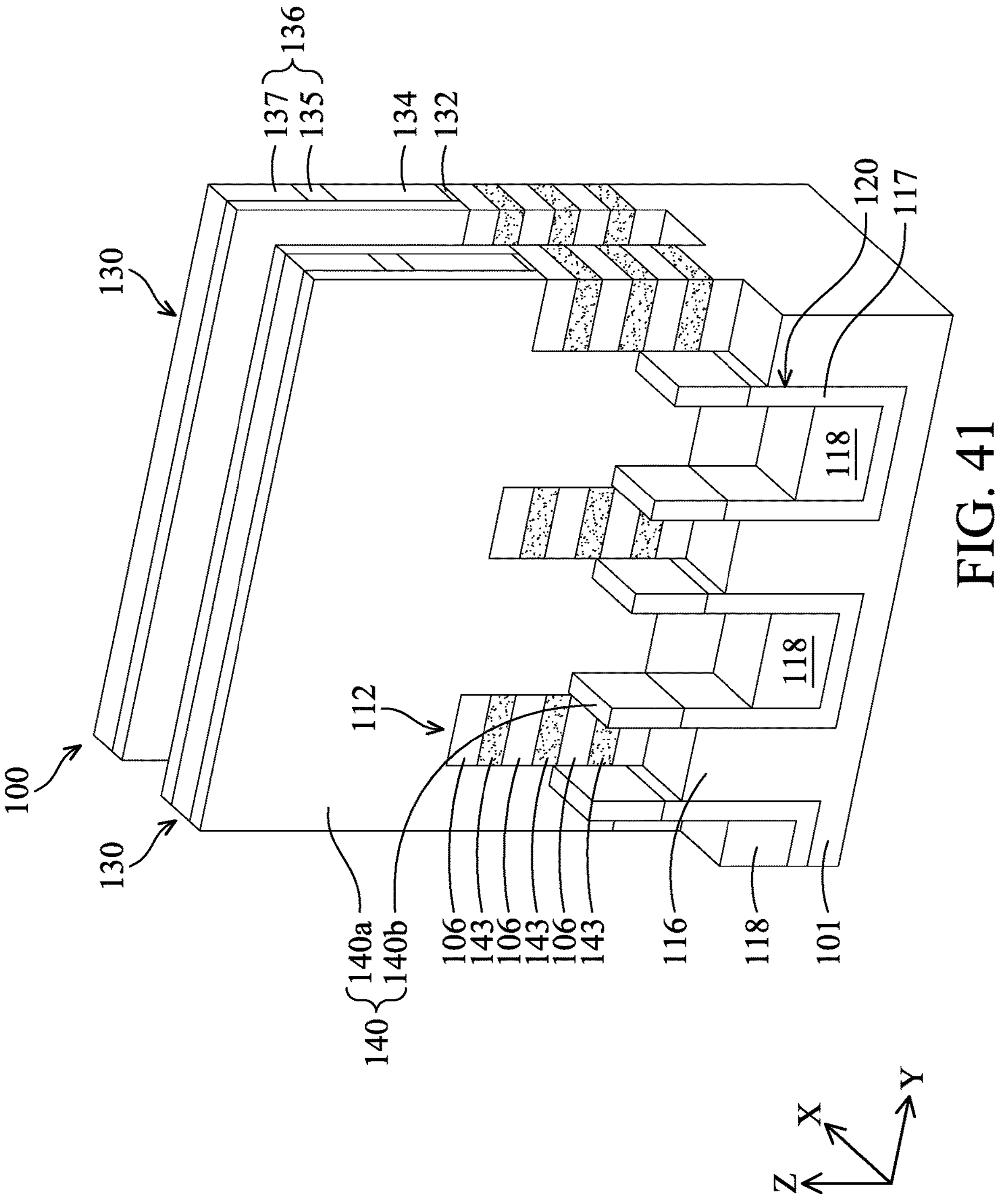

In FIG. 39, the second semiconductor layers 108 are removed to form the openings 141. The second semiconductor layers 108 may be removed by the processes described in FIG. 9. In FIG. 40, the dielectric material 143 is formed in the openings 141 and on the exposed surfaces of the semiconductor device structure 100. The dielectric material 143 may be formed by the processes described in FIG. 10. In FIG. 41, the portions of the dielectric material 143 other than the portions of the dielectric material 143 formed in the openings 141 are removed. As shown in FIG. 41, the side surfaces of the well portion 116 are protected by the dielectric layer 117, which is not affected by the removal of the portions of the dielectric material 143. In some embodiments, the dielectric material 143 and the insulating material 118 include the same material, and the second portions of the insulating material 118 may be further recessed during the removal of the dielectric material 143. At this stage, the edge portions of the dielectric material 143 and the edge portions of the first semiconductor layers 106 have substantially flat surfaces which may be flush with corresponding first portions 140*a* of the spacers 140, as shown in FIG. 41.

Figure 42:
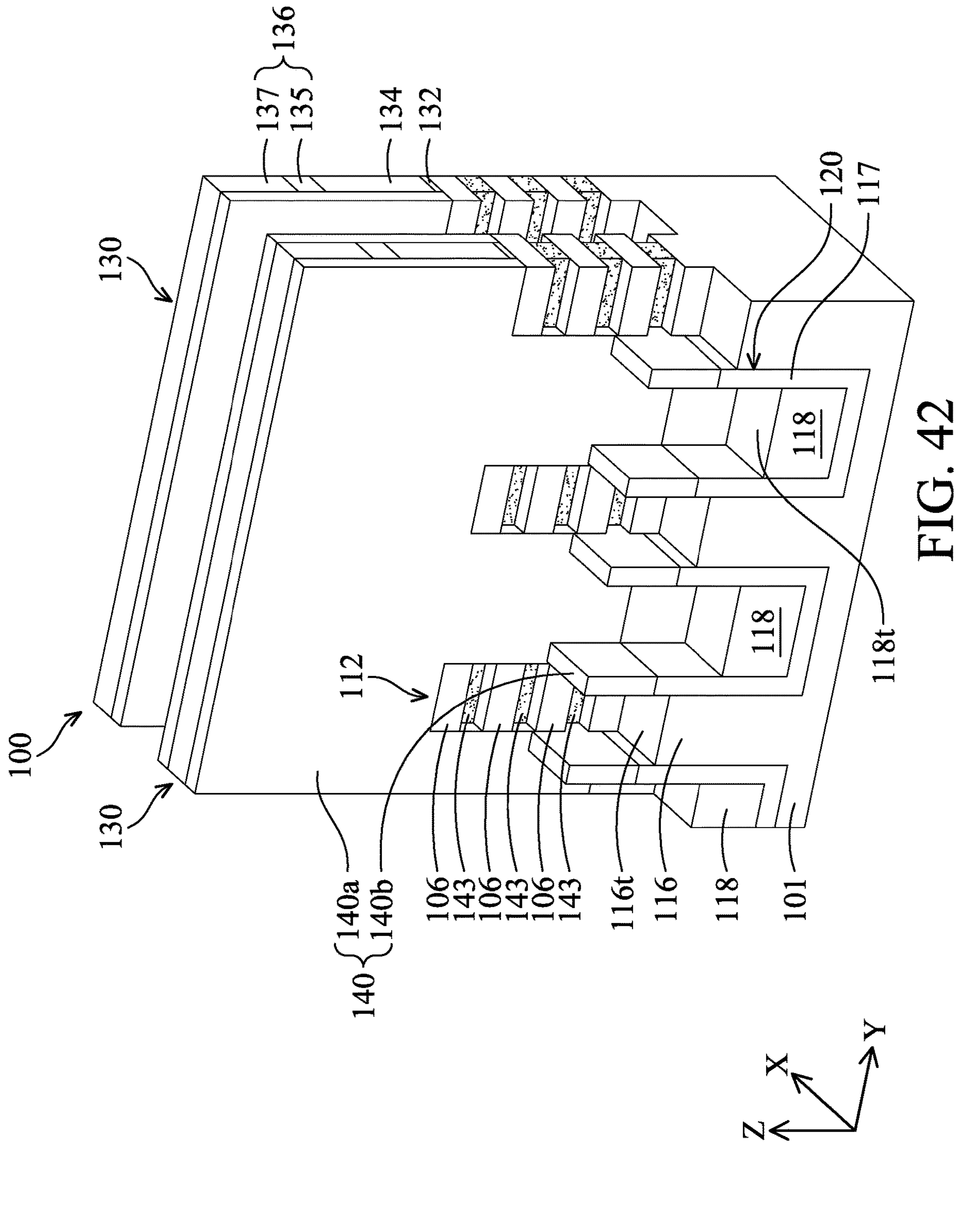

In FIG. 42, the edge portions of the dielectric material 143 are removed horizontally along the X direction. In other words, the dielectric material 143 is recessed along the X direction. The removal of the edge portions of the dielectric material 143 forms cavities. The edge portions of the dielectric material 143 may be removed by the same process as described in FIG. 12. In some embodiments, the dielectric material 143 and the insulating material 118 include the same material, and the second portions of the insulating material 118 may be further recessed, while the second portions of the dielectric layer 117 are substantially unaffected during the removal of the edge portions of the dielectric material 143. In some embodiments, as shown in FIG. 42, the top surfaces 118*t* of the second portions of the insulating material 118 may be located at a level below the top surfaces 116*t* of the well regions 116. In some embodiments, the vertical distance (along the Z direction) between the level of the top surface 116*t* and the level of the top surface 118*t* ranges from about 5 nm to about 30 nm. In some embodiments, the top surface 116*t* is located at a level below the level of the top surface of the second portion of the dielectric layer 117, and the vertical distance (along the Z direction) between the level of the top surface of the second portion of the dielectric layer 117 and the level of the top surface 116*t* ranges from about 3 nm to about 15 nm.

Figure 43:
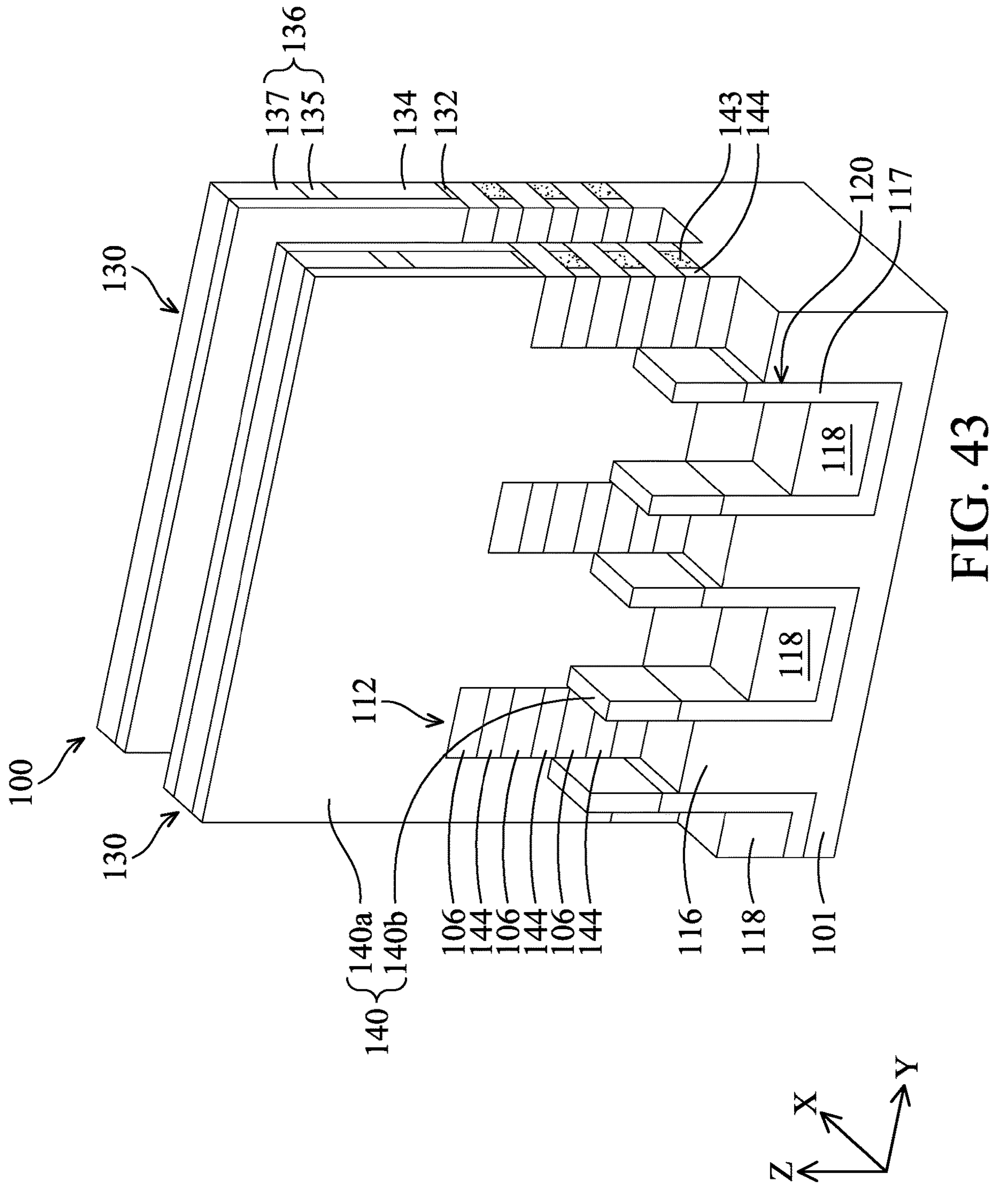

After removing edge portions of the dielectric material 143, the dielectric layer is deposited in the cavities to form dielectric spacers 144, as shown in FIG. 43. The dielectric spacers 144 may be formed by the same process as described in FIG. 13. The dielectric material 143 is capped between the dielectric spacers 144 along the X direction, as shown in FIG. 43. In some embodiments, the dielectric spacers 144 and the dielectric material 143 include different materials having different etch selectivity.

Figure 44:
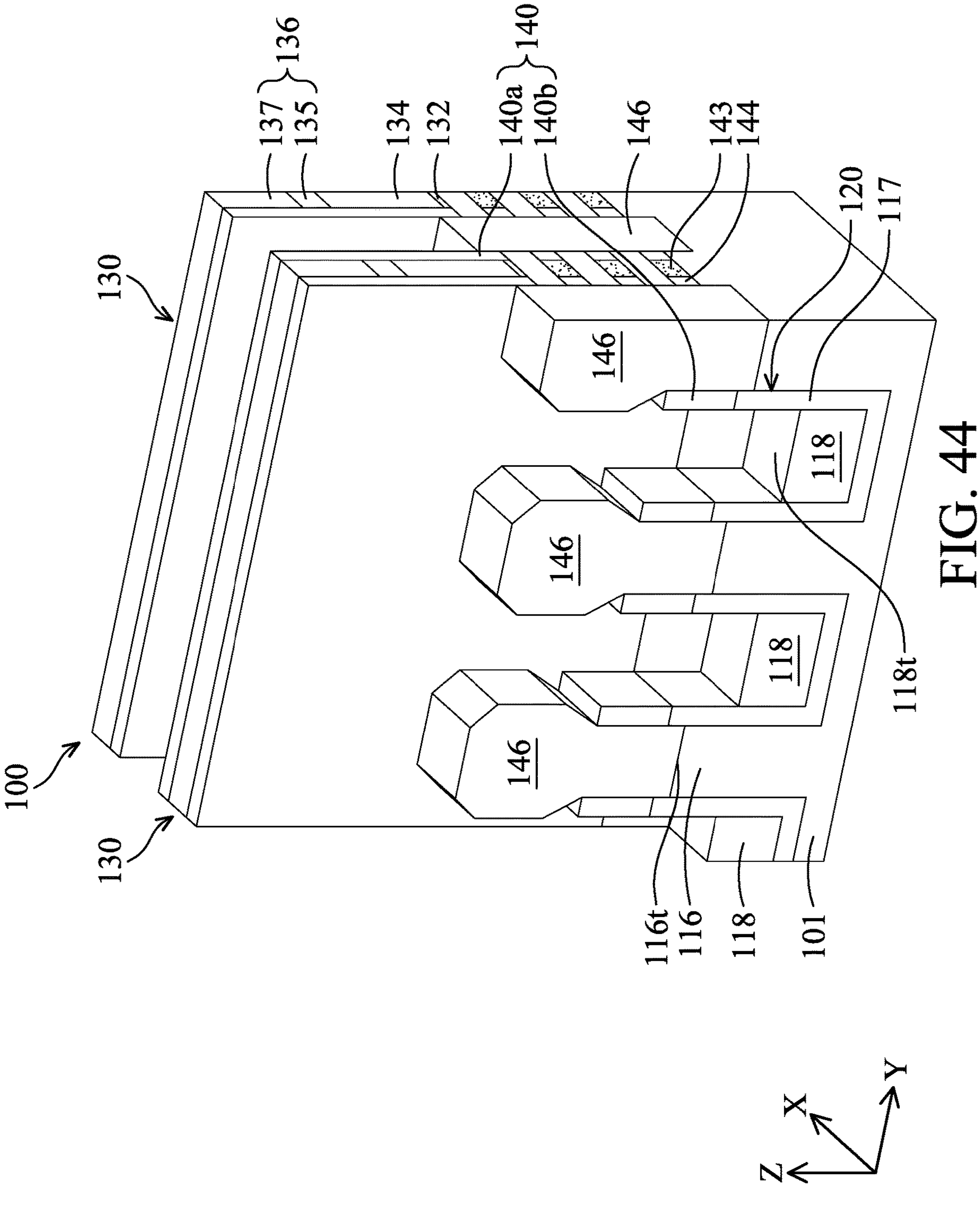

In FIG. 44, the S/D regions 146 are formed from the well portion 116. The S/D regions 146 may be formed by the same process as described in FIG. 14. As shown in FIG. 44, the top surface 118*t* of the second portion of the insulating material 118 is located below the top surface 116*t* of the well portion 116, where the S/D regions 146 are grown therefrom. Because the side surfaces of the well portions 116 are covered by the second portions of the dielectric layer 117, the S/D regions 146 are not formed on the side surfaces of the well portions 116. Without the dielectric layer 117, the S/D regions 146 may also grow from the side surfaces of the well portions 116.

Figure 45:
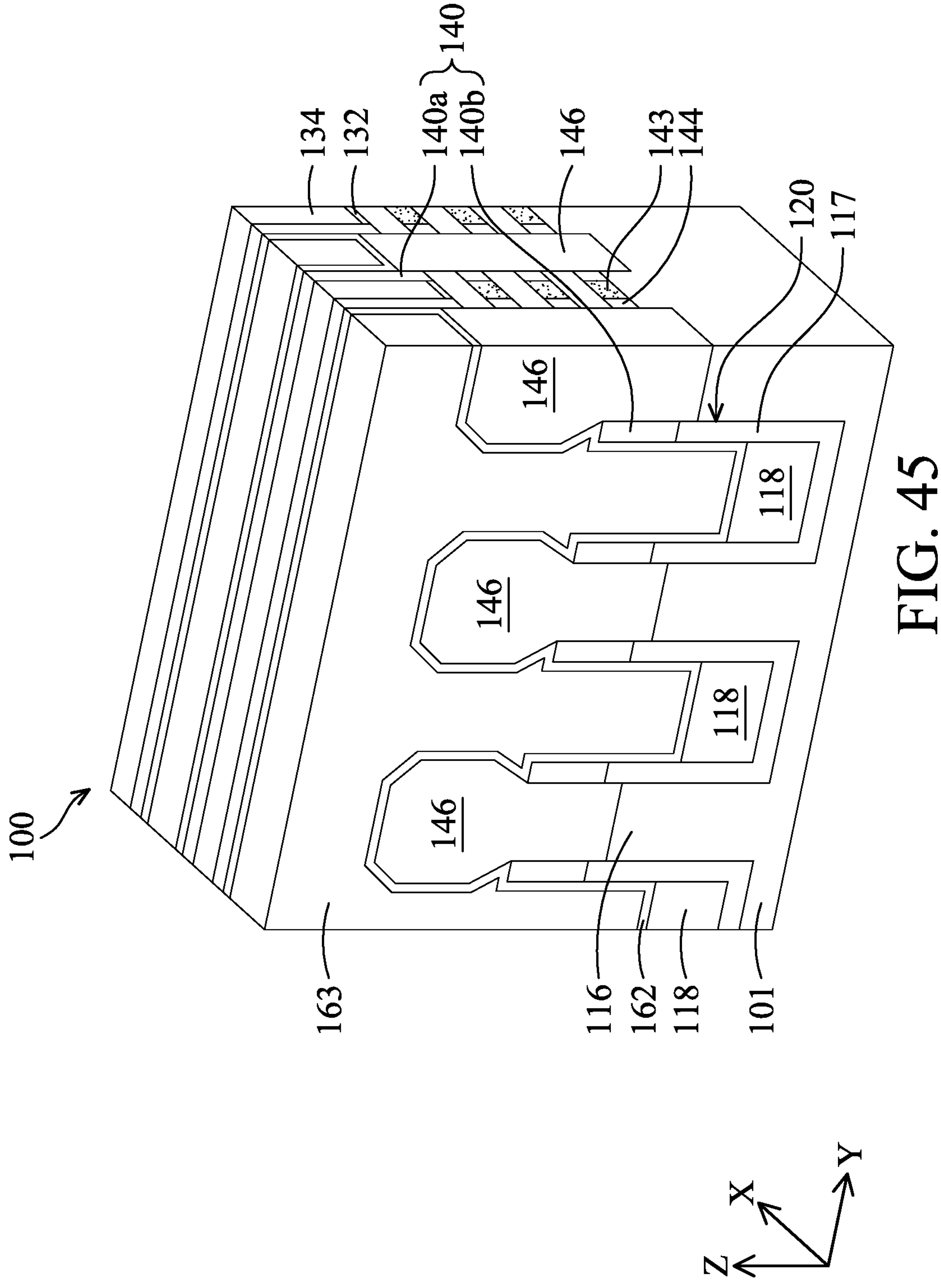

In FIG. 45, the CESL 162 is conformally formed on the exposed surfaces of the semiconductor device structure 100, and the ILD layer 163 is formed on the CESL 162. The CESL 162 and the ILD layer 163 may be formed by the same processes as described in FIG. 15. In some embodiments, the CESL 162 is in contact with the second portions of the dielectric layer 117, the second portions of the insulating material 118, the second portions 140*b* of the spacers 140, and the S/D regions 146. A planarization process is performed to expose the sacrificial gate electrode layer 134, as shown in FIG. 45. The planarization process may be any suitable process, such as a CMP process. The planarization process removes portions of the ILD layer 163 and the CESL 162 disposed on the sacrificial gate stacks 130. The planarization process may also remove the mask structure 136.

Figure 46:
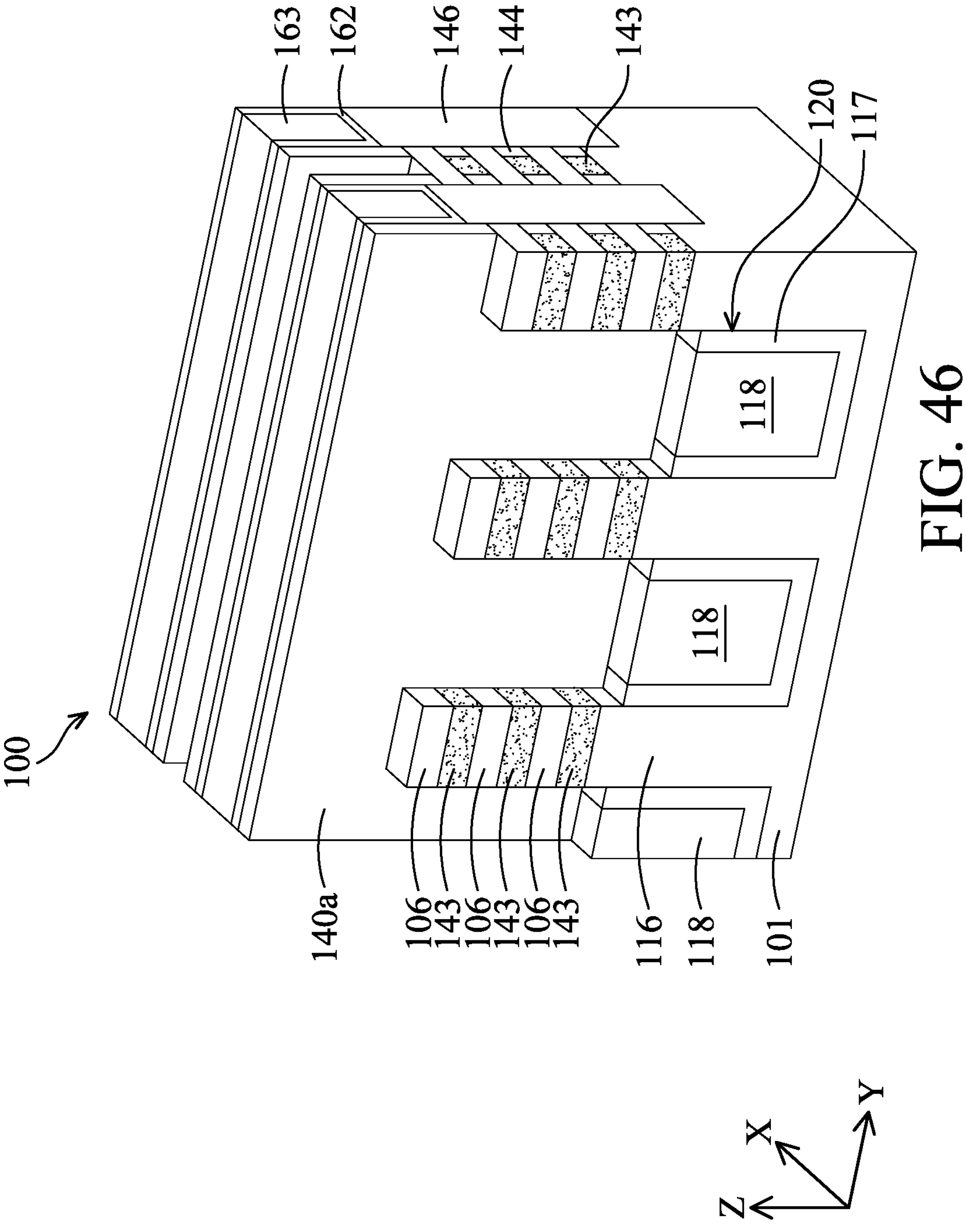

In FIG. 46, the sacrificial gate electrode layer 134 and the sacrificial gate dielectric layer 132 are removed, exposing a portion of the top surface of the topmost first semiconductor layer 106, the first portions of the insulating material 118, and the first portions of the dielectric layer 117. The top portion of the semiconductor device structure 100 in FIGS. 16 to 21B may be cut-off for clarity.

Figure 47:
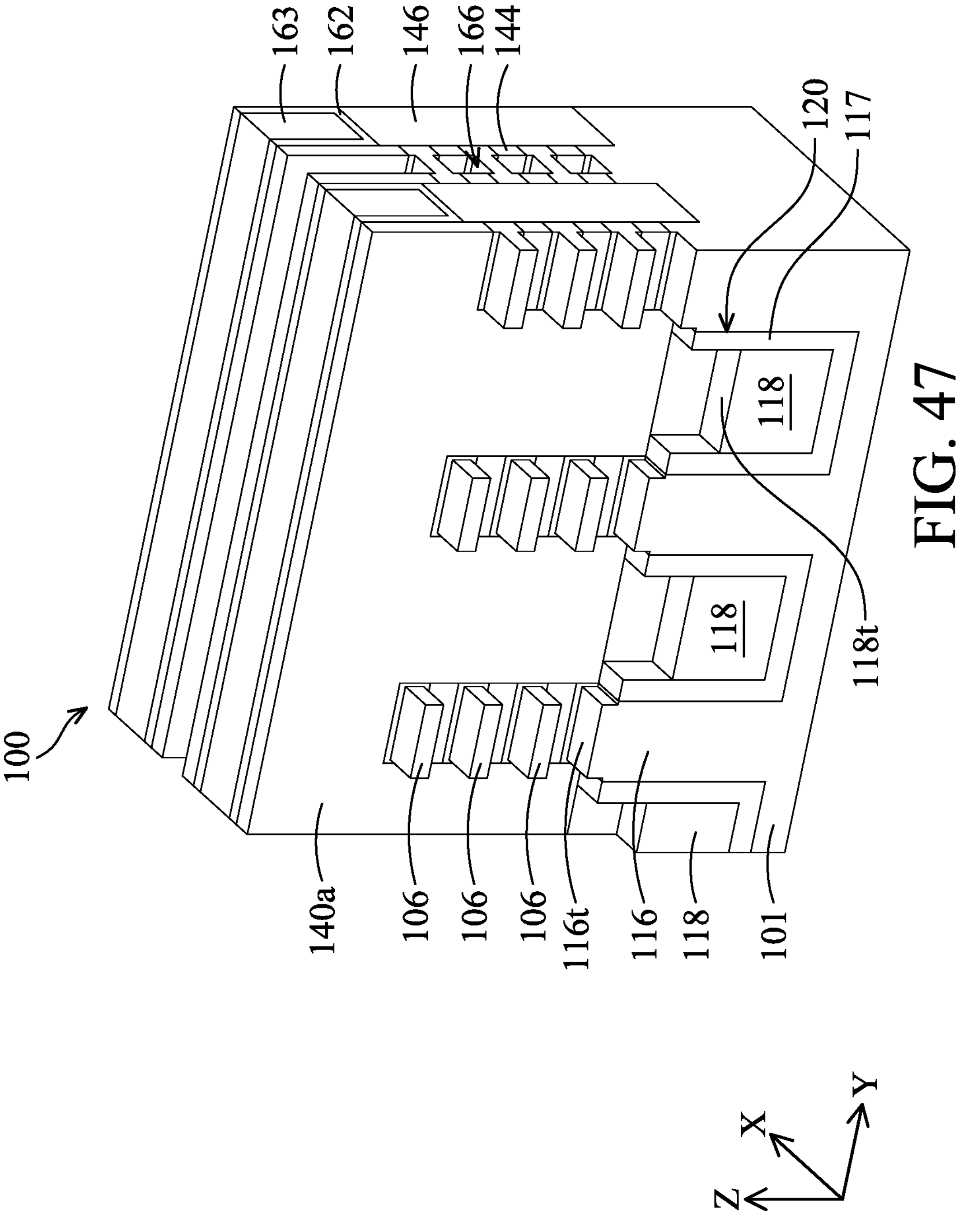

In some embodiments, the dielectric material 143 is removed without the dielectric layer 165 protecting the topmost first semiconductor layer 106 and the insulating material 118, as shown in FIG. 47. The dielectric material 143 may be removed by the same process as described in FIG. 19. The recesses 166 is formed in the top surface and bottom surface of each first semiconductor layer 106 may range from about 1 nm to about 3 nm along the Z direction. The portion of each first semiconductor layer 106 not covered by the dielectric spacers 144 may be exposed after the removal of the dielectric material 143. Each first semiconductor layer 106 may be a nanostructure channel. In some embodiments, the vertical distance (along the Z direction) between the level of the top surface 116*t* and the level of the top surface 118*t* ranges from about 20 nm to about 60 nm. In some embodiments, the vertical distance (along the Z direction) between the level of the top surface 116*t* and the level of the top surface of the first portion of the dielectric layer 117 ranges from about 5 nm to about 10 nm.

Figure 48:
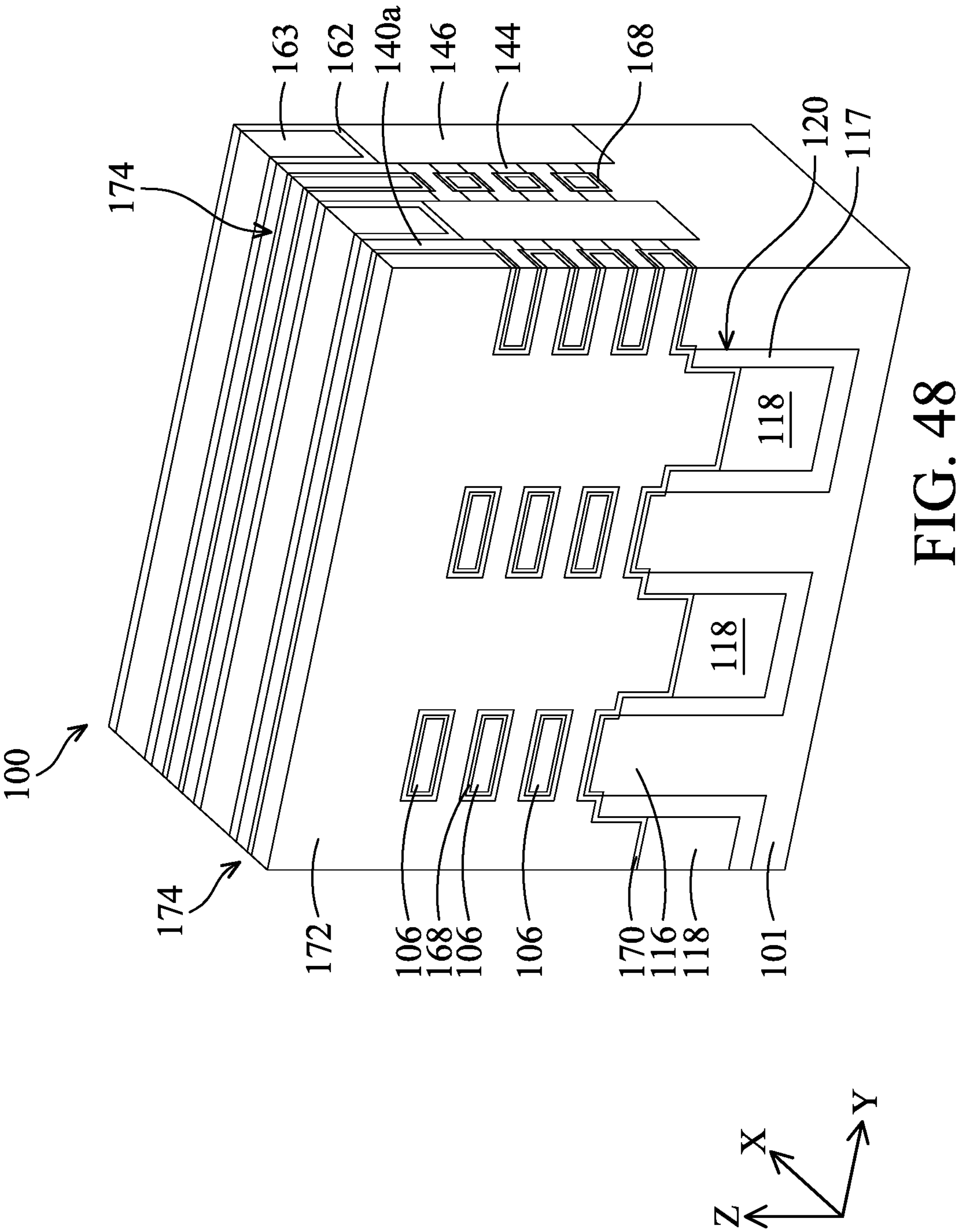

After the formation of the nanostructure channels (i.e., the exposed portions of the first semiconductor layers 106), the IL 168, the gate dielectric layer 170, and the gate electrode layer 172 are formed to surround the exposed portions of the first semiconductor layers 106, as shown in FIG. 48.

Figure 49:
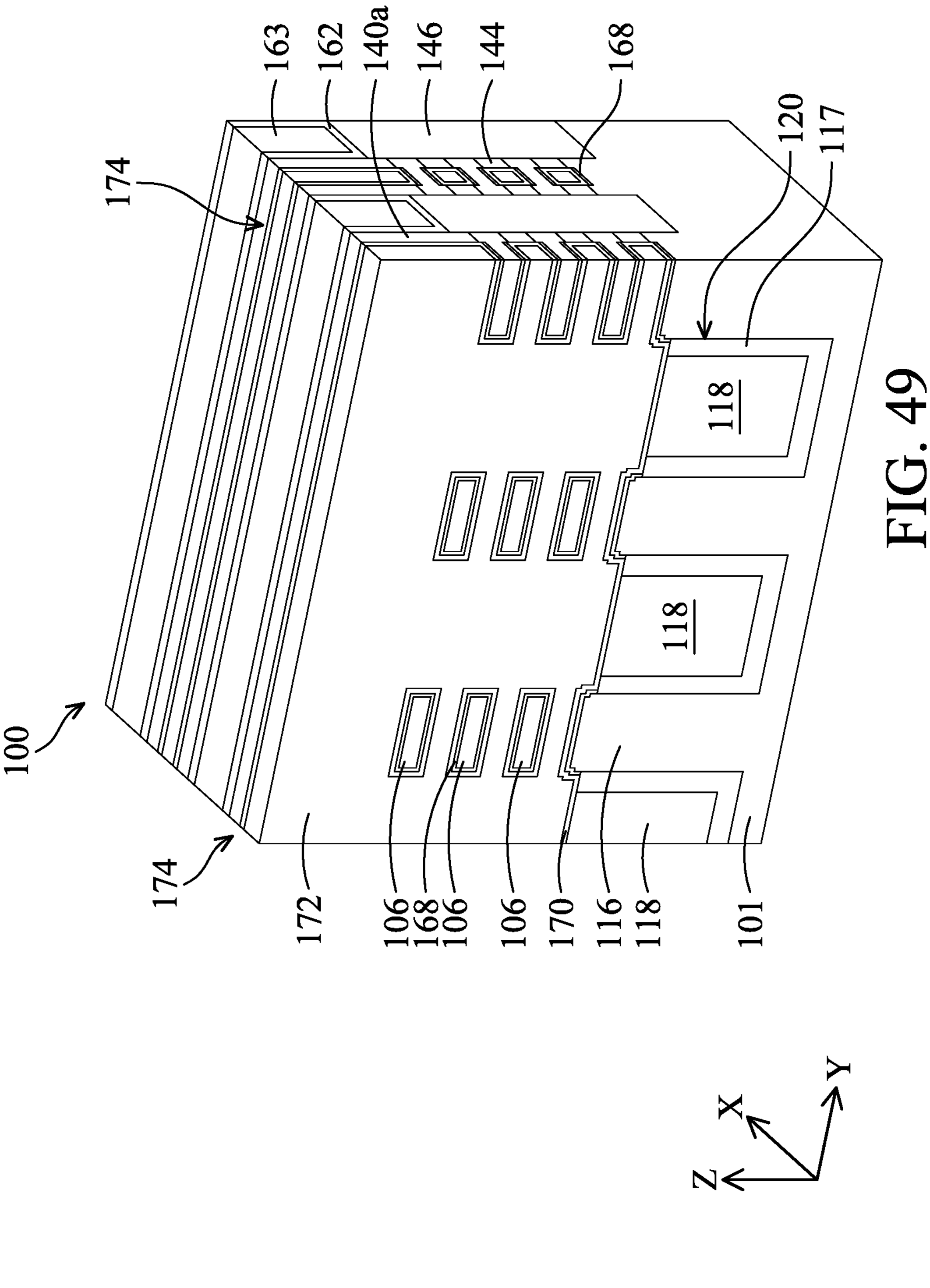
FIG. 49 is a perspective view of one of various stages of manufacturing the semiconductor device structure, in accordance with some embodiments.

In some embodiments, the dielectric layer 165 is utilized in the embodiments shown in FIGS. 32 to 48. In other words, after the process shown in FIG. 46, processes described in FIGS. 17 to 21 are performed. As a result, the first portions of the insulating material 118 are not recessed, as shown in FIG. 49.

Embodiments of the present disclosure provide a semiconductor device structure 100 including protected isolation regions 120 in the S/D regions, the channel regions, or both the S/D regions and the channel regions. In some embodiments, the isolation region 120 includes a dielectric layer 117 covering side surfaces of the well portions 116. Some embodiments may achieve advantages. For example, the protected isolation regions can lead to reduced growth of S/D regions on the side surfaces of the well portions 116 and to prevent the gate electrode layer 172 from extending towards the substrate 101. As a result, current leakage and parasitic capacitance are reduced.

An embodiment is a method. The method includes depositing a spacer layer over an isolation region between adjacent fin structures, and the spacer layer is formed on sidewalls and tops of the fin structures. The method further includes forming a mask on the spacer layer between the fin structures, and the mask has a height substantially less than a height of the fin structures. The method further includes removing portions of the spacer layer and recessing the fin structures to form a spacer and to expose a portion of each fin structure, the spacer includes a first portion having a "U" shape disposed on the isolation region, and the portion of each fin structure has a top surface located at a level substantially below a level of a top surface of the isolation region. The method further includes removing the mask.

Another embodiment is a method. The method includes forming two fin structures from a substrate, and each fin structure includes a stack of semiconductor layers. The method further includes forming an isolation region between the fin structures, forming a sacrificial gate stack on a first portion of each fin structure and a first portion of the isolation region, recessing a second portion of each fin structure to expose a portion of each fin structure, forming a source/drain region from the portion of each fin structure, removing the sacrificial gate stack to expose the first portion of the fin structures and the first portion of the isolation region, depositing a dielectric layer, and removing portions of the dielectric layer. Remaining portions of the dielectric layer are disposed on the first portions of the fin structures and the first portion of the isolation region. The method further includes removing a dielectric material disposed between adjacent semiconductor layers of the stack of semiconductor layers, removing the remaining portions of the dielectric layer, and forming a gate electrode layer surrounding a portion of each semiconductor layer of the stack of semiconductor layers.

A further embodiment is a semiconductor device structure. The structure includes a first source/drain region disposed on a first portion of a first fin structure, a second source/drain region disposed on a second portion of a second fin structure, and a dielectric layer disposed between the first and second portions. The dielectric layer is in contact with side surfaces of the first and second portions, and the dielectric layer has a top surface located at a level above a level of a top surface of the first portion. The structure further includes an insulating material disposed on the dielectric layer, and the insulating material has a top surface located at a level substantially below the level of the top surface of the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

depositing a spacer layer over an isolation region between a first fin structure and a second fin structures, wherein the spacer layer is formed on a sidewall and a top of each fin structure;

forming a mask on the spacer layer between the first fin structure and a second fin structures, wherein the mask has a height less than a height of the first fin structure;

removing portions of the spacer layer and recessing the first fin structure and a second fin structures to form a spacer and to expose a first portion of each fin structure, wherein the spacer comprises a first portion and a second portion, the second portion has a "U" shape disposed on the isolation region, the first portion of each fin structure has a top surface located at a level below a level of a top surface of the isolation region; and removing the mask.

2. The method of claim 1, wherein each fin structure comprises a stack of alternating first semiconductor layers and second semiconductor layers.

3. The method of claim 2, further comprising forming a sacrificial gate stack on a second portion of each fin structure, wherein the first portion of the spacer is disposed on side surfaces of the sacrificial gate stack.

4. The method of claim 3, further comprising removing the second semiconductor layers of the second portion of each fin structure and located under the sacrificial gate stack to form openings between vertically adjacent ones of the first semiconductor layers.

5. The method of claim 4, further comprising depositing a dielectric material in the openings, on the first portion of the spacer and the second portion of the spacer, over the sacrificial gate stack, the top surface of the first portion of each fin structure.

6. The method of claim 5, further comprising removing first portions of the dielectric material formed on the first portion of the spacer and the second portion of the spacer, over the sacrificial gate stack, the top surface of the first portion of each fin structure.

7. The method of claim 6, further comprising recessing edge portions of the dielectric material disposed between the vertically ones of the adjacent first semiconductor layers to form cavities.

8. The method of claim 7, further comprising forming a dielectric spacer in each of the cavities.

9. A method, comprising:

forming two fin structures from a substrate, wherein each fin structure comprises a stack of semiconductor layers;

forming an isolation region between the two fin structures;

forming a sacrificial gate stack on a first portion of each of the two fin structures and a first portion of the isolation region;

recessing a second portion of each fin structure to expose a third portion of each fin structure;

forming a source/drain region from the third portion of each fin structure;

removing the sacrificial gate stack from the first portion of each of the two fin structures and the first portion of the isolation region to expose the first portion of each of the two fin structures and the first portion of the isolation region;

depositing a dielectric layer around the first portion of each of the two fin structures and on the first portion of the isolation region;

removing portions of the dielectric layer, wherein a first remaining portion of the dielectric layer is disposed on the first portion of one of the two fin structures and a second remaining portion of the dielectric layer is disposed on the first portion of the isolation region;

removing a dielectric material disposed between adjacent semiconductor layers of the stack of semiconductor layers of the first portion of each fin structure;

removing the first remaining portions and the second remaining portion of the dielectric layer; and forming a gate electrode layer surrounding a portion of each semiconductor layer of the stack of semiconductor layers of the first portion of each fin structure.

10. The method of claim 9, wherein the dielectric layer comprises horizontal portions and vertical portions.

11. The method of claim 10, wherein the dielectric layer is deposited by plasma-enhanced chemical vapor deposition, and a thickness of one of the horizontal portions of the dielectric layer along a first direction perpendicular to a top surface of the substrate is greater than a thickness of one of the vertical portions along a second direction parallel to the top surface of the substrate.

12. The method of claim 10, wherein the dielectric layer is deposited by atomic layer deposition process followed by a treatment process, and a composition of the horizontal portions is different from a composition of the vertical portions.

13. The method of claim 12, wherein the treatment process is an implantation process or a plasma treatment process.

14. The method of claim 9, where the dielectric layer and the isolation region comprise different materials.

15. The method of claim 9, further comprising depositing a spacer layer over a second portion of the isolation region and on the sacrificial gate stack prior to recessing the second portion of each fin structure.

16. The method of claim 15, further comprising forming a mask on a first portion of the spacer layer disposed over the second portion of the isolation region, wherein the mask has a height less than a height of the one of the two fin structures.

17. The method of claim 16, further comprising removing second portions of the spacer layer to form a spacer during the recessing the second portion of each of the two fin structures, wherein the spacer comprises a first portion disposed on side surfaces of the sacrificial gate stack and a second portion disposed on the second portion of the isolation region.

18. A method, comprising:

forming two fin structures from a substrate, wherein each fin structure comprises a stack of semiconductor layers;

forming an isolation region between the two fin structures;

forming a sacrificial gate stack on a first portion of each of the two fin structures and a portion of the isolation region;

forming a spacer layer on side surfaces of the sacrificial gate stack and over the isolation region, wherein a portion of the spacer layer formed over the isolation region has a "U" shape;

removing the sacrificial gate stack to expose the first portion of each of the two fin structures and the portion of the isolation region;

depositing a dielectric layer around the first portion of each of the two fin structures and on the portion of the isolation region; and removing portions of the dielectric layer, wherein a first remaining portion of the dielectric layer disposed on the first portion of one of the two fin structures and a second remaining portion of the dielectric layer is disposed on the portion of the isolation region.

19. The method of claim 18, further comprising laterally recessing a dielectric material disposed between adjacent semiconductor layers of the stack of semiconductor layers prior to removing the sacrificial gate stack.

20. The method of claim 19, further comprising removing the dielectric material disposed between the adjacent semiconductor layers of the stack of semiconductor layers after the removing of the portions of the dielectric layer.

* * * * *